(12) United States Patent
George et al.

(10) Patent No.: US 11,276,756 B2
(45) Date of Patent: *Mar. 15, 2022

(54) QUANTUM DOT DEVICES WITH SINGLE ELECTRON TRANSISTOR DETECTORS

(71) Applicant: Intel Corporation, Santa Clara, CA (US)

(72) Inventors: Hubert C. George, Portland, OR (US); Ravi Pillarisetty, Portland, OR (US); Nicole K. Thomas, Portland, OR (US); Jeanette M. Roberts, North Plains, OR (US); James S. Clarke, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/329,710

(22) PCT Filed: Sep. 30, 2016

(86) PCT No.: PCT/US2016/054615
§ 371 (c)(1),
(2) Date: Feb. 28, 2019

(87) PCT Pub. No.: WO2018/063270
PCT Pub. Date: Apr. 5, 2018

(65) Prior Publication Data
US 2019/0198618 A1    Jun. 27, 2019

(51) Int. Cl.
*H01L 29/12*      (2006.01)
*H01L 29/423*    (2006.01)
(Continued)

(52) U.S. Cl.
CPC ...... *H01L 29/122* (2013.01); *H01L 29/42356* (2013.01); *H01L 29/66469* (2013.01);
(Continued)

(58) Field of Classification Search
CPC .......... H01L 29/66469; H01L 29/7613; H01L 29/127
See application file for complete search history.

(56) References Cited

U.S. PATENT DOCUMENTS 9,595,605 B1 * 3/2017 Cheng ................. H01L 29/7827
2002/0179897 A1 12/2002 Eriksson et al.
(Continued)

FOREIGN PATENT DOCUMENTS

WO   2017155531 A1   9/2017
WO   2017213638 A1   12/2017
(Continued)

OTHER PUBLICATIONS

"A Reconfigurable Gate Architecture for Si/SiGe Quantum Dots," Zajac et al., Department of Physics, Princeton University; Department of Physics, University of California; Feb. 6, 2015, 5 pages.
(Continued)

*Primary Examiner* — Samuel A Gebremariam
*Assistant Examiner* — Jonas T Beardsley
(74) *Attorney, Agent, or Firm* — Patent Capital Group

(57) ABSTRACT

Disclosed herein are quantum dot devices with single electron transistor (SET) detectors. In some embodiments, a quantum dot device may include: a quantum dot formation region; a group of gates disposed on the quantum dot formation region, wherein the group of gates includes at least first, second, and third gates, spacers are disposed on sides of the first and second gates, wherein a first spacer is disposed on a side of the first gate proximate to the second gate, and a second spacer, physically separate from the first spacer, is disposed on a side of the second gate proximate to the first gate, and the third gate is disposed between the first and second gates and extends between the first and second
(Continued)

spacers; and a SET disposed on the quantum dot formation region, proximate to the group of gates.

20 Claims, 58 Drawing Sheets

(51) Int. Cl.
H01L 29/76 (2006.01)
H01L 29/82 (2006.01)
H01L 29/66 (2006.01)
H01L 29/775 (2006.01)
H01L 29/778 (2006.01)

(52) U.S. Cl.
CPC .... *H01L 29/66977* (2013.01); *H01L 29/7613* (2013.01); *H01L 29/775* (2013.01); *H01L 29/82* (2013.01); *H01L 29/7781* (2013.01)

(56) References Cited

U.S. PATENT DOCUMENTS

| | | | |
|---|---|---|---|
| 2004/0075123 A1 | 4/2004 | Fraboulet et al. | |
| 2004/0175881 A1 | 9/2004 | Forbes et al. | |
| 2009/0242872 A1 | 10/2009 | Pillarisetty et al. | |
| 2010/0006821 A1* | 1/2010 | Choi | H01L 29/66439 257/20 |
| 2011/0147711 A1 | 6/2011 | Pillarisetty et al. | |
| 2012/0074386 A1* | 3/2012 | Rachmady | H01L 29/66431 257/24 |
| 2013/0065371 A1 | 3/2013 | Wei et al. | |
| 2013/0264617 A1 | 10/2013 | Joshi et al. | |
| 2014/0151637 A1 | 6/2014 | Xiao | |
| 2014/0166985 A1* | 6/2014 | Kohda | H01L 29/82 257/39 |
| 2016/0141243 A1* | 5/2016 | You | H01L 21/823871 257/369 |
| 2017/0125593 A1* | 5/2017 | Chang | H01L 29/66795 |
| 2017/0352656 A1* | 12/2017 | Huang | G06F 21/44 |
| 2019/0131511 A1 | 5/2019 | Clarke et al. | |
| 2019/0140073 A1 | 5/2019 | Pillarisetty et al. | |
| 2019/0148530 A1 | 5/2019 | Pillarisetty et al. | |
| 2019/0157393 A1 | 5/2019 | Roberts et al. | |
| 2019/0164077 A1 | 5/2019 | Roberts et al. | |
| 2019/0164959 A1 | 5/2019 | Thomas et al. | |
| 2019/0165152 A1 | 5/2019 | Roberts et al. | |
| 2019/0181256 A1 | 6/2019 | Roberts et al. | |
| 2019/0194016 A1 | 6/2019 | Roberts et al. | |
| 2019/0206991 A1 | 7/2019 | Pillarisetty et al. | |
| 2019/0206992 A1 | 7/2019 | George et al. | |
| 2019/0206993 A1 | 7/2019 | Pillarisetty et al. | |
| 2019/0214385 A1 | 7/2019 | Roberts et al. | |
| 2019/0229188 A1 | 7/2019 | Clarke et al. | |
| 2019/0229189 A1 | 7/2019 | Clarke et al. | |
| 2019/0259850 A1 | 8/2019 | Pillarisetty et al. | |
| 2019/0266511 A1 | 8/2019 | Pillarisetty et al. | |
| 2019/0267692 A1 | 8/2019 | Roberts et al. | |
| 2019/0288176 A1 | 9/2019 | Yoscovits et al. | |
| 2019/0296214 A1 | 9/2019 | Yoscovits et al. | |
| 2019/0305037 A1 | 10/2019 | Michalak et al. | |
| 2019/0305038 A1 | 10/2019 | Michalak et al. | |
| 2019/0312128 A1 | 10/2019 | Roberts et al. | |
| 2019/0341459 A1 | 11/2019 | Pillarisetty et al. | |
| 2019/0363181 A1 | 11/2019 | Pillarisetty et al. | |
| 2019/0363239 A1 | 11/2019 | Yoscovits et al. | |

FOREIGN PATENT DOCUMENTS

| | | |
|---|---|---|
| WO | 2017213639 A1 | 12/2017 |
| WO | 2017213641 A1 | 12/2017 |
| WO | 2017213645 A1 | 12/2017 |
| WO | 2017213646 A1 | 12/2017 |
| WO | 2017213647 A1 | 12/2017 |
| WO | 2017213648 A1 | 12/2017 |
| WO | 2017213649 A1 | 12/2017 |
| WO | 2017213651 A1 | 12/2017 |
| WO | 2017213661 A1 | 12/2017 |
| WO | 2017217958 A1 | 12/2017 |
| WO | 2018030977 A1 | 2/2018 |
| WO | 2018044267 A1 | 3/2018 |
| WO | 2018057013 A1 | 3/2018 |
| WO | 2018057015 A1 | 3/2018 |
| WO | 2018057018 A1 | 3/2018 |
| WO | 2018057023 A1 | 3/2018 |
| WO | 2018057024 A1 | 3/2018 |
| WO | 2018057027 A1 | 3/2018 |
| WO | 2018/063270 A1 | 4/2018 |
| WO | 2018063139 A1 | 4/2018 |
| WO | 2018063168 A1 | 4/2018 |
| WO | 2018063170 A1 | 4/2018 |
| WO | 2018063202 A1 | 4/2018 |
| WO | 2018063203 A1 | 4/2018 |
| WO | 2018063205 A1 | 4/2018 |

OTHER PUBLICATIONS

"A two-qubit logic gate in silicon," Veldhorst et al., Nature, vol. 526, Oct. 15, 2015, pp. 410-414.
"Gate-Defined Quantum Dots in Intrinsic Silicon," Angus et al., Nano Letters 2007, vol. 7, No. 7, 2051-2055, publication date Jun. 14, 2007, retrieved from http://pubs.acs.org on Mar. 31, 2009, 6 pages.
"Photon- and phonon-assisted tunneling in the three-dimensional charge stability diagram of a triple quantum dot array," Braakman et al., Applied Physics Letters 102, 112110 (2013), pp. 112110-1 through 4 (5 pages with cover sheet).
"Single-shot read-out of an individual electron spin in a quantum dot," Elzerman et al., Nature, vol. 430, Jul. 22, 2004, pp. 431-435.
"Undoped accumulation-mode Si/SiGe quantum dots," Borselli et al, HRL Laboratories, LLC., Jul. 15, 2014, 4 pages.
Supplementary Information, retrieved from www.nature.com, doi:10. 1038/nature 15263, 8 pages.
PCT Jun. 28, 2017 International Search Report and Written Opinion from International Application No. PCT/US2016/054615; 8 pages.
PCT/US2016/054613, Sep. 30, 2016, Single Electron Transistors (SETs) and Set-Based Qubit-Detector Arrangements.
U.S. Appl. No. 16/329,706, filed Feb. 28, 2019, Single Electron Transistors (SETs) and Set-Based Qubit-Detector Arrangements.
"A Nanodamascene Process for Advanced Single-Electron Transistor Fabrication," Dubuc et al, IEEE Transactions on Nanotechnology, vol. 7, No. 1, Jan. 2008, pp. 68-73.
"Fast sensing of double-dot charge arrangement and spin state with an rf sensor quantum dot," Barthel et al, Materials Department, University of California, Santa Barbara, Jan. 16, 2014, 4 pages.
"Spin Relaxation and Decoherence of Holes in Quantum Dots," Bulaev et al., Phys. Rev. Lett. 95, 076805, Aug. 11, 2005, 1 page.
"Fundamentals of Silicon Material Properties for Successful Exploitation of Strain Engineering in Modern CMOS Manufacturing," Chidambaram et al, IEE Transactions on Electron Devices, vol. 53, No. 5, May 2006, pp. 944-964.
"Ultrafast optical control of individual quantum dot spin qubits," De Greve et al, Reports on Progress in Physics, vol. 76, No. 9, Sep. 4, 2013, 2 pages.
"Fabrication and Characterization of Sidewall Defined Silicon-on-Insulator Single-Electron Transistor," Jung et al., IEEE Transactions on Nanotechnology, vol. 7, No. 5, Sep. 2008, pp. 544-550.
"How it's built: Micron/Intel3D NAND Micron Opens the Veil a Little," Moyer, Bryon, retrieved from https://www.eejournal.com/article/20160201-micron/ on Nov. 29, 2017, 9 pages.
"Investigation of Vertical Type Single-Electron Transistor with Sidewall Spacer Quantum Dot," Kim et al, Student Paper, Inter-University Semiconductor Research Center and School of Electrical Engineering and Computer Science, Seoul National University, ISDRS 2011, Dec. 7-9, 2011, ISDRS 2011—http://www.ece.umd.edu/ISDR2011, 2 pages.
"Platinum single-electron transistors with tunnel barriers made by atomic layer deposition", George et al., Department of Electrical Engineering, University of Notre Dame, Received Jul. 7, 2010:Published Nov. 5, 2010, 3 pages.

(56) References Cited

OTHER PUBLICATIONS

"Quantum computation with quantum dots," Loss et al, Physical Review A, vol. 57, No. 1, Jan. 1998, pp. 120-126.
"Ultafast high-fidelity initialization of a quantum-dot spin qubit without magnetic fields," Mar et al., Phys. Rev. B 90 241303®, published Dec. 15, 2014, 1 page.
"Delaying Forever: Uniaxial Strained Silicon Transistors in a 90nm CMOS Technology," Mistry et al Portland Technology Department, TCAD, Intel Corp., 2 pages.
"Embracing the quantum limit in silicon computing," Morton et al, Macmillan Publishers, Nov. 17, 2011, vol. 479, Nature, pp. 345-353.
"Review : Towards Spintronic Quantum Technologies with Dopants in Silicon," Morley, Gavin, Department of Physics, University of Warwich, 13 pages.
"Defect reduction of selective Ge epitaxy in trenches on Si(001) substrates using aspect ratio trapping," Park et al., Applied Physics Letter 90, 052113 (2007), pp. 052113-1 through 3.
"Radio frequency measurements of tunnel couplings and singlet-triplet spin states in Si:P quantum dots," House et al., Nature Communications, 6:884, DOI: 10.1038/ncomms9848, pp. 1-6.
"Detecting bit-flip errors in a logical qubit using stabilizer measurements," Riste et al., Nature Communications, 6:6983, DOI: 10.1038/ncomms7983, pp. 1-6.
"Scalable gate architecture for densely packed semiconductor spin qubits," Zajac et al, Department of Physics, Princeton University; Sandia National Laboratories, 8 pages.
"Silicon CMOS architecture for a spin-based quantum computer," Veldhorst et al., Qutech, TU Delft, The Netherlands, Centre for Quantum Computation and Communication Technology, School of Electrical Engineering and Telecommunications, The University of New South Wales, NanoElectronics Group, MESA+Institute for Nanotechnology, University of Twente, The Netherlands, Oct. 2, 2016, 13 pages.
"Single-electron Transistors fabricated with sidewall spacer patterning," Park et al., Superlattices and Microstructures 34 (2003) 231-239.
"Single-electron Transistors with wide operating temperature range," Dubuc et al., Applied Physics Letters 90, 113104 (2007) pp. 113104-1 through 3.
"An addressable quantum dot qubit with fault-tolerant control-fidelity," Veldhorst et al., Nature Nanotechnology vol. 9, Dec. 2014, pp. 981-985.

* cited by examiner

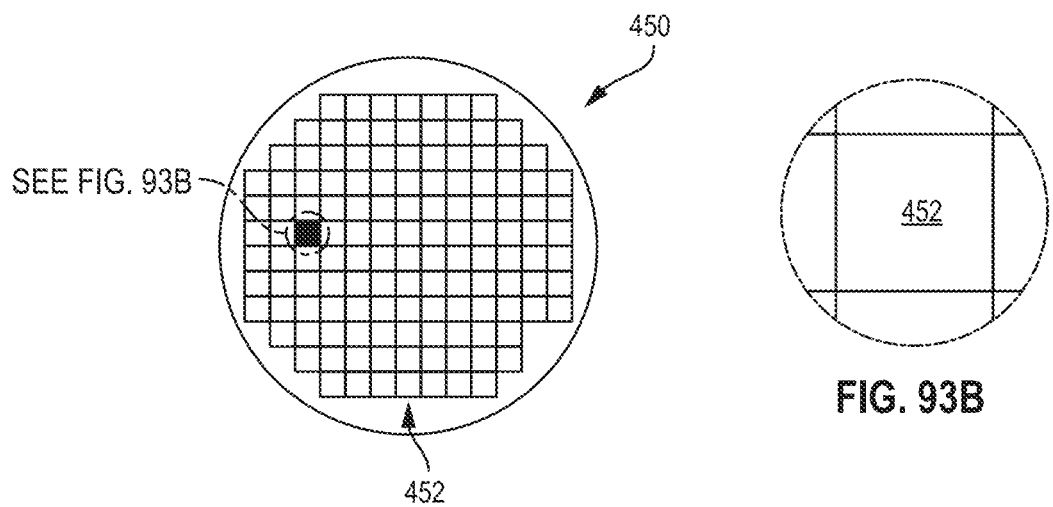
FIG. 93A
FIG. 93B
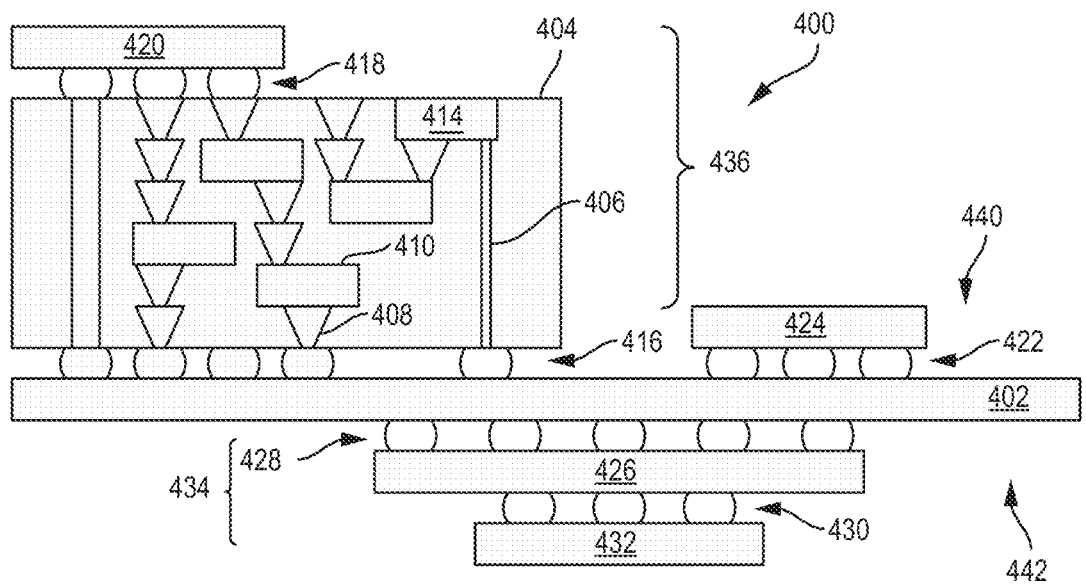
FIG. 94

QUANTUM DOT DEVICES WITH SINGLE ELECTRON TRANSISTOR DETECTORS

CROSS-REFERENCE TO RELATED APPLICATION

This application is a national stage application under 35 U.S.C. § 371 of PCT International Application Serial No. PCT/US2016/054615, filed on Sep. 30, 2016 and entitled "QUANTUM DOT DEVICES WITH SINGLE ELECTRON TRANSISTOR DETECTORS," which is hereby incorporated by reference herein in its entirety.

BACKGROUND

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 93A and 93B are top views of a wafer and dies that may include any of the quantum dot devices disclosed herein.

FIG. 94 is a cross-sectional side view of a device assembly that may include any of the quantum dot devices disclosed herein.

DETAILED DESCRIPTION

Figure 1:
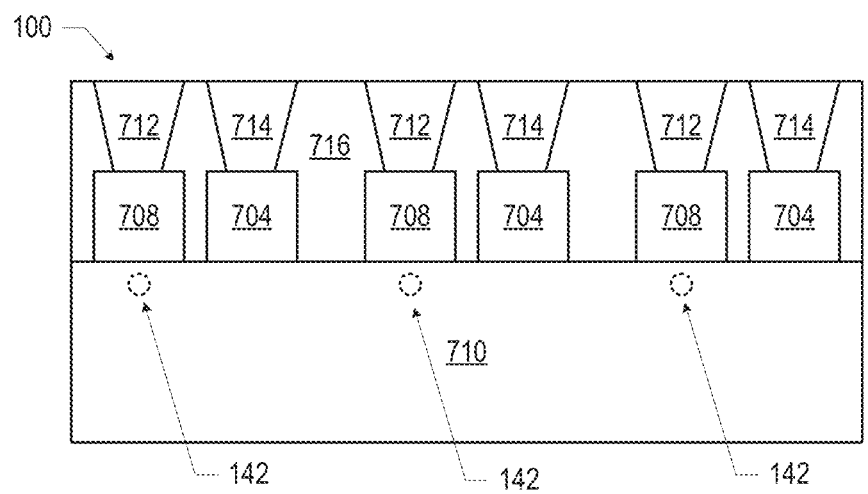
FIGS. 1-2 are views of a quantum dot device including multiple gate-detector clusters disposed on a quantum dot formation region, in accordance with various embodiments.

Disclosed herein are quantum dot devices with single electron transistor (SET) detectors. In some embodiments, a quantum dot device may include: a quantum dot formation region; a group of gates disposed on the quantum dot formation region, wherein the group of gates includes at least first, second, and third gates, spacers are disposed on sides of the first and second gates, wherein a first spacer is disposed on a side of the first gate proximate to the second gate, and a second spacer, physically separate from the first spacer, is disposed on a side of the second gate proximate to the first gate, and the third gate is disposed between the first and second gates and extends between the first and second spacers; and a SET disposed on the quantum dot formation region, proximate to the group of gates.

The quantum dot devices disclosed herein may enable the formation of quantum dots to serve as quantum bits ("qubits") in a quantum computing device, as well as the control of these quantum dots to perform quantum logic operations. Unlike previous approaches to quantum dot formation and manipulation, various embodiments of the quantum dot devices disclosed herein provide strong spatial localization of the quantum dots (and therefore good control over quantum dot interactions and manipulation), good scalability in the number of quantum dots included in the device, and/or design flexibility in making electrical connections to the quantum dot devices to integrate the quantum dot devices in larger computing devices.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. As used herein, a "high-k dielectric" refers to a material having a higher dielectric constant than silicon oxide. As used herein, a "magnet line" refers to a magnetic field-generating structure to influence (e.g., change, reset, scramble, or set) the spin states of quantum dots. One example of a magnet line, as discussed herein, is a conductive pathway that is proximate to an area of quantum dot formation and selectively conductive of a current pulse that generates a magnetic field to influence a spin state of a quantum dot in the area.

Figure 2:
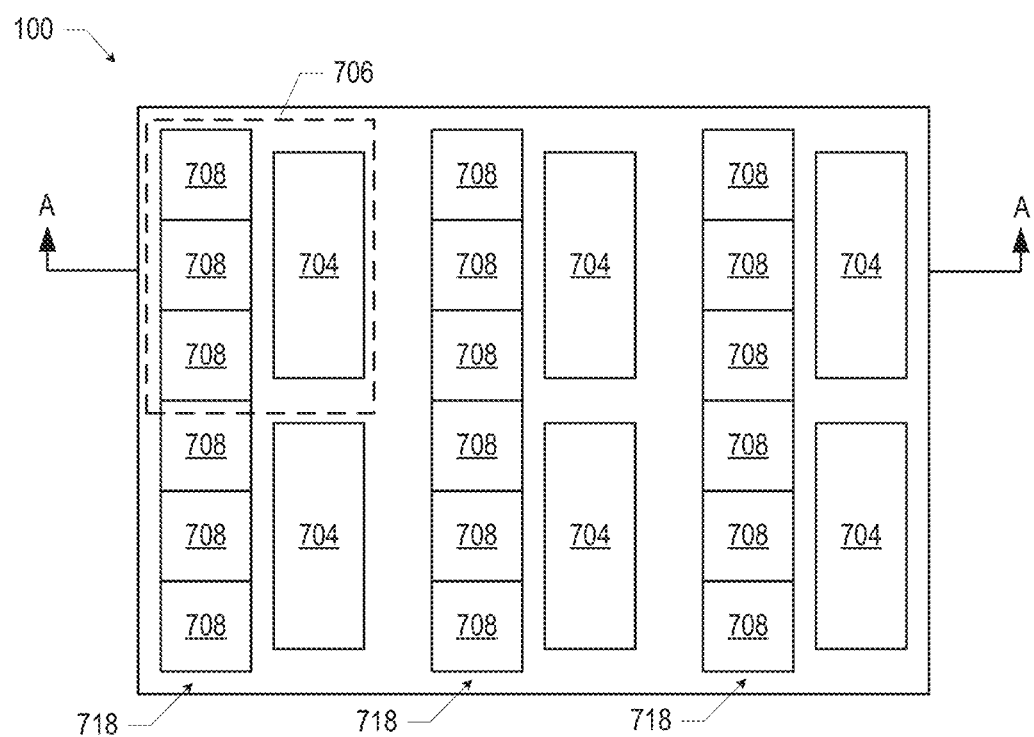

FIGS. 1 and 2 are views of a quantum dot device 100 including multiple gate groups 718 and multiple single electron transistors (SETs) 704. In particular, FIG. 1 is a cross-sectional view through the cross-section A-A of FIG. 2, and FIG. 2 is a "top" view of the quantum dot device 100 with the conductive pathways 714 and 712 omitted.

In the quantum dot device 100 of FIG. 1, multiple gates 708 are arranged in multiple gate groups 718 on a quantum dot formation region 710. Multiple SETs 704 are also disposed on the quantum dot formation region 710, and each SET 704 is disposed proximate to an associated gate group 718; a SET 704 and its associated gate group 718 may be referred to herein as a gate-detector cluster 706. One such gate-detector cluster 706 is highlighted in FIG. 2, but as shown, the quantum dot device 100 may include multiple gate-detector clusters 706. Various embodiments of the quantum dot formation region 710 are discussed below.

During operation of the quantum dot device 100, electrical signals may be provided to the gates 708 in a gate group 718 in order to induce the formation of one or more quantum dots 142 in the quantum dot formation region 710 under the gate group 718. The SET 704 in the gate-detector cluster 706 of the gate group 718 may sense the quantum states (e.g., spin states) of the quantum dots 142 induced by the gate group 718. The number and pattern of quantum dots 142 formed in the quantum dot formation region 710 under a gate group 718 may depend on the electrical signals (e.g., voltages) provided to the gates 708 in the gate group 718; for example, as discussed below, some gates 708 may act as "barrier gates" (providing potential energy barriers around a quantum dot 142) and some gates 708 may act as "plunger gates" (providing a potential energy well in which a quantum dot 142 may form). A gate group 718 may include any suitable number and arrangement of gates 708, and the gates 708 in a gate group 718 may be used (e.g., provided with electrical signals) in any desired manner to form quantum dots 142 under the gate group 718. Although different ones of the gate groups 718 in FIG. 2 are illustrated as physically separated from each other, in some embodiments, multiple ones of the gate groups 718 may be physically continuous (e.g., with abutting gates 708 from two different gate groups 718), but may each be associated with a different SET 704.

In some embodiments, a single SET 704 may be used to sense the quantum state of a single quantum dot 142 formed under the associated gate group 718 in the quantum dot formation region 710. In other embodiments, a single SET 704 may be used to sense the quantum state of more than one quantum dot 142 formed under an associated gate group 718; for example, a single SET 704 may be used to sense the quantum state of two quantum dots 142, or three quantum dots 142. In some embodiments, a single SET 704 may be shared by multiple different gate groups 718, and thus a single SET 704 may be part of multiple different gate-detector clusters 706. For example, a single SET 704 may monitor the state of quantum dots 142 under two different gate groups 718 in a time-multiplexed manner (e.g., monitoring quantum dots 142 under a first gate group 718 in a first time period, then under a second gate group 718 in a second time period, etc.).

As illustrated in FIG. 2, a quantum dot device 100 may include any desired number of gate-detector clusters 706. In some embodiments, the gate-detector clusters 706 may be arranged in regular rectangular spacing, as shown in FIG. 2. In other embodiments, multiple gate-detector clusters 706 may be arranged in any desired pattern on the quantum dot formation region 710.

The quantum dot device 100 may include conductive pathways 712 to the gates 708 in the gate groups 718; although the conductive pathways 712 illustrated in FIG. 1 are depicted as single vias, this is simply an example of a structure that may be included in a conductive pathway 712, and the conductive pathways 712 may take any of the forms discussed below. The quantum dot device 100 may also include conductive pathways 714 to the SETs 704; although the conductive pathways 714 illustrated in FIG. 1 are depicted as single vias, this is also simply an example of a structure that may be included in a conductive pathway 714, and the conductive pathways 714 may take any of the forms discussed below. An insulating material 716 may be disposed around the conductive pathways 712 and 714, and may electrically isolate the SETs 704 from the gates 708. The insulating material 716 may include multiple different types of materials, such as any of the embodiments discussed below.

The sizes and spacings of the elements in FIGS. 1 and 2 is simply illustrative, and the size and spacings of the gates 708 and the SETs 704 may take the form of any of the embodiments disclosed herein. In some embodiments, the sizes and spacings of the gates 708 and the SET 704 in a gate-detector cluster 706 may be determined by the maximum detection distance between the one or more quantum dots 142 formed under the gates 708 and the SET 704; that is, the SET 704 may have to be sized and spaced relative to the gates 708 to be able to detect the quantum state of the one or more quantum dots 142 formed by the gates 708 in the gate-detector cluster 706. In some embodiments, the distance between a gate 708 and a SET 704 in a gate-detector cluster 706 may be less than 250 nanometers (e.g., less than 200 nanometers).

Described below are a number of examples of gate groups 718, SETs 704, quantum dot formation regions 710, and conductive pathways 712 and 714 that may be included in a quantum dot device 100. For example, example gate groups 718 that may be included in a quantum dot device 100 are illustrated in FIGS. 3-4, FIGS. 30-31, FIGS. 41-43, and FIG. 66, and example SETs 704 that may be included in a quantum dot device 100 may include any of the SETS illustrated in FIGS. 67, 80, 85, and 89. Any of the gate groups 718, the quantum dot formation regions 710, and the SETs 704 discussed herein may be used in any combination in a quantum dot device 100.

Figure 3:
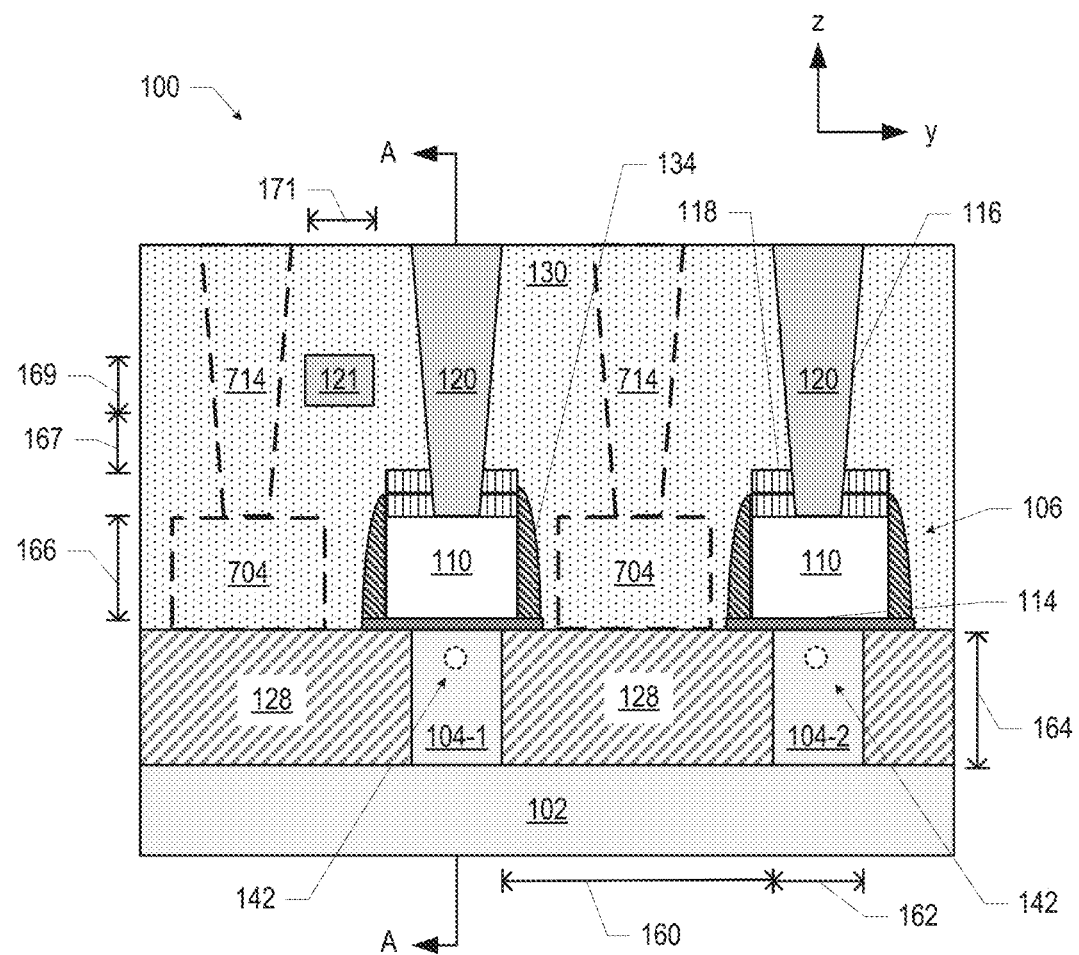
FIGS. 3-4 are cross-sectional views of a quantum dot device, in accordance with various embodiments.
Figure 4:
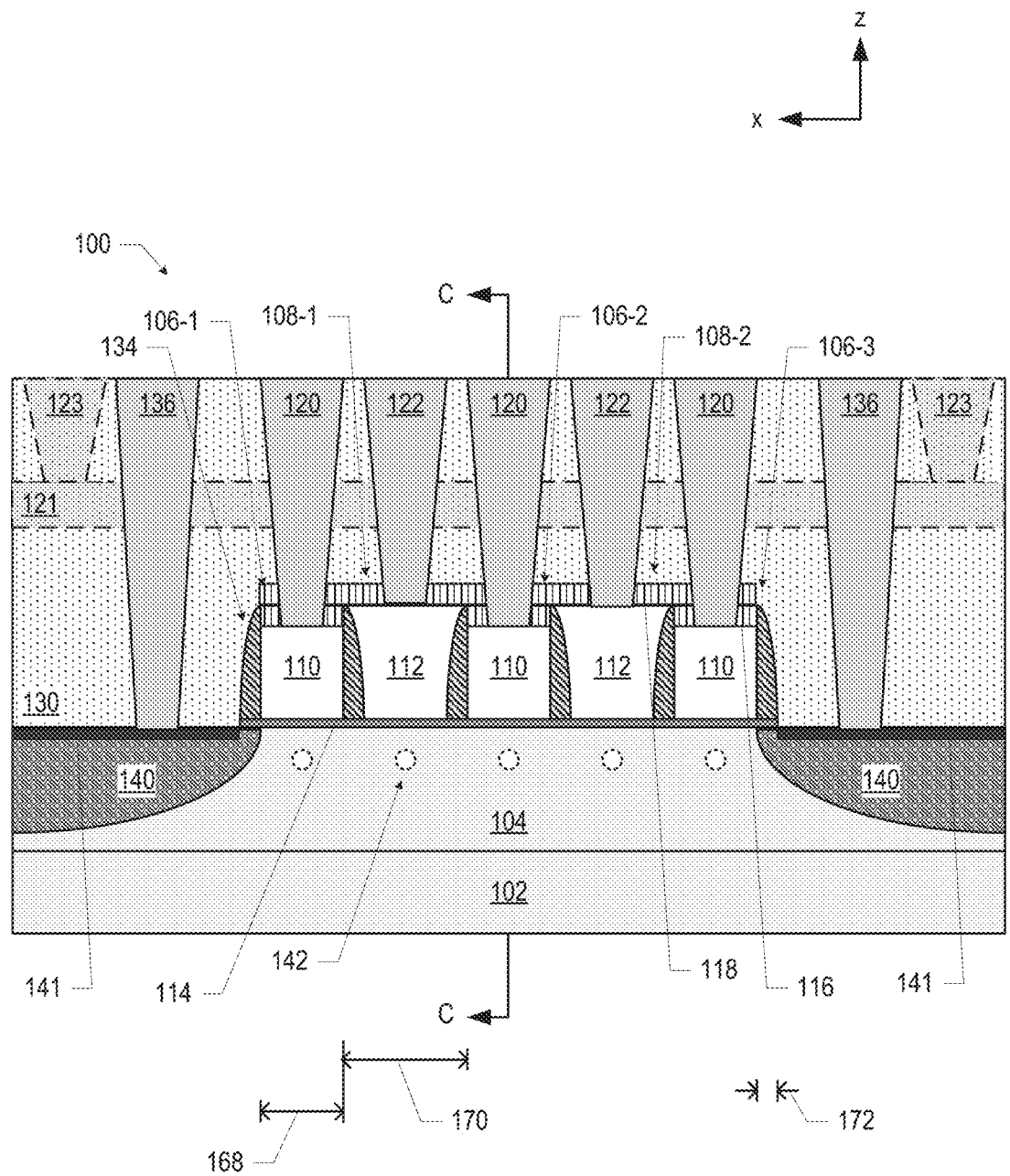

FIGS. 3-4 are cross-sectional views of a portion of a quantum dot device 100 through a gate group 718, in accordance with various embodiments. In particular, FIG. 4 illustrates the quantum dot device 100 taken along the section A-A of FIG. 3 (while FIG. 3 illustrates the quantum dot device 100 taken along the section C-C of FIG. 4). The cross-sectional view of FIG. 3 may be a similar perspective as the cross-sectional view of FIG. 1. Although FIG. 3 indicates that the cross-section illustrated in FIG. 4 is taken through the fin 104-1, an analogous cross section taken through the fin 104-2 may be identical, and thus the discussion of FIG. 4 refers generally to the "fin 104."

The quantum dot device 100 may include a base 102 and multiple fins 104 extending away from the base 102. The fins 104 and an insulating material 128 disposed around the fins 104 may provide a quantum dot formation region 710, as discussed above with reference to FIGS. 1 and 2. The base 102 and the fins 104 may include a substrate and a quantum well stack (not shown in FIGS. 3-4, but discussed below with reference to the substrate 144 and the quantum well stack 146), distributed in any of a number of ways between the base 102 and the fins 104. The base 102 may include at least some of the substrate, and the fins 104 may each include a quantum well layer of the quantum well stack (discussed below with reference to the quantum well layer 152). Examples of base/fin arrangements are discussed below with reference to the base fin arrangements 158 of FIGS. 34-40.

Although only two fins, 104-1 and 104-2, are shown in FIGS. 3-4, this is simply for ease of illustration, and more than two fins 104 may be included in the quantum dot device 100. When the quantum dot device 100 includes more than two fins 104, the fins 104 may be arranged in a line, in a two-dimensional array, or in any desired arrangement.

As noted above, each of the fins 104 may include a quantum well layer (not shown in FIGS. 3-4, but discussed below with reference to the quantum well layer 152). The quantum well layer included in the fins 104 may be arranged normal to the z-direction, and may provide a layer in which a two-dimensional electron gas (2DEG) may form to enable the generation of a quantum dot during operation of the quantum dot device 100, as discussed in further detail below. The quantum well layer itself may provide a geometric constraint on the z-location of quantum dots in the fins 104, and the limited extent of the fins 104 (and therefore the quantum well layer) in the y-direction may provide a geometric constraint on the y-location of quantum dots in the fins 104. To control the x-location of quantum dots in the fins 104, voltages may be applied to gates disposed on the fins 104 to adjust the energy profile along the fins 104 in the x-direction and thereby constrain the x-location of quantum dots within quantum wells (discussed in detail below with reference to the gates 106/108). The dimensions of the fins 104 may take any suitable values. For example, in some embodiments, the fins 104 may each have a width 162 between 10 and 30 nanometers. In some embodiments, the fins 104 may each have a height 164 between 200 and 400 nanometers (e.g., between 250 and 350 nanometers, or equal to 300 nanometers).

The fins 104 may be arranged in parallel, as illustrated in FIG. 3, and may be spaced apart by an insulating material 128, which may be disposed on opposite faces of the fins 104. The insulating material 128 may be a dielectric material, such as silicon oxide. For example, in some embodiments, the fins 104 may be spaced apart by a distance 160 between 100 and 250 nanometers.

Figure 66:
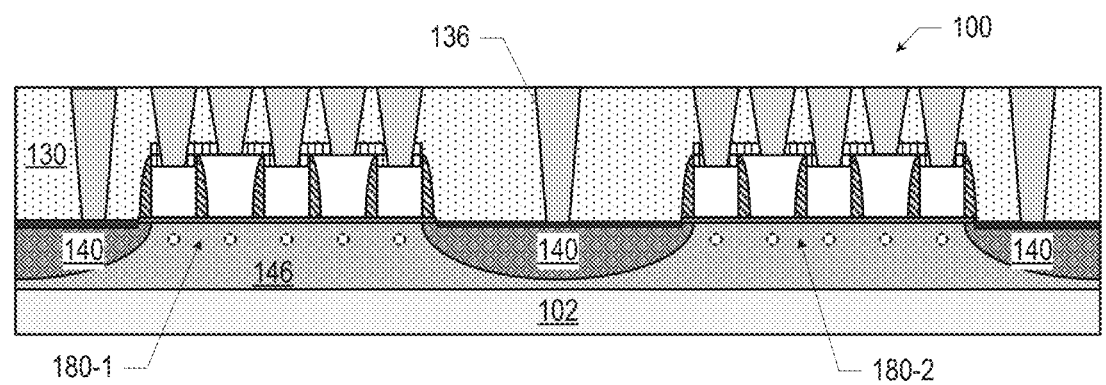
FIG. 66 illustrates an embodiment of a quantum dot device having multiple groups of gates in a single trench on a quantum well stack, in accordance with various embodiments.

Multiple gates may be disposed on each of the fins 104. In the embodiment illustrated in FIG. 4, three gates 106 and two gates 108 are shown as distributed on the top of the fin 104. This particular number of gates is simply illustrative, and any suitable number of gates may be used. Additionally, multiple groups of gates (like the gates illustrated in FIG. 4) may be disposed on the fin 104 (e.g., as discussed below with reference to multiple groups of gates in a trench as illustrated in FIG. 66). The gates 106 and 108 may provide the gates 708 (as discussed above with reference to FIGS. 1 and 2), and the gates 106 and 108 disposed on a single fin 104 may provide a gate group 718 (as discussed above with reference to FIGS. 1 and 2). Example locations for SETs 704 (and an example representation of the conductive pathways 714 to these SETS 704) are depicted with dashed lines in FIG. 3.

As shown in FIG. 4, the gate 108-1 may be disposed between the gates 106-1 and 106-2, and the gate 108-2 may be disposed between the gates 106-2 and 106-3. Each of the gates 106/108 may include a gate dielectric 114; in the embodiment illustrated in FIG. 4, the gate dielectric 114 for all of the gates 106/108 is provided by a common layer of gate dielectric material. In other embodiments, the gate dielectric 114 for each of the gates 106/108 may be provided by separate portions of gate dielectric 114. In some embodiments, the gate dielectric 114 may be a multilayer gate dielectric (e.g., with multiple materials used to improve the interface between the fin 104 and the corresponding gate metal). The gate dielectric 114 may be, for example, silicon oxide, aluminum oxide, or a high-k dielectric, such as hafnium oxide. More generally, the gate dielectric 114 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 114 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 114 to improve the quality of the gate dielectric 114.

Each of the gates 106 may include a gate metal 110 and a hardmask 116. The hardmask 116 may be formed of silicon nitride, silicon carbide, or another suitable material. The gate metal 110 may be disposed between the hardmask 116 and the gate dielectric 114, and the gate dielectric 114 may be disposed between the gate metal 110 and the fin 104. Only one portion of the hardmask 116 is labeled in FIG. 4 for ease of illustration. In some embodiments, the gate metal 110 may be a superconductor, such as aluminum, titanium nitride (e.g., deposited via atomic layer deposition), or niobium titanium nitride. In some embodiments, the hardmask 116 may not be present in the quantum dot device 100 (e.g., a hardmask like the hardmask 116 may be removed during processing, as discussed below). The sides of the gate metal 110 may be substantially parallel, as shown in FIG. 4, and insulating spacers 134 may be disposed on the sides of the gate metal 110 and the hardmask 116. As illustrated in FIG. 4, the spacers 134 may be thicker closer to the fin 104 and thinner farther away from the fin 104. In some embodiments, the spacers 134 may have a convex shape. The spacers 134 may be formed of any suitable material, such as a carbon-doped oxide, silicon nitride, silicon oxide, or other carbides or nitrides (e.g., silicon carbide, silicon nitride doped with carbon, and silicon oxynitride). The gate metal 110 may be any suitable metal, such as titanium nitride.

Each of the gates 108 may include a gate metal 112 and a hardmask 118. The hardmask 118 may be formed of silicon nitride, silicon carbide, or another suitable material. The gate metal 112 may be disposed between the hardmask 118 and the gate dielectric 114, and the gate dielectric 114 may be disposed between the gate metal 112 and the fin 104. In the embodiment illustrated in FIG. 4, the hardmask 118 may extend over the hardmask 116 (and over the gate metal 110 of the gates 106), while in other embodiments, the hardmask 118 may not extend over the gate metal 110 (e.g., as discussed below with reference to FIG. 39). In some embodiments, the gate metal 112 may be a different metal from the gate metal 110; in other embodiments, the gate metal 112 and the gate metal 110 may have the same material composition. In some embodiments, the gate metal 112 may be a superconductor, such as aluminum, titanium nitride (e.g., deposited via atomic layer deposition), or niobium titanium nitride. In some embodiments, the hardmask 118 may not be present in the quantum dot device 100 (e.g., a hardmask like the hardmask 118 may be removed during processing, as discussed below).

The gate 108-1 may extend between the proximate spacers 134 on the sides of the gate 106-1 and the gate 106-2, as shown in FIG. 4. In some embodiments, the gate metal 112 of the gate 108-1 may extend between the spacers 134 on the sides of the gate 106-1 and the gate 106-2. Thus, the gate metal 112 of the gate 108-1 may have a shape that is substantially complementary to the shape of the spacers 134, as shown. Similarly, the gate 108-2 may extend between the proximate spacers 134 on the sides of the gate 106-2 and the gate 106-3. In some embodiments in which the gate dielectric 114 is not a layer shared commonly between the gates 108 and 106, but instead is separately deposited on the fin 104 between the spacers 134 (e.g., as discussed below with reference to FIGS. 50-53), the gate dielectric 114 may extend at least partially up the sides of the spacers 134, and the gate metal 112 may extend between the portions of gate dielectric 114 on the spacers 134. The gate metal 112, like the gate metal 110, may be any suitable metal, such as titanium nitride.

The dimensions of the gates 106/108 may take any suitable values. For example, in some embodiments, the z-height 166 of the gate metal 110 may be between 40 and 75 nanometers (e.g., approximately 50 nanometers); the z-height of the gate metal 112 may be in the same range. In embodiments like the ones illustrated in FIG. 4, the z-height of the gate metal 112 may be greater than the z-height of the gate metal 110. In some embodiments, the length 168 of the gate metal 110 (i.e., in the x-direction) may be between 20 and 40 nanometers (e.g., 30 nanometers). In some embodiments, the distance 170 between adjacent ones of the gates 106 (e.g., as measured from the gate metal 110 of one gate 106 to the gate metal 110 of an adjacent gate 106 in the x-direction, as illustrated in FIG. 4) may be between 40 and 60 nanometers (e.g., 50 nanometers). In some embodiments, the thickness 172 of the spacers 134 may be between 1 and 10 nanometers (e.g., between 3 and 5 nanometers, between 4 and 6 nanometers, or between 4 and 7 nanometers). The length of the gate metal 112 (i.e., in the x-direction) may depend on the dimensions of the gates 106 and the spacers 134, as illustrated in FIG. 4. As indicated in FIG. 3, the gates 106/108 on one fin 104 may extend over the insulating material 128 beyond their respective fins 104 and towards the other fin 104, but may be isolated from their counterpart gates by the intervening insulating material 130 and spacers 134.

Although all of the gates 106 are illustrated in the accompanying drawings as having the same length 168 of the gate metal 110, in some embodiments, the "outermost" gates 106 (e.g., the gates 106-1 and 106-3 of the embodiment illustrated in FIG. 4) may have a greater length 168 than the "inner" gates 106 (e.g., the gate 106-2 in the embodiment illustrated in FIG. 4). Such longer "outside" gates 106 may provide spatial separation between the doped regions 140 and the areas under the gates 108 and the inner gates 106 in which quantum dots 142 may form, and thus may reduce the perturbations to the potential energy landscape under the gates 108 and the inner gates 106 caused by the doped regions 140.

As shown in FIG. 4, the gates 106 and 108 may be alternatingly arranged along the fin 104 in the x-direction. During operation of the quantum dot device 100, voltages may be applied to the gates 106/108 to adjust the potential energy in the quantum well layer (not shown) in the fin 104 to create quantum wells of varying depths in which quantum dots 142 may form. Only one quantum dot 142 is labeled with a reference numeral in FIG. 4 for ease of illustration, but five are indicated as dotted circles in each fin 104. The location of the quantum dots 142 in FIG. 4 is not intended to indicate a particular geometric positioning of the quantum dots 142. The spacers 134 may themselves provide "passive" barriers between quantum wells under the gates 106/108 in the quantum well layer, and the voltages applied to different ones of the gates 106/108 may adjust the potential energy under the gates 106/108 in the quantum well layer; decreasing the potential energy may form quantum wells, while increasing the potential energy may form quantum barriers.

The fins 104 may include doped regions 140 that may serve as a reservoir of charge carriers for the quantum dot device 100. For example, an n-type doped region 140 may supply electrons for electron-type quantum dots 142, and a p-type doped region 140 may supply holes for hole-type quantum dots 142. In some embodiments, an interface material 141 may be disposed at a surface of a doped region 140, as shown. The interface material 141 may facilitate electrical coupling between a conductive contact (e.g., a conductive via 136, as discussed below) and the doped region 140. The interface material 141 may be any suitable metal-semiconductor ohmic contact material; for example, in embodiments in which the doped region 140 includes silicon, the interface material 141 may include nickel silicide, aluminum silicide, titanium silicide, molybdenum silicide, cobalt silicide, tungsten silicide, or platinum silicide (e.g., as discussed below with reference to FIGS. 23-24). In some embodiments, the interface material 141 may be a non-silicide compound, such as titanium nitride. In some embodiments, the interface material 141 may be a metal (e.g., aluminum, tungsten, or indium).

The quantum dot devices 100 disclosed herein may be used to form electron-type or hole-type quantum dots 142. Note that the polarity of the voltages applied to the gates 106/108 to form quantum wells/barriers depend on the charge carriers used in the quantum dot device 100. In embodiments in which the charge carriers are electrons (and thus the quantum dots 142 are electron-type quantum dots), amply negative voltages applied to a gate 106/108 may increase the potential barrier under the gate 106/108, and amply positive voltages applied to a gate 106/108 may decrease the potential barrier under the gate 106/108 (thereby forming a potential well in which an electron-type quantum dot 142 may form). In embodiments in which the charge carriers are holes (and thus the quantum dots 142 are hole-type quantum dots), amply positive voltages applied to a gate 106/108 may increase the potential barrier under the gate 106/108, and amply negative voltages applied to a gate 106 and 108 may decrease the potential barrier under the gate 106/108 (thereby forming a potential well in which a hole-type quantum dot 142 may form). The quantum dot devices 100 disclosed herein may be used to form electron-type or hole-type quantum dots.

Voltages may be applied to each of the gates 106 and 108 separately to adjust the potential energy in the quantum well layer under the gates 106 and 108, and thereby control the formation of quantum dots 142 under each of the gates 106 and 108. Additionally, the relative potential energy profiles under different ones of the gates 106 and 108 allow the quantum dot device 100 to tune the potential interaction between quantum dots 142 under adjacent gates. For example, if two adjacent quantum dots 142 (e.g., one quantum dot 142 under a gate 106 and another quantum dot 142 under a gate 108) are separated by only a short potential barrier, the two quantum dots 142 may interact more strongly than if they were separated by a taller potential barrier. Since the depth of the potential wells/height of the potential barriers under each gate 106/108 may be adjusted by adjusting the voltages on the respective gates 106/108, the differences in potential between adjacent gates 106/108 may be adjusted, and thus the interaction tuned.

In some applications, the gates 108 may be used as plunger gates to enable the formation of quantum dots 142 under the gates 108, while the gates 106 may be used as barrier gates to adjust the potential barrier between quantum dots 142 formed under adjacent gates 108. In other applications, the gates 108 may be used as barrier gates, while the gates 106 are used as plunger gates. In other applications, quantum dots 142 may be formed under all of the gates 106 and 108, or under any desired subset of the gates 106 and 108.

Conductive vias and lines may make contact with the gates 106/108, and to the doped regions 140, to enable electrical connection to the gates 106/108 and the doped regions 140 to be made in desired locations. As shown in FIGS. 3-4, the gates 106 may extend away from the fins 104, and conductive vias 120 may contact the gates 106 (and are drawn in dashed lines in FIG. 4 to indicate their location behind the plane of the drawing). The conductive vias 120 may extend through the hardmask 116 and the hardmask 118 to contact the gate metal 110 of the gates 106. The gates 108 may extend away from the fins 104, and conductive vias 122 may contact the gates 108 (also drawn in dashed lines in FIG. 4 to indicate their location behind the plane of the drawing). The conductive vias 122 may extend through the hardmask 118 to contact the gate metal 112 of the gates 108. Conductive vias 136 may contact the interface material 141 and may thereby make electrical contact with the doped regions 140. The quantum dot device 100 may include further conductive vias and/or lines (not shown) to make electrical contact to the gates 106/108 and/or the doped regions 140, as desired. The conductive vias and lines included in a quantum dot device 100 may include any suitable materials, such as copper, tungsten (deposited, e.g., by CVD), or a superconductor (e.g., aluminum, tin, titanium nitride, niobium titanium nitride, tantalum, niobium, or other niobium compounds such as niobium tin and niobium germanium).

During operation, a bias voltage may be applied to the doped regions 140 (e.g., via the conductive vias 136 and the interface material 141) to cause current to flow through the doped regions 140. When the doped regions 140 are doped with an n-type material, this voltage may be positive; when the doped regions 140 are doped with a p-type material, this voltage may be negative. The magnitude of this bias voltage may take any suitable value (e.g., between 0.25 volts and 2 volts).

The quantum dot device 100 may include one or more magnet lines 121. For example, a single magnet line 121 is illustrated in FIGS. 3-4 proximate to the fin 104-1. The magnet line 121 may be formed of a conductive material, and may be used to conduct current pulses that generate magnetic fields to influence the spin states of one or more of the quantum dots 142 that may form in the fins 104. In some embodiments, the magnet line 121 may conduct a pulse to reset (or "scramble") nuclear and/or quantum dot spins. In some embodiments, the magnet line 121 may conduct a pulse to initialize an electron in a quantum dot in a particular spin state. In some embodiments, the magnet line 121 may conduct current to provide a continuous, oscillating magnet field to which the spin of a qubit may couple. The magnet line 121 may provide any suitable combination of these embodiments, or any other appropriate functionality.

In some embodiments, the magnet line 121 may be formed of copper. In some embodiments, the magnet line 121 may be formed of a superconductor, such as aluminum. The magnet line 121 illustrated in FIGS. 3-4 is non-coplanar with the fins 104, and is also non-coplanar with the gates 106/108. In some embodiments, the magnet line 121 may be spaced apart from the gates 106/108 by a distance 167. The distance 167 may take any suitable value (e.g., based on the desired strength of magnetic field interaction with the quantum dots 142); in some embodiments, the distance 167 may be between 25 nanometers and 1 micron (e.g., between 50 nanometers and 200 nanometers).

In some embodiments, the magnet line 121 may be formed of a magnetic material. For example, a magnetic material (such as cobalt) may be deposited in a trench in the insulating material 130 to provide a permanent magnetic field in the quantum dot device 100.

The magnet line 121 may have any suitable dimensions. For example, the magnet line 121 may have a thickness 169 between 25 and 100 nanometers. The magnet line 121 may have a width 171 between 25 and 100 nanometers. In some embodiments, the width 171 and thickness 169 of a magnet line 121 may be equal to the width and thickness, respectively, of other conductive lines in the quantum dot device 100 (not shown) used to provide electrical interconnects, as known in the art. The magnet line 121 may have a length 173 that may depend on the number and dimensions of the gates 106/108 that are to form quantum dots 142 with which the magnet line 121 is to interact. The magnet line 121 illustrated in FIGS. 3-4 (and the magnet lines 121 illustrated in FIGS. 30-31 below) are substantially linear, but this need not be the case; the magnet lines 121 disclosed herein may take any suitable shape. Conductive vias 123 may contact the magnet line 121.

The conductive vias 120, 122, 136, and 123 may be electrically isolated from each other by an insulating material 130. The insulating material 130 may be any suitable material, such as an interlayer dielectric (ILD). Examples of the insulating material 130 may include silicon oxide, silicon nitride, aluminum oxide, carbon-doped oxide, and/or silicon oxynitride. As known in the art of integrated circuit manufacturing, conductive vias and lines may be formed in an iterative process in which layers of structures are formed on top of each other. In some embodiments, the conductive vias 120/122/136/123 may have a width that is 20 nanometers or greater at their widest point (e.g., 30 nanometers), and a pitch of 80 nanometers or greater (e.g., 100 nanometers). In some embodiments, conductive lines (not shown) included in the quantum dot device 100 may have a width that is 100 nanometers or greater, and a pitch of 100 nanometers or greater. The particular arrangement of conductive vias shown in FIGS. 3-4 is simply illustrative, and any electrical routing arrangement may be implemented.

As discussed above, the structure of the fin 104-1 may be the same as the structure of the fin 104-2; similarly, the construction of gates 106/108 on the fin 104-1 may be the same as the construction of gates 106/108 on the fin 104-2. The gates 106/108 on the fin 104-1 may be mirrored by corresponding gates 106/108 on the parallel fin 104-2, and the insulating material 130 may separate the gates 106/108 on the different fins 104-1 and 104-2. In particular, quantum dots 142 formed in the fin 104-1 (under the gates 106/108) may have counterpart quantum dots 142 in the fin 104-2 (under the corresponding gates 106/108).

The quantum dot devices 100 disclosed herein may be manufactured using any suitable techniques. FIGS. 5-29 illustrate various example stages in the manufacture of the quantum dot device 100 of FIGS. 3-4, in accordance with various embodiments. Although the particular manufacturing operations discussed below with reference to FIGS. 5-29 are illustrated as manufacturing a particular embodiment of the quantum dot device 100, these operations may be applied to manufacture many different embodiments of the quantum dot device 100, as discussed herein. Any of the elements discussed below with reference to FIGS. 5-29 may take the form of any of the embodiments of those elements discussed above (or otherwise disclosed herein). The fabrication of the SETs 704 illustrated in FIG. 4 is not discussed with reference to FIGS. 5-29, but SET fabrication techniques are discussed below with reference to a number of different embodiments of SETs. These SET fabrication techniques may be integrated with the operations discussed below with reference to FIGS. 5-29 in any suitable manner.

Figure 5:
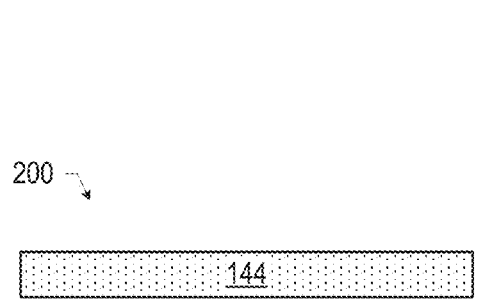
FIGS. 5-29 illustrate various example stages in the manufacture of a quantum dot device, in accordance with various embodiments.

FIG. 5 illustrates a cross-sectional view of an assembly 200 including a substrate 144. The substrate 144 may include any suitable semiconductor material or materials. In some embodiments, the substrate 144 may include a semiconductor material. For example, the substrate 144 may include silicon (e.g., may be formed from a silicon wafer).

Figure 6:
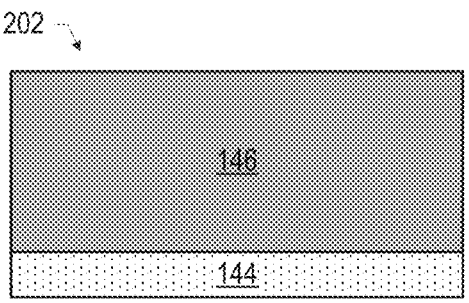

FIG. 6 illustrates a cross-sectional view of an assembly 202 subsequent to providing a quantum well stack 146 on the substrate 144 of the assembly 200 (FIG. 5). The quantum well stack 146 may include a quantum well layer (not shown) in which a 2DEG may form during operation of the quantum dot device 100. Various embodiments of the quantum well stack 146 are discussed below with reference to FIGS. 32-33.

Figure 7:
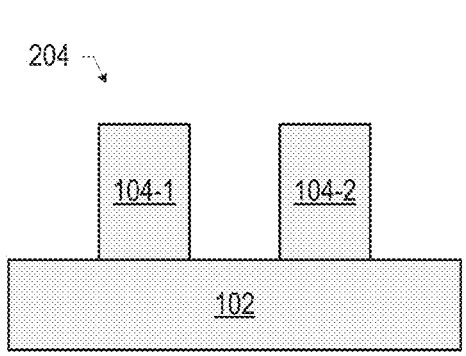

FIG. 7 illustrates a cross-sectional view of an assembly 204 subsequent to forming fins 104 in the assembly 202 (FIG. 6). The fins 104 may extend from a base 102, and may be formed in the assembly 202 by patterning and then etching the assembly 202, as known in the art. For example, a combination of dry and wet etch chemistry may be used to form the fins 104, and the appropriate chemistry may depend on the materials included in the assembly 202, as known in the art. At least some of the substrate 144 may be included in the base 102, and at least some of the quantum well stack 146 may be included in the fins 104. In particular, the quantum well layer (not shown) of the quantum well stack 146 may be included in the fins 104. Example arrangements in which the quantum well stack 146 and the substrate 144 are differently included in the base 102 and the fins 104 are discussed below with reference to FIGS. 34-40.

Figure 8:
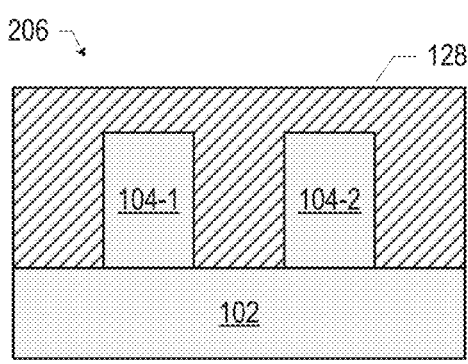

FIG. 8 illustrates a cross-sectional view of an assembly 206 subsequent to providing an insulating material 128 to the assembly 204 (FIG. 7). Any suitable material may be used as the insulating material 128 to electrically insulate the fins 104 from each other. As noted above, in some embodiments, the insulating material 128 may be a dielectric material, such as silicon oxide.

Figure 9:
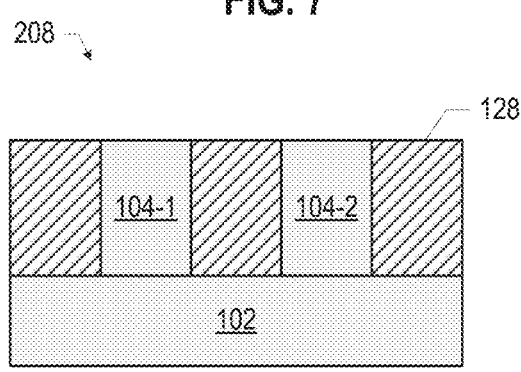

FIG. 9 illustrates a cross-sectional view of an assembly 208 subsequent to planarizing the assembly 206 (FIG. 8) to remove the insulating material 128 above the fins 104. In some embodiments, the assembly 206 may be planarized using a chemical mechanical polishing (CMP) technique.

Figure 10:
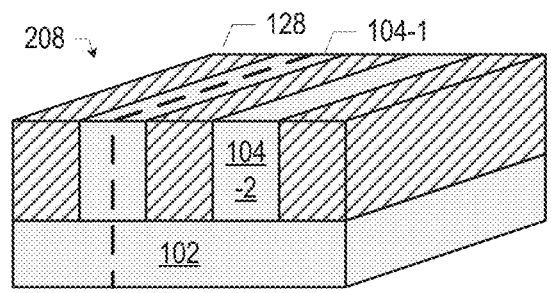
Figure 11:
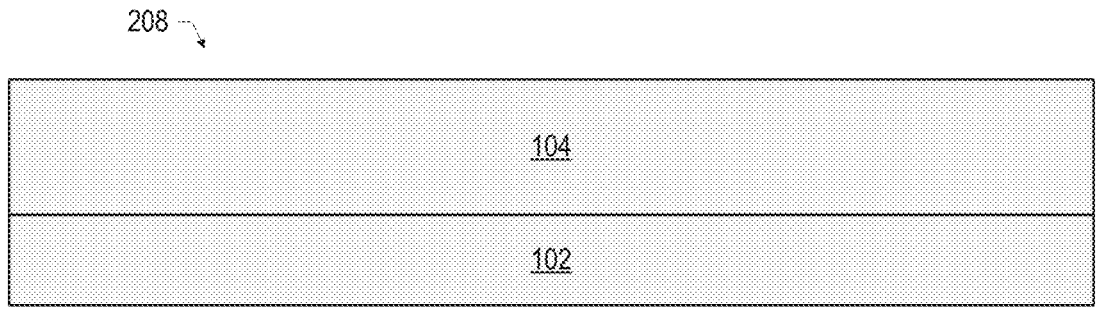

FIG. 10 is a perspective view of at least a portion of the assembly 208, showing the fins 104 extending from the base 102 and separated by the insulating material 128. The cross-sectional views of FIGS. 5-9 are taken parallel to the plane of the page of the perspective view of FIG. 10. FIG. 11 is another cross-sectional view of the assembly 208, taken along the dashed line along the fin 104-1 in FIG. 10. The cross-sectional views illustrated in FIGS. 12-29 are taken along the same cross section as FIG. 11.

Figure 12:
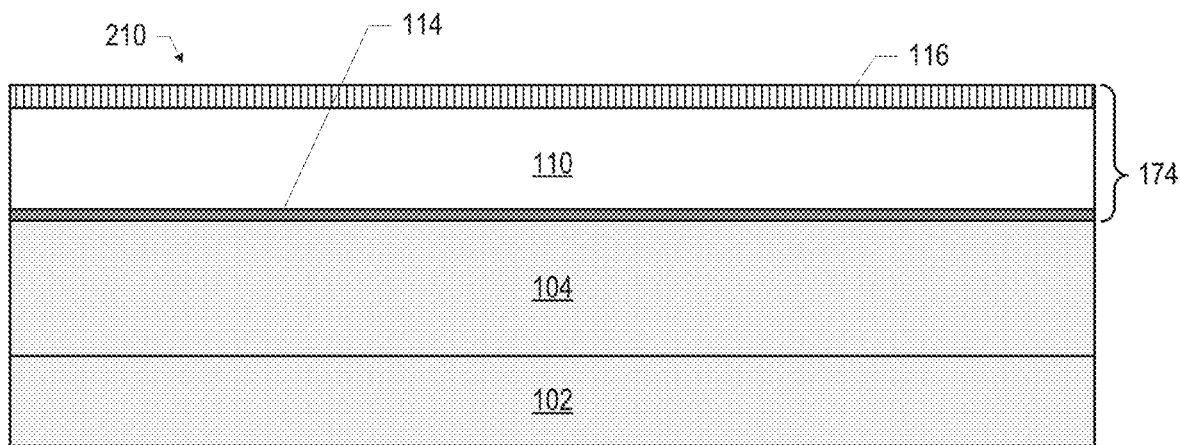

FIG. 12 is a cross-sectional view of an assembly 210 subsequent to forming a gate stack 174 on the fins 104 of the assembly 208 (FIGS. 9-11). The gate stack 174 may include the gate dielectric 114, the gate metal 110, and a hardmask 116. The hardmask 116 may be formed of an electrically insulating material, such as silicon nitride or carbon-doped nitride.

Figure 13:
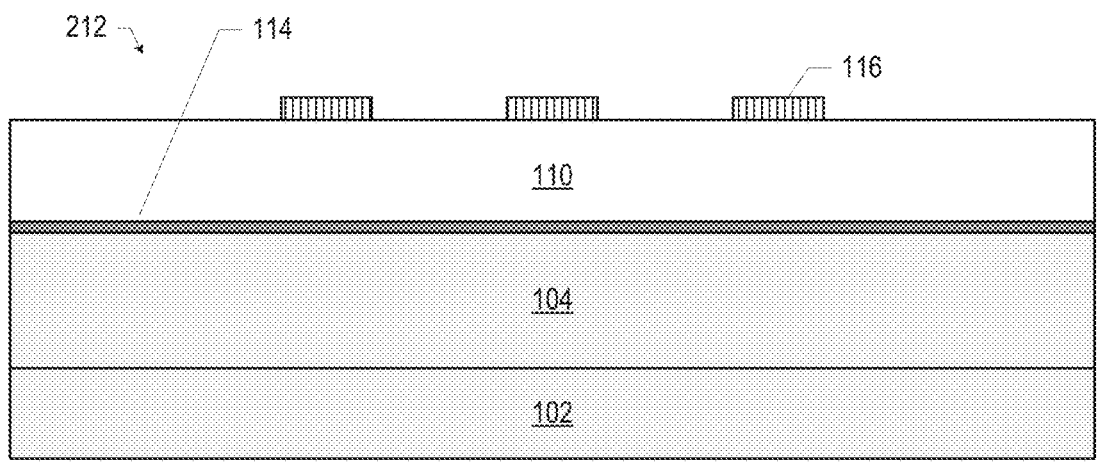

FIG. 13 is a cross-sectional view of an assembly 212 subsequent to patterning the hardmask 116 of the assembly 210 (FIG. 12). The pattern applied to the hardmask 116 may correspond to the locations for the gates 106, as discussed below. The hardmask 116 may be patterned by applying a resist, patterning the resist using lithography, and then etching the hardmask (using dry etching or any appropriate technique).

Figure 14:
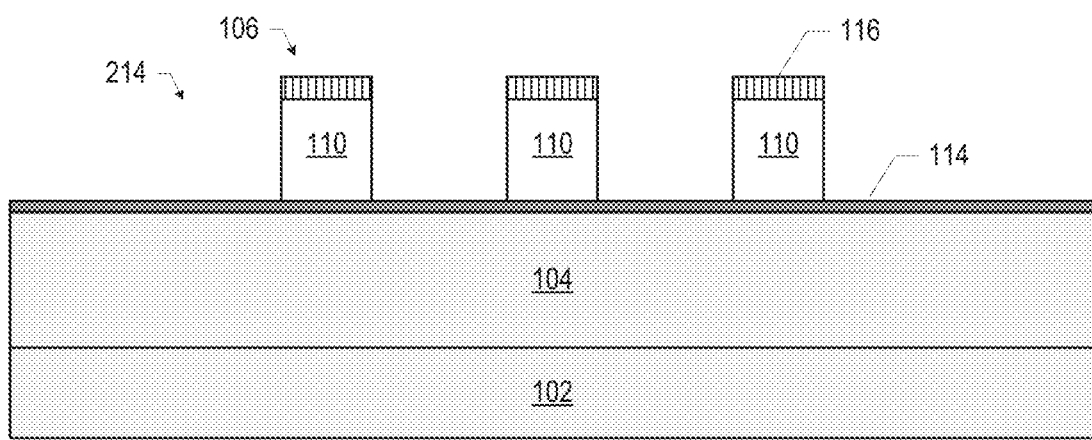

FIG. 14 is a cross-sectional view of an assembly 214 subsequent to etching the assembly 212 (FIG. 13) to remove the gate metal 110 that is not protected by the patterned hardmask 116 to form the gates 106. In some embodiments, as illustrated in FIG. 14, the gate dielectric 114 may remain after the etched gate metal 110 is etched away; in other embodiments, the gate dielectric 114 may also be etched during the etching of the gate metal 110. Examples of such embodiments are discussed below with reference to FIGS. 50-53.

Figure 15:
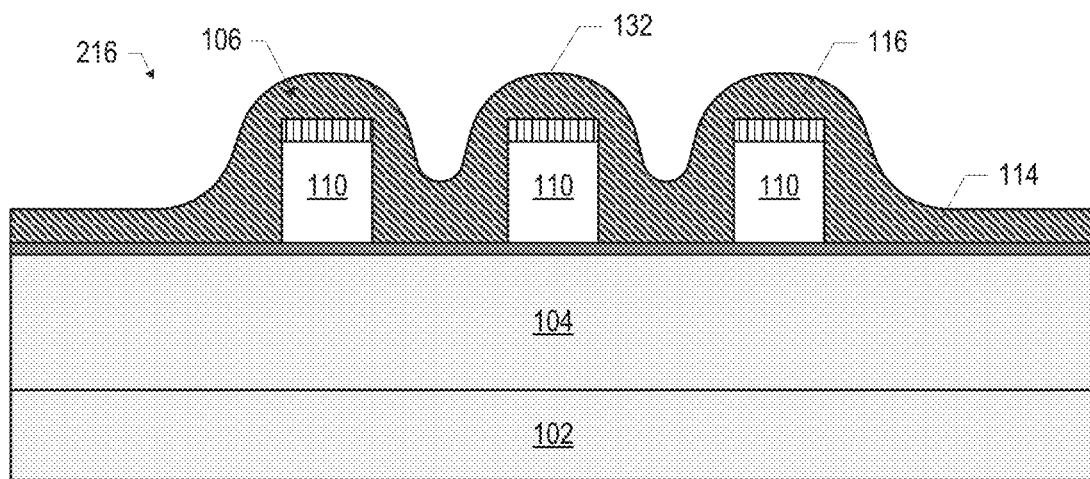

FIG. 15 is a cross-sectional view of an assembly 216 subsequent to providing spacer material 132 on the assembly 214 (FIG. 14). The spacer material 132 may include any of the materials discussed above with reference to the spacers 134, for example, and may be deposited using any suitable technique. For example, the spacer material 132 may be a nitride material (e.g., silicon nitride) deposited by sputtering.

Figure 16:
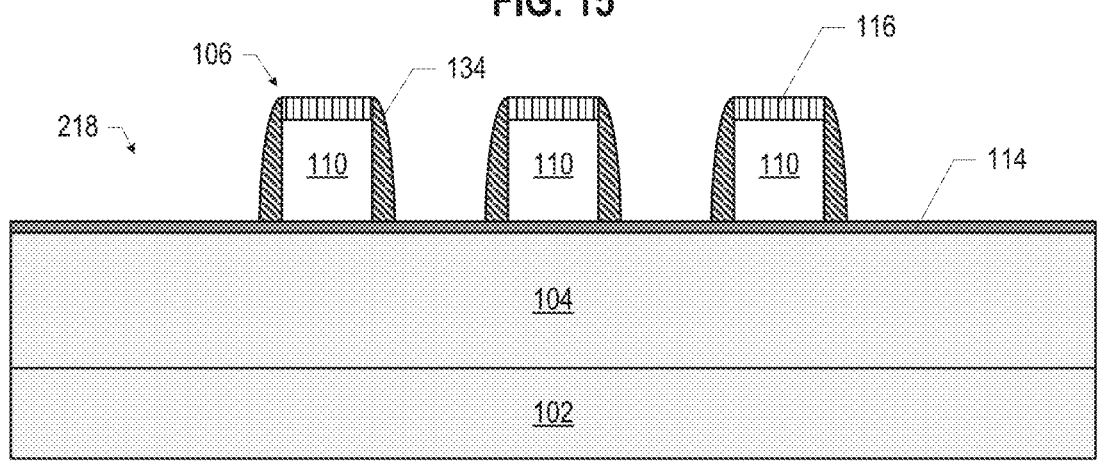

FIG. 16 is a cross-sectional view of an assembly 218 subsequent to etching the spacer material 132 of the assembly 216 (FIG. 15), leaving spacers 134 formed of the spacer material 132 on the sides of the gates 106 (e.g., on the sides of the hardmask 116 and the gate metal 110). The etching of the spacer material 132 may be an anisotropic etch, etching the spacer material 132 "downward" to remove the spacer material 132 on top of the gates 106 and in some of the area between the gates 106, while leaving the spacers 134 on the sides of the gates 106. In some embodiments, the anisotropic etch may be a dry etch.

Figure 17:
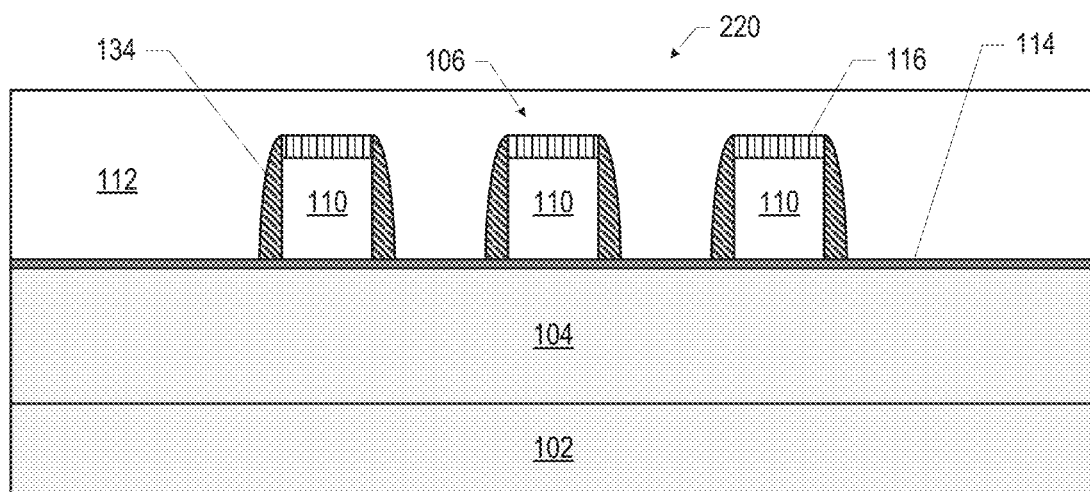

FIG. 17 is a cross-sectional view of an assembly 220 subsequent to providing the gate metal 112 on the assembly 218 (FIG. 16). The gate metal 112 may fill the areas between adjacent ones of the gates 106, and may extend over the tops of the gates 106.

Figure 18:
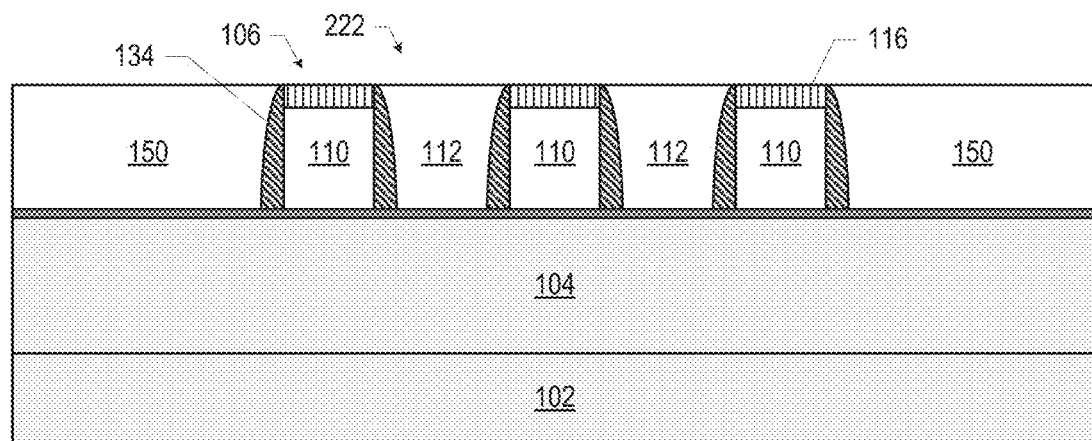

FIG. 18 is a cross-sectional view of an assembly 222 subsequent to planarizing the assembly 220 (FIG. 17) to remove the gate metal 112 above the gates 106. In some embodiments, the assembly 220 may be planarized using a CMP technique. Some of the remaining gate metal 112 may fill the areas between adjacent ones of the gates 106, while other portions 150 of the remaining gate metal 112 may be located "outside" of the gates 106.

Figure 19:
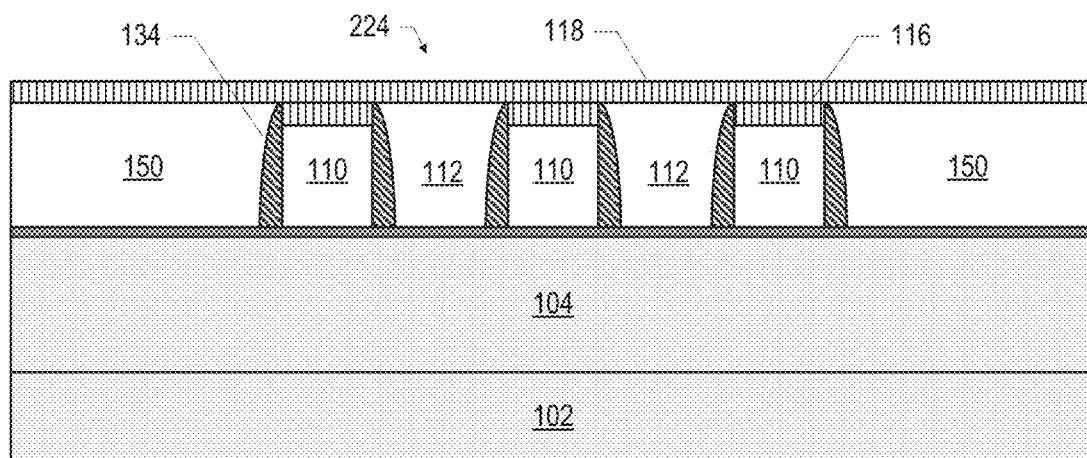

FIG. 19 is a cross-sectional view of an assembly 224 subsequent to providing a hardmask 118 on the planarized surface of the assembly 222 (FIG. 18). The hardmask 118 may be formed of any of the materials discussed above with reference to the hardmask 116, for example.

Figure 20:
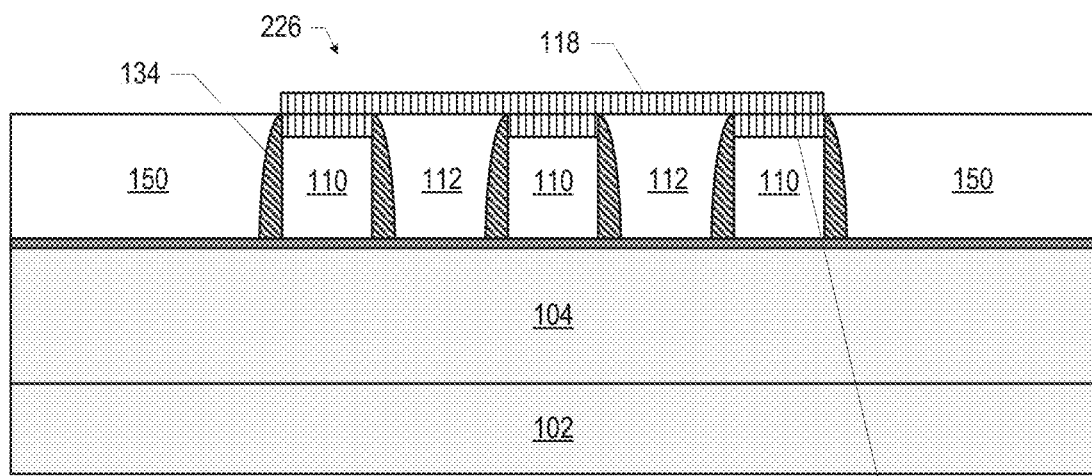

FIG. 20 is a cross-sectional view of an assembly 226 subsequent to patterning the hardmask 118 of the assembly 224 (FIG. 19). The pattern applied to the hardmask 118 may extend over the hardmask 116 (and over the gate metal 110 of the gates 106, as well as over the locations for the gates 108 (as illustrated in FIG. 4). The hardmask 118 may be non-coplanar with the hardmask 116, as illustrated in FIG. 20. The hardmask 118 illustrated in FIG. 20 may thus be a common, continuous portion of hardmask 118 that extends over all of the hardmask 116. The hardmask 118 may be patterned using any of the techniques discussed above with reference to the patterning of the hardmask 116, for example.

Figure 21:
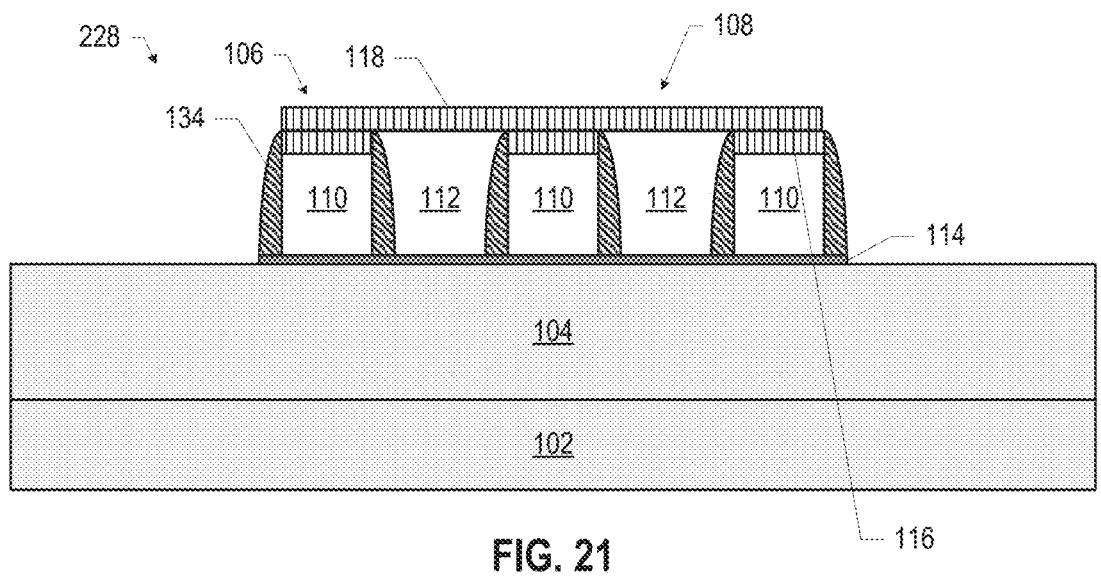

FIG. 21 is a cross-sectional view of an assembly 228 subsequent to etching the assembly 226 (FIG. 20) to remove the portions 150 that are not protected by the patterned hardmask 118 to form the gates 108. Portions of the hardmask 118 may remain on top of the hardmask 116, as shown. The operations performed on the assembly 226 may include removing any gate dielectric 114 that is "exposed" on the fin 104, as shown. The excess gate dielectric 114 may be removed using any suitable technique, such as chemical etching or silicon bombardment.

Figure 22:
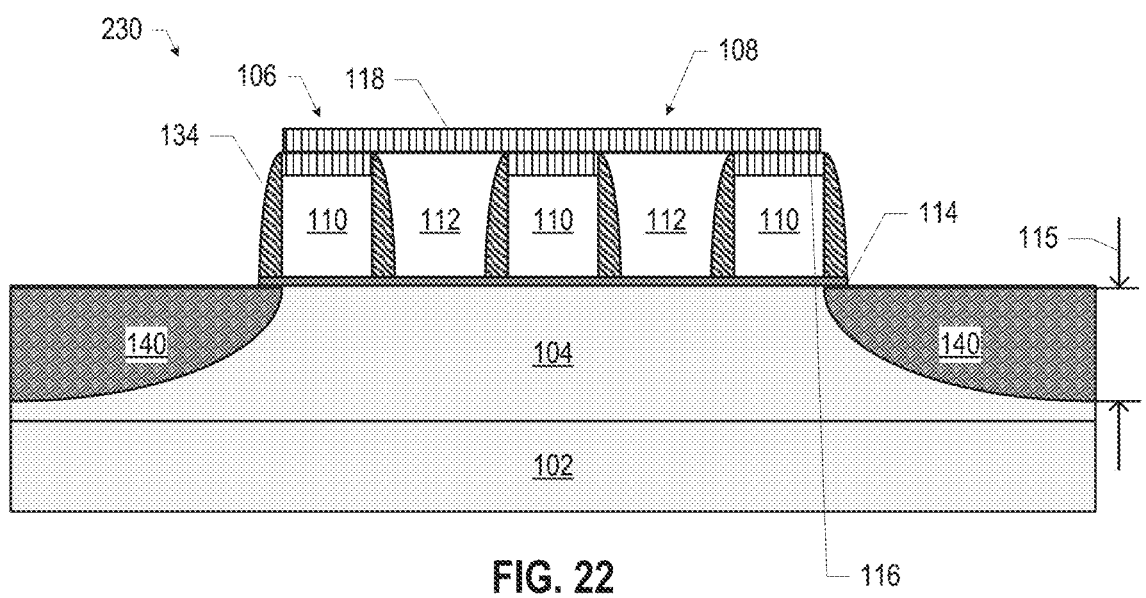

FIG. 22 is a cross-sectional view of an assembly 230 subsequent to doping the fins 104 of the assembly 228 (FIG. 21) to form doped regions 140 in the portions of the fins 104 "outside" of the gates 106/108. The type of dopant used to form the doped regions 140 may depend on the type of quantum dot desired, as discussed above. In some embodiments, the doping may be performed by ion implantation. For example, when the quantum dot 142 is to be an electron-type quantum dot 142, the doped regions 140 may be formed by ion implantation of phosphorous, arsenic, or another n-type material. When the quantum dot 142 is to be a hole-type quantum dot 142, the doped regions 140 may be formed by ion implantation of boron or another p-type material. An annealing process that activates the dopants and causes them to diffuse farther into the fins 104 may follow the ion implantation process. The depth of the doped regions 140 may take any suitable value; for example, in some embodiments, the doped regions 140 may extend into the fin 104 to a depth 115 between 500 and 1000 Angstroms.

The outer spacers 134 on the outer gates 106 may provide a doping boundary, limiting diffusion of the dopant from the doped regions 140 into the area under the gates 106/108. As shown, the doped regions 140 may extend under the adjacent outer spacers 134. In some embodiments, the doped regions 140 may extend past the outer spacers 134 and under the gate metal 110 of the outer gates 106, may extend only to the boundary between the outer spacers 134 and the adjacent gate metal 110, or may terminate under the outer spacers 134 and not reach the boundary between the outer spacers 134 and the adjacent gate metal 110. The doping concentration of the doped regions 140 may, in some embodiments, be between $10^{17}/cm^3$ and $10^{20}/cm^3$.

Figure 23:
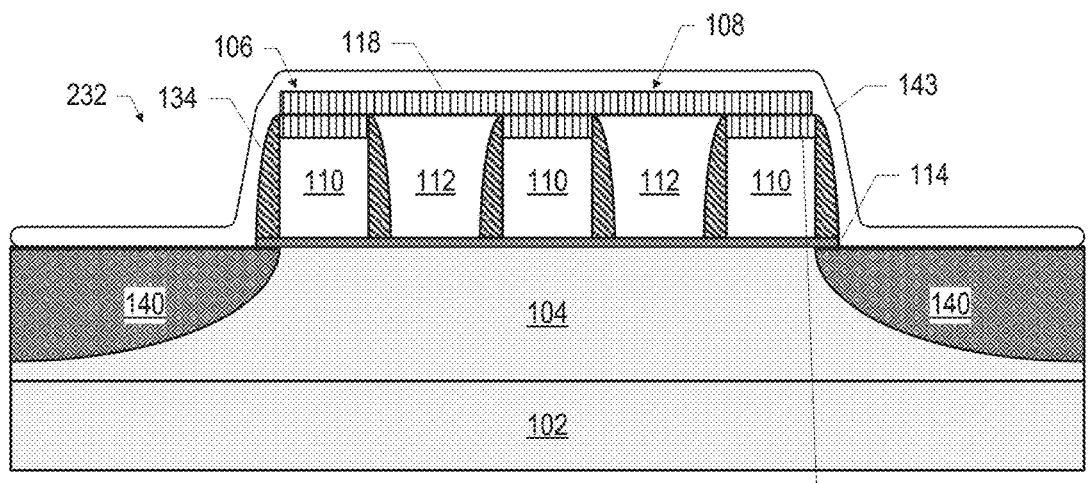

FIG. 23 is a cross-sectional side view of an assembly 232 subsequent to providing a layer of nickel or other material 143 over the assembly 230 (FIG. 22). The nickel or other material 143 may be deposited on the assembly 230 using any suitable technique (e.g., a plating technique, chemical vapor deposition, or atomic layer deposition).

Figure 24:
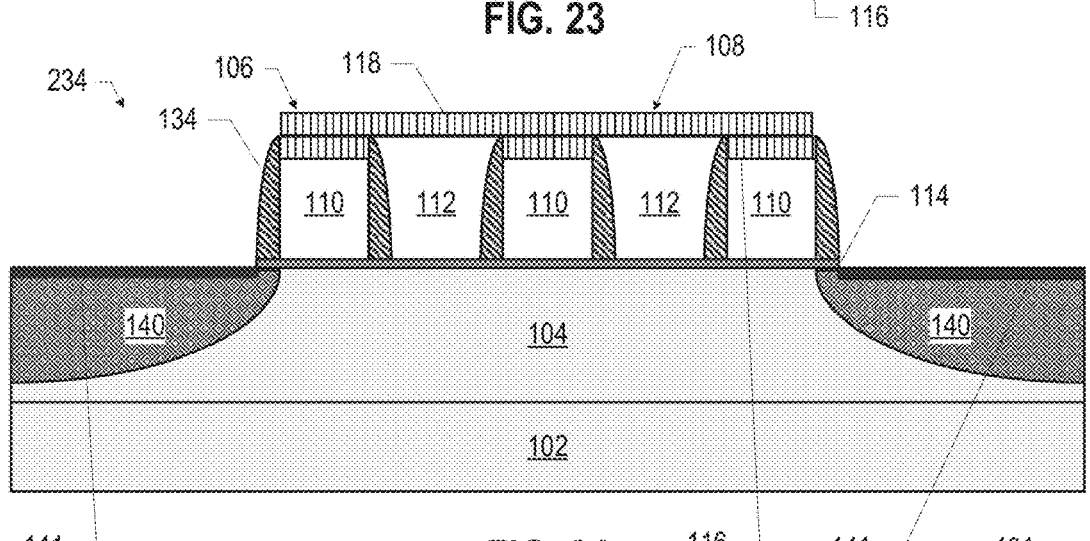

FIG. 24 is a cross-sectional side view of an assembly 234 subsequent to annealing the assembly 232 (FIG. 23) to cause the material 143 to interact with the doped regions 140 to form the interface material 141, then removing the unreacted material 143. When the doped regions 140 include silicon and the material 143 includes nickel, for example, the interface material 141 may be nickel silicide. Materials other than nickel may be deposited in the operations discussed above with reference to FIG. 23 in order to form other interface materials 141, including titanium, aluminum, molybdenum, cobalt, tungsten, or platinum, for example. More generally, the interface material 141 of the assembly 234 may include any of the materials discussed herein with reference to the interface material 141.

Figure 25:
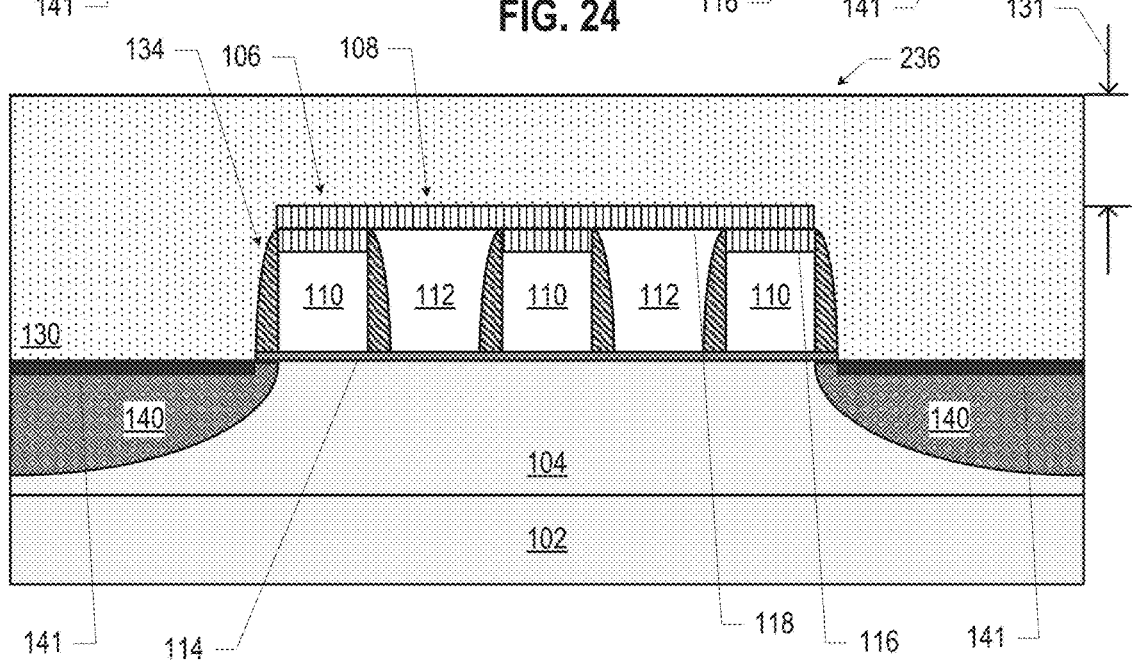

FIG. 25 is a cross-sectional view of an assembly 236 subsequent to providing an insulating material 130 on the assembly 234 (FIG. 24). The insulating material 130 may take any of the forms discussed above. For example, the insulating material 130 may be a dielectric material, such as silicon oxide. The insulating material 130 may be provided on the assembly 234 using any suitable technique, such as spin coating, chemical vapor deposition (CVD), or plasma-enhanced CVD (PECVD). In some embodiments, the insulating material 130 may be polished back after deposition, and before further processing. In some embodiments, the thickness 131 of the insulating material 130 provided on the assembly 236 (as measured from the hardmask 118, as indicated in FIG. 25) may be between 50 nanometers and 1.2 microns (e.g., between 50 nanometers and 300 nanometers).

Figure 26:
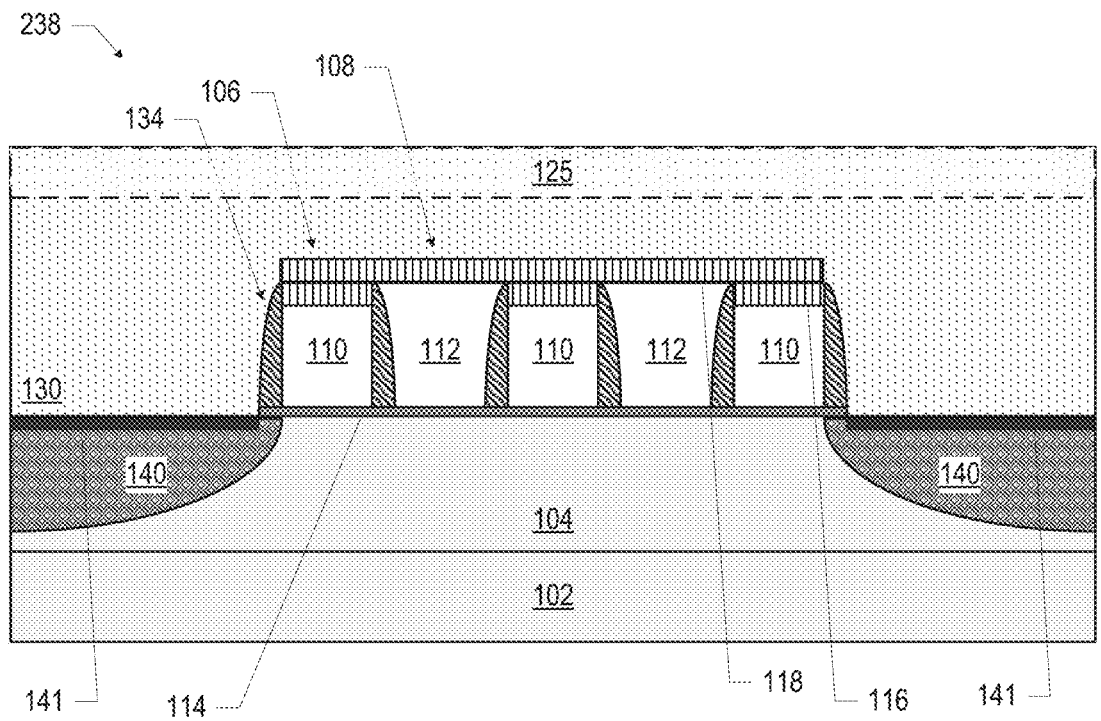

FIG. 26 is a cross-sectional view of an assembly 238 subsequent to forming a trench 125 in the insulating material 130 of the assembly 236 (FIG. 25). The trench 125 may be formed using any desired techniques (e.g., resist patterning followed by etching), and may have a depth and a width that may take the form of any of the embodiments of the thickness 169 and the width 171, respectively, discussed above with reference to the magnet line 121. In some embodiments, the assembly 236 may be planarized to remove the hardmasks 116 and 118, then additional insulating material 130 may be provided on the planarized surface before forming the trench 125; in such an embodiment, the hardmasks 116 and 118 would not be present in the quantum dot device 100.

Figure 27:
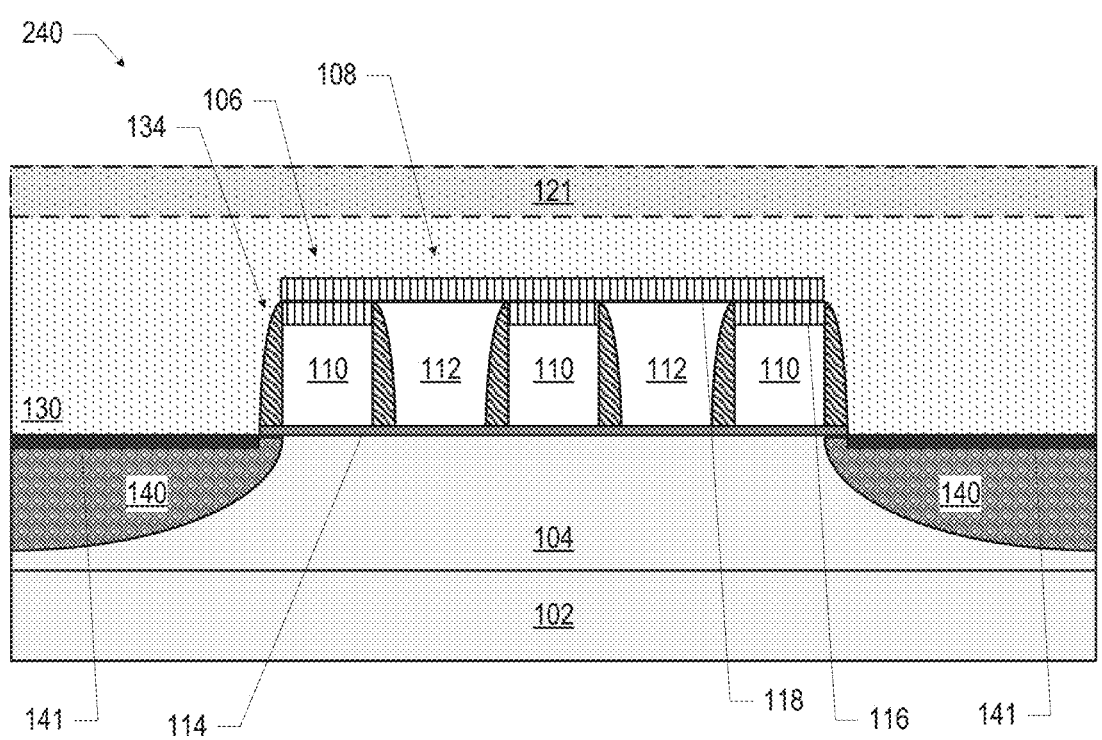

FIG. 27 is a cross-sectional view of an assembly 240 subsequent to filling the trench 125 of the assembly 238 (FIG. 26) with a conductive material to form the magnet line 121. The magnet line 121 may be formed using any desired techniques (e.g., plating followed by planarization, or a semi-additive process), and may take the form of any of the embodiments disclosed herein.

Figure 28:
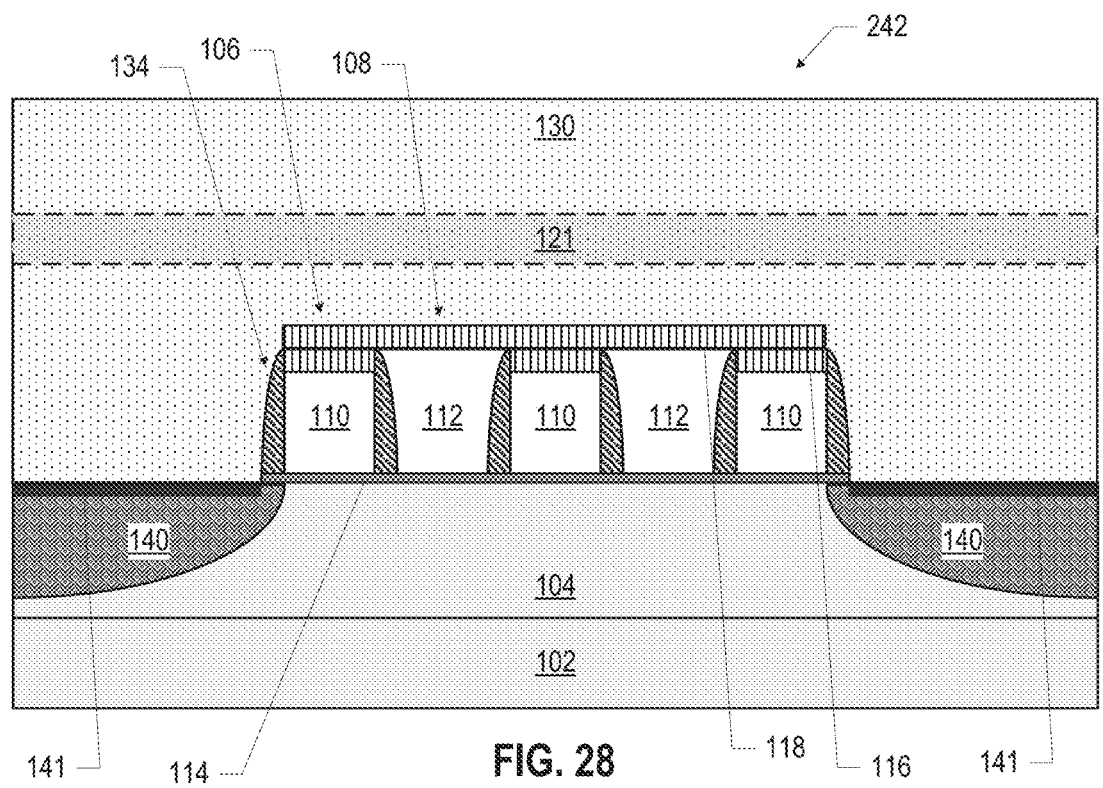

FIG. 28 is a cross-sectional view of an assembly 242 subsequent to providing additional insulating material 130 on the assembly 240 (FIG. 27). The insulating material 130 provided on the assembly 240 may take any of the forms of the insulating material 130 discussed above.

Figure 29:
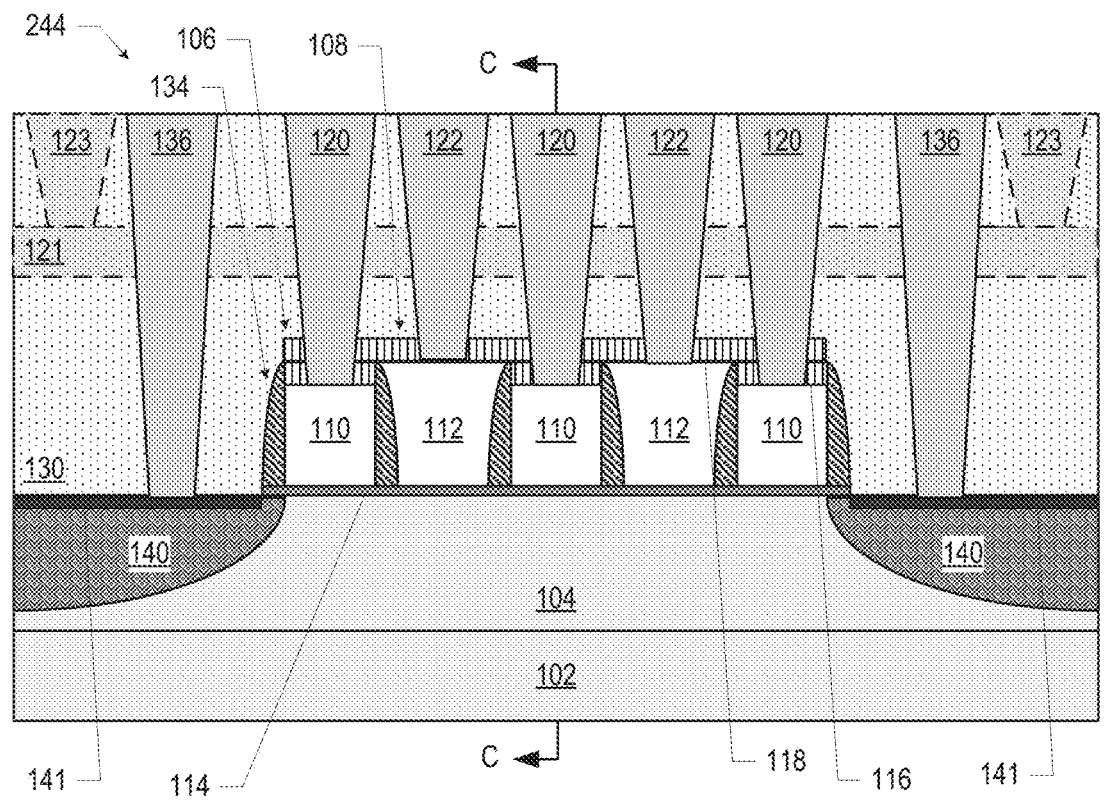

FIG. 29 is a cross-sectional view of an assembly 244 subsequent to forming, in the assembly 242 (FIG. 28), conductive vias 120 through the insulating material 130 (and the hardmasks 116 and 118) to contact the gate metal 110 of the gates 106, conductive vias 122 through the insulating material 130 (and the hardmask 118) to contact the gate metal 112 of the gates 108, conductive vias 136 through the insulating material 130 to contact the interface material 141 of the doped regions 140, and conductive vias 123 through the insulating material 130 to contact the magnet line 121. Further conductive vias and/or lines may be formed in the assembly 244 using conventional interconnect techniques, if desired. The resulting assembly 244 may take the form of the quantum dot device 100 discussed above with reference to FIGS. 3-4.

Figure 30:
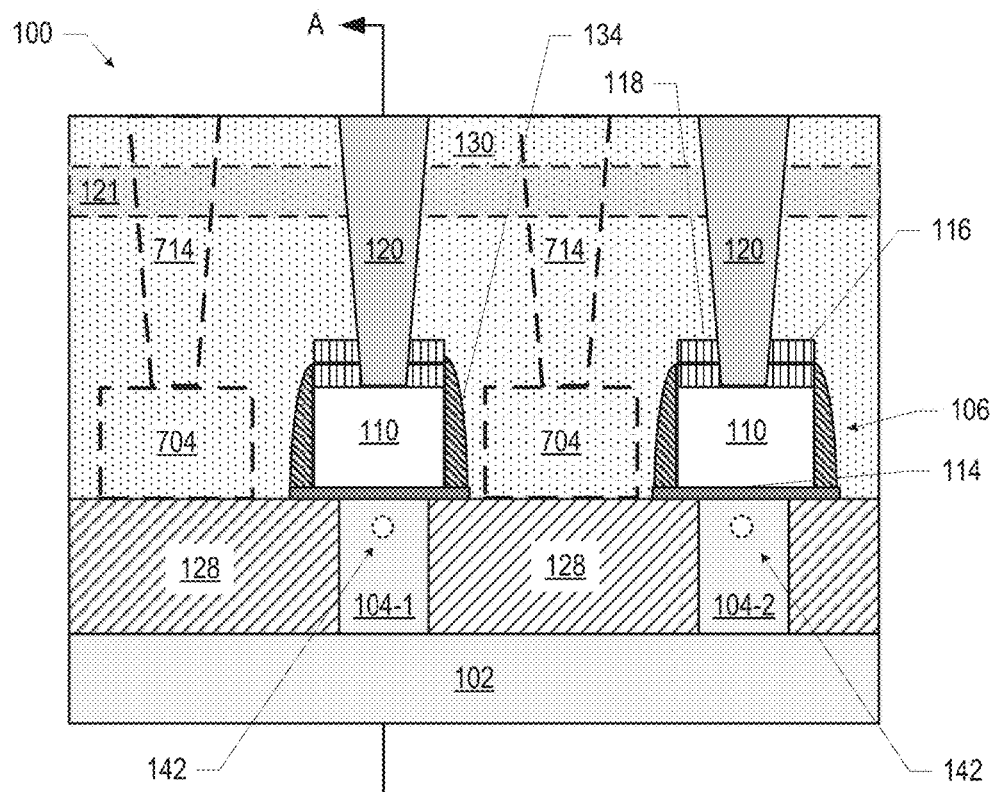
FIGS. 30-31 are cross-sectional views of another quantum dot device, in accordance with various embodiments.
Figure 31:
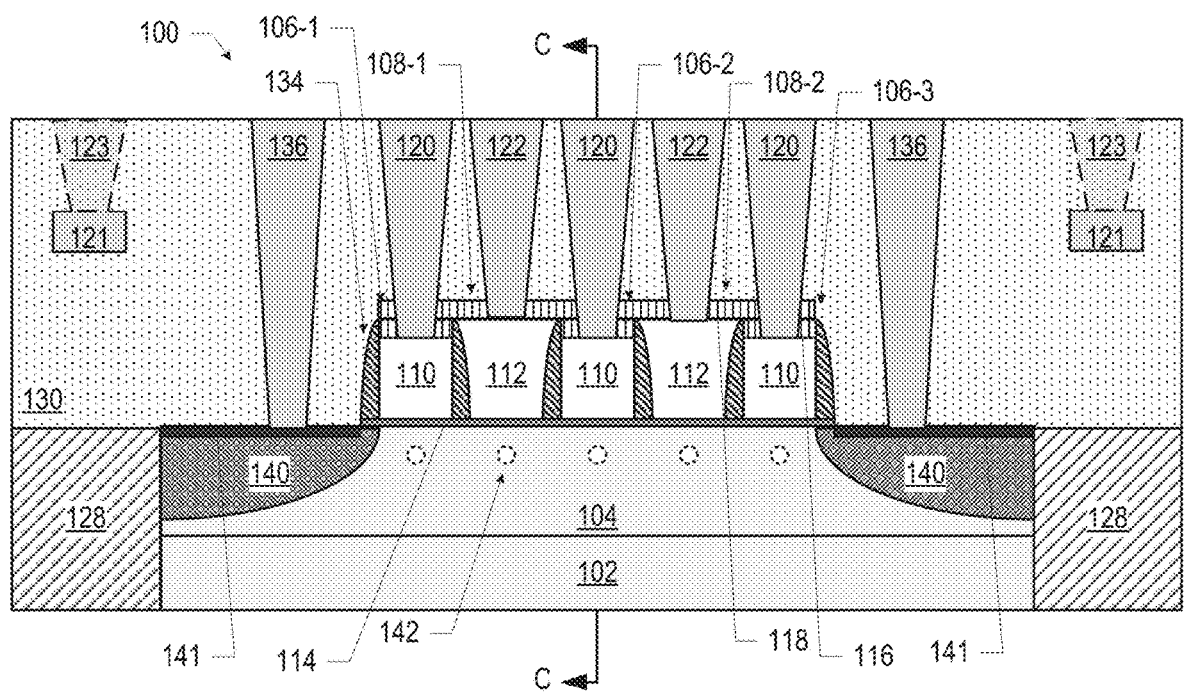

In the embodiment of the quantum dot device 100 illustrated in FIGS. 3-4, the magnet line 121 is oriented parallel to the longitudinal axes of the fins 104. In other embodiments, the magnet line 121 may not be oriented parallel to the longitudinal axes of the fins 104. For example, FIGS. 30-31 are various cross-sectional views of an embodiment of a quantum dot device 100 having multiple magnet lines 121, each proximate to the fins 104 and oriented perpendicular to the longitudinal axes of the fins 104. Other than orientation, the magnet lines 121 of the embodiment of FIGS. 30-31 may take the form of any of the embodiments of the magnet line 121 discussed above. The other elements of the quantum dot devices 100 of FIGS. 30-31 may take the form of any of those elements discussed herein. The manufacturing operations discussed above with reference to FIGS. 5-29 may be used to manufacture the quantum dot device 100 of FIGS. 30-31. The quantum dot devices 100 illustrated in FIGS. 30-31 may also include SETs 704 (not shown) arranged with the gates 106/108 in gate-detector clusters 706, as discussed herein.

Although a single magnet line 121 is illustrated in FIGS. 3-4, multiple magnet lines 121 may be included in that embodiment of the quantum dot device 100 (e.g., multiple magnet lines 121 parallel to the longitudinal axes of the fins 104). For example, the quantum dot device 100 of FIGS. 3-4 may include a second magnet line 121 proximate to the fin 104-2 in a symmetric manner to the magnet line 121 illustrated proximate to the fin 104-1. In some embodiments, multiple magnet lines 121 may be included in a quantum dot device 100, and these magnet lines 121 may or may not be parallel to one another. For example, in some embodiments, a quantum dot device 100 may include two (or more) magnet lines 121 that are oriented perpendicular to each other (e.g., one or more magnet lines 121 oriented like those illustrated in FIGS. 3-4, and one or more magnet lines 121 oriented like those illustrated in FIGS. 30-31).

Figure 32:
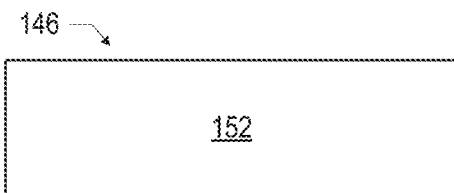
FIGS. 32-33 are cross-sectional views of various examples of quantum well stacks that may be used in a quantum dot device, in accordance with various embodiments.
Figure 33:
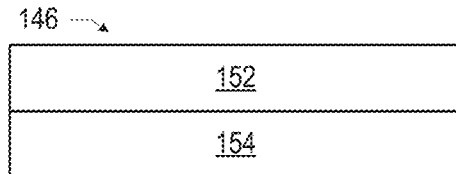

As discussed above, the base 102 and the fin 104 of a quantum dot device 100 may be formed from a substrate 144 and a quantum well stack 146 disposed on the substrate 144. The quantum well stack 146 may include a quantum well layer in which a 2DEG may form during operation of the quantum dot device 100. The quantum well stack 146 may take any of a number of forms, several of which are illustrated in FIGS. 32-33. The various layers in the quantum well stacks 146 discussed below may be grown on the substrate 144 (e.g., using epitaxial processes).

FIG. 32 is a cross-sectional view of a quantum well stack 146 including only a quantum well layer 152. The quantum well layer 152 may be disposed on the substrate 144 (e.g., as discussed above with reference to FIG. 6), and may be formed of a material such that, during operation of the quantum dot device 100, a 2DEG may form in the quantum well layer 152 proximate to the upper surface of the quantum well layer 152. The gate dielectric 114 of the gates 106/108 may be disposed on the upper surface of the quantum well layer 152 (e.g., as discussed above with reference to FIG. 12). The 2DEG may thus be close enough to a SET 704 for the SET 704 to detect the quantum state of quantum dots 142 arising from the 2DEG. In some embodiments, the quantum well layer 152 of FIG. 32 may be formed of intrinsic silicon, and the gate dielectric 114 may be formed of silicon oxide; in such an arrangement, during use of the quantum dot device 100, a 2DEG may form in the intrinsic silicon at the interface between the intrinsic silicon and the silicon oxide. Embodiments in which the quantum well layer 152 of FIG. 32 is formed of intrinsic silicon may be particularly advantageous for electron-type quantum dot devices 100. In some embodiments, the quantum well layer 152 of FIG. 32 may be formed of intrinsic germanium, and the gate dielectric 114 may be formed of germanium oxide; in such an arrangement, during use of the quantum dot device 100, a 2DEG may form in the intrinsic germanium at the interface between the intrinsic germanium and the germanium oxide. Such embodiments may be particularly advantageous for hole-type quantum dot devices 100. In some embodiments, the quantum well layer 152 may be strained, while in other embodiments, the quantum well layer 152 may not be strained. The thicknesses (i.e., z-heights) of the layers in the quantum well stack 146 of FIG. 32 may take any suitable values. For example, in some embodiments, the thickness of the quantum well layer 152 (e.g., intrinsic silicon or germanium) may be between 0.8 and 1.2 microns.

FIG. 33 is a cross-sectional view of a quantum well stack 146 including a quantum well layer 152 and a barrier layer 154. The quantum well stack 146 may be disposed on a substrate 144 (e.g., as discussed above with reference to FIG. 6) such that the barrier layer 154 is disposed between the quantum well layer 152 and the substrate 144. The barrier layer 154 may provide a potential barrier between the quantum well layer 152 and the substrate 144. As discussed above, the quantum well layer 152 of FIG. 33 may be formed of a material such that, during operation of the quantum dot device 100, a 2DEG may form in the quantum well layer 152 proximate to the upper surface of the quantum well layer 152. For example, in some embodiments in which the substrate 144 is formed of silicon, the quantum well layer 152 of FIG. 33 may be formed of silicon, and the barrier layer 154 may be formed of silicon germanium. The germanium content of this silicon germanium may be 20-80% (e.g., 30%). In some embodiments in which the quantum well layer 152 is formed of germanium, the barrier layer 154 may be formed of silicon germanium (with a germanium content of 20-80% (e.g., 70%)). The thicknesses (i.e., z-heights) of the layers in the quantum well stack 146 of FIG. 33 may take any suitable values. For example, in some embodiments, the thickness of the barrier layer 154 (e.g., silicon germanium) may be between 0 and 400 nanometers. In some embodiments, the thickness of the quantum well layer 152 (e.g., silicon or germanium) may be between 5 and 30 nanometers.

The substrate 144 and the quantum well stack 146 may be distributed between the base 102 and the fins 104 of the quantum dot device 100, as discussed above. This distribution may occur in any of a number of ways. For example, FIGS. 34-40 illustrate example base/fin arrangements 158 that may be used in a quantum dot device 100, in accordance with various embodiments.

Figure 34:
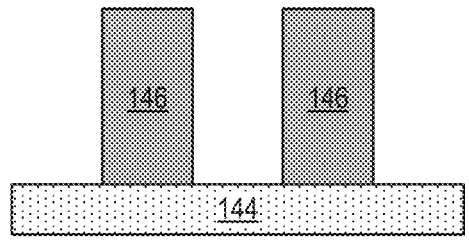
FIGS. 34-40 illustrate example base/fin arrangements that may be used in a quantum dot device, in accordance with various embodiments.

In the base/fin arrangement 158 of FIG. 34, the quantum well stack 146 may be included in the fins 104, but not in the base 102. The substrate 144 may be included in the base 102, but not in the fins 104. When the base/fin arrangement 158 of FIG. 34 is used in the manufacturing operations discussed with reference to FIGS. 6-7, the fin etching may etch through the quantum well stack 146, and stop when the substrate 144 is reached.

Figure 35:
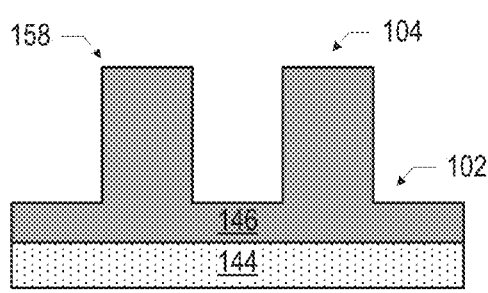
Figure 36:
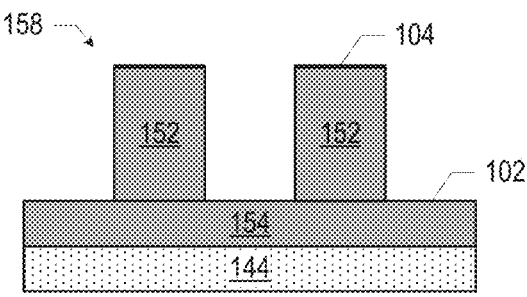

In the base/fin arrangement 158 of FIG. 35, the quantum well stack 146 may be included in the fins 104, as well as in a portion of the base 102. A substrate 144 may be included in the base 102 as well, but not in the fins 104. When the base/fin arrangement 158 of FIG. 35 is used in the manufacturing operations discussed with reference to FIGS. 6-7, the fin etching may etch partially through the quantum well stack 146, and stop before the substrate 144 is reached. FIG. 36 illustrates a particular embodiment of the base/fin arrangement 158 of FIG. 35. In the embodiment of FIG. 36, the quantum well stack 146 of FIG. 33 is used; the fins 104 include the quantum well layer 152, while the base 102 includes the barrier layer 154 and the substrate 144.

Figure 37:
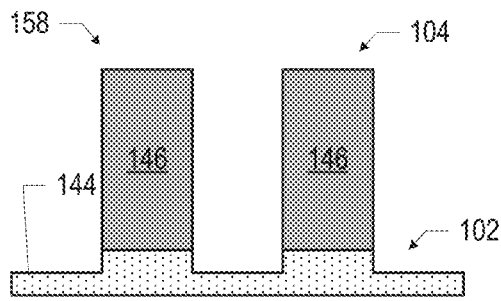
Figure 38:
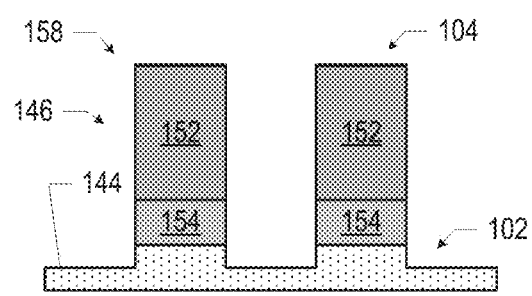

In the base/fin arrangement 158 of FIG. 37, the quantum well stack 146 may be included in the fins 104, but not the base 102. The substrate 144 may be partially included in the fins 104, as well as in the base 102. When the base/fin arrangement 158 of FIG. 37 is used in the manufacturing operations discussed with reference to FIGS. 6-7, the fin etching may etch through the quantum well stack 146 and into the substrate 144 before stopping. FIG. 38 illustrates a particular embodiment of the base/fin arrangement 158 of FIG. 37. In the embodiment of FIG. 38, the quantum well stack 146 of FIG. 33 is used; the fins 104 include the quantum well stack 146 and a portion of the substrate 144, while the base 102 includes the remainder of the substrate 144.

Figure 39:
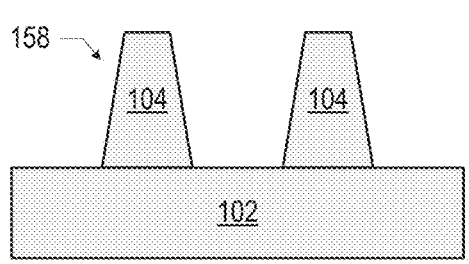
Figure 40:
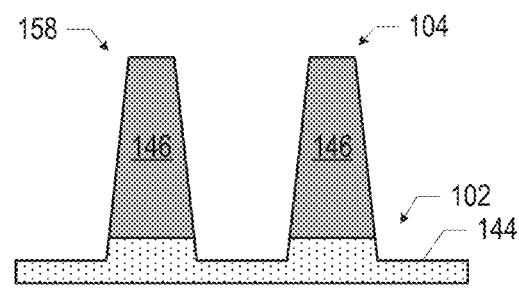

Although the fins 104 have been illustrated in many of the preceding figures as substantially rectangular with parallel sidewalls, this is simply for ease of illustration, and the fins 104 may have any suitable shape (e.g., shape appropriate to the manufacturing processes used to form the fins 104). For example, as illustrated in the base/fin arrangement 158 of FIG. 39, in some embodiments, the fins 104 may be tapered. In some embodiments, the fins 104 may taper by 3-10 nanometers in x-width for every 100 nanometers in z-height (e.g., 5 nanometers in x-width for every 100 nanometers in z-height). When the fins 104 are tapered, the wider end of the fins 104 may be the end closest to the base 102, as illustrated in FIG. 39. FIG. 40 illustrates a particular embodiment of the base/fin arrangement 158 of FIG. 37. In FIG. 40, the quantum well stack 146 is included in the tapered fins 104 while a portion of the substrate 144 is included in the tapered fins and a portion of the substrate 144 provides the base 102.

Figure 41:
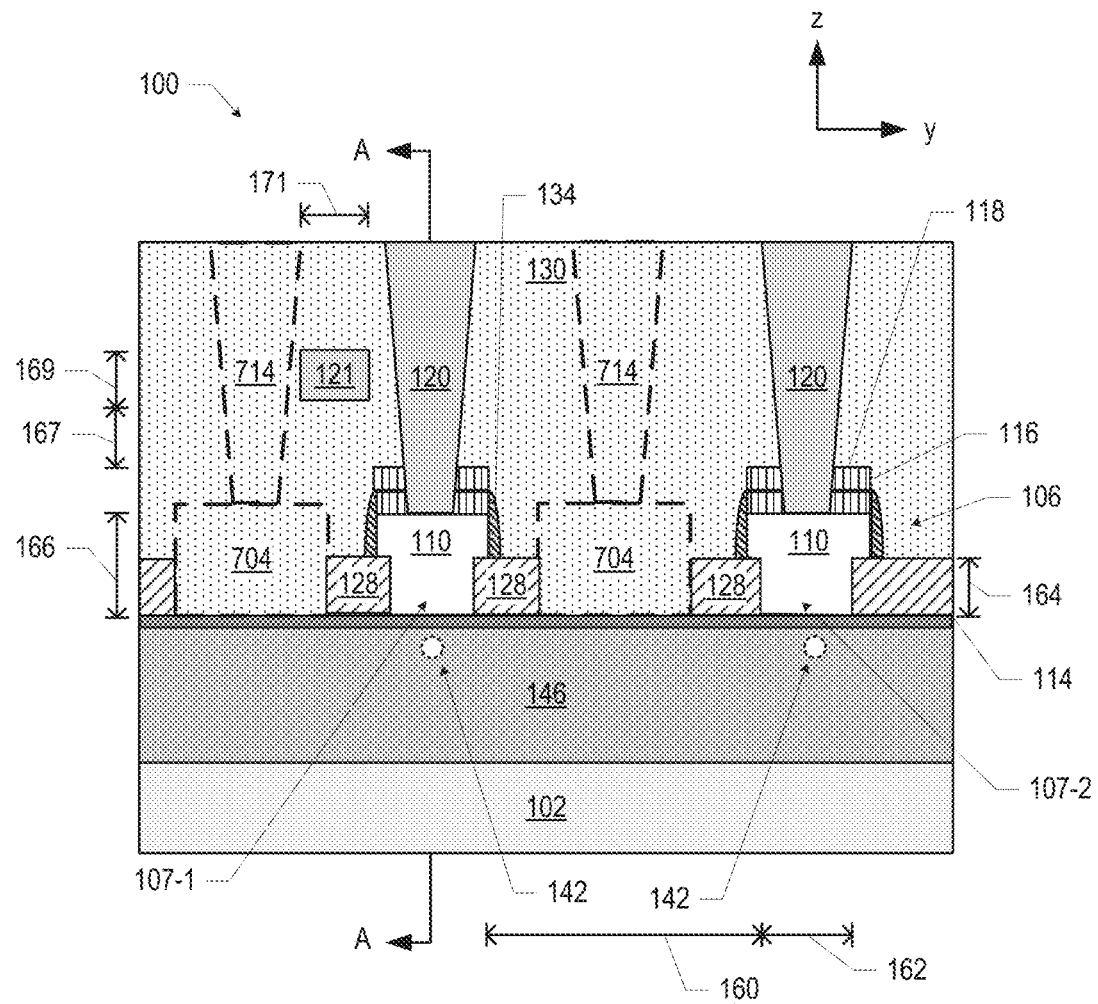
FIGS. 41-43 are cross-sectional views of a quantum dot device, in accordance with various embodiments.
Figure 42:
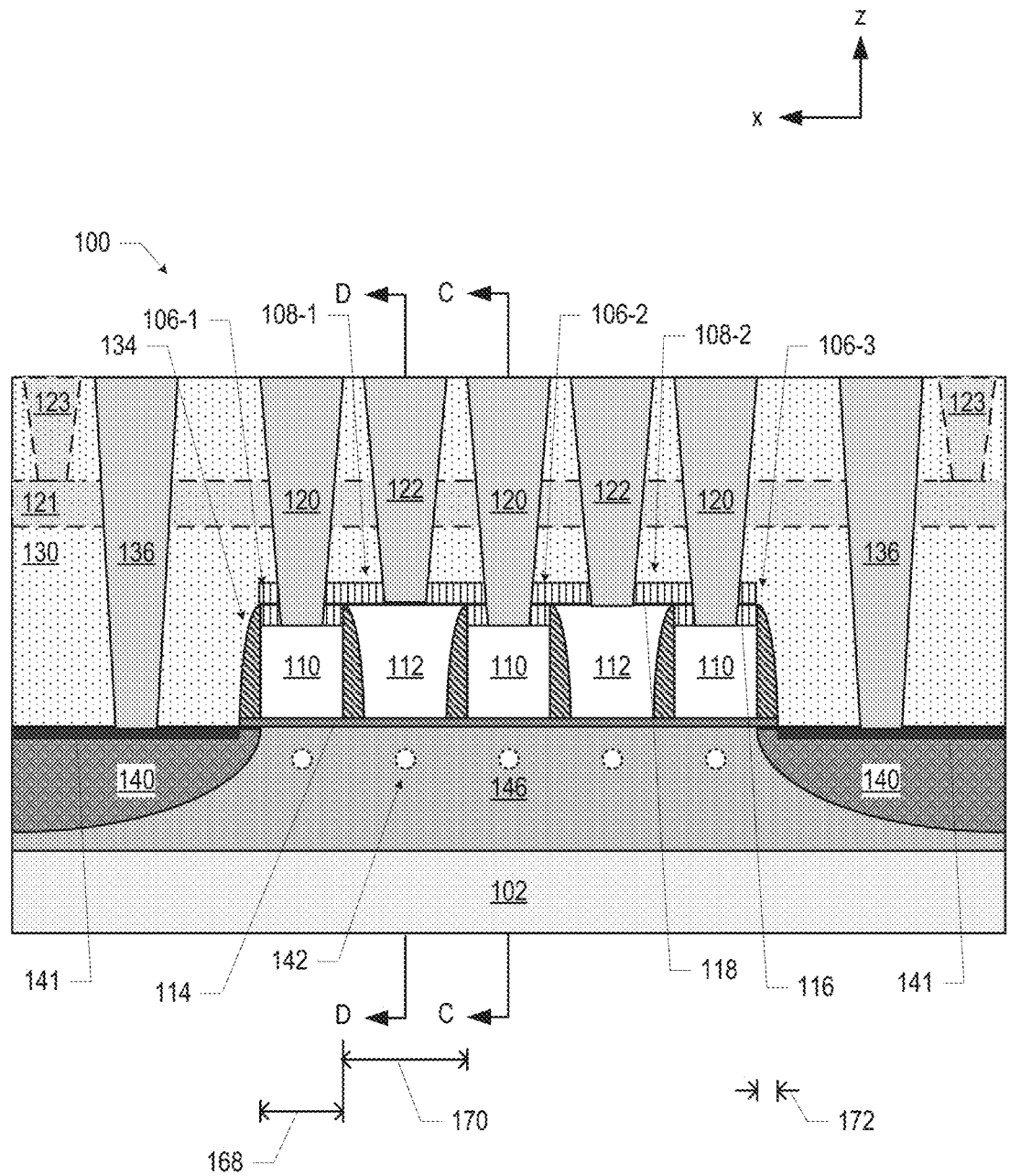
Figure 43:
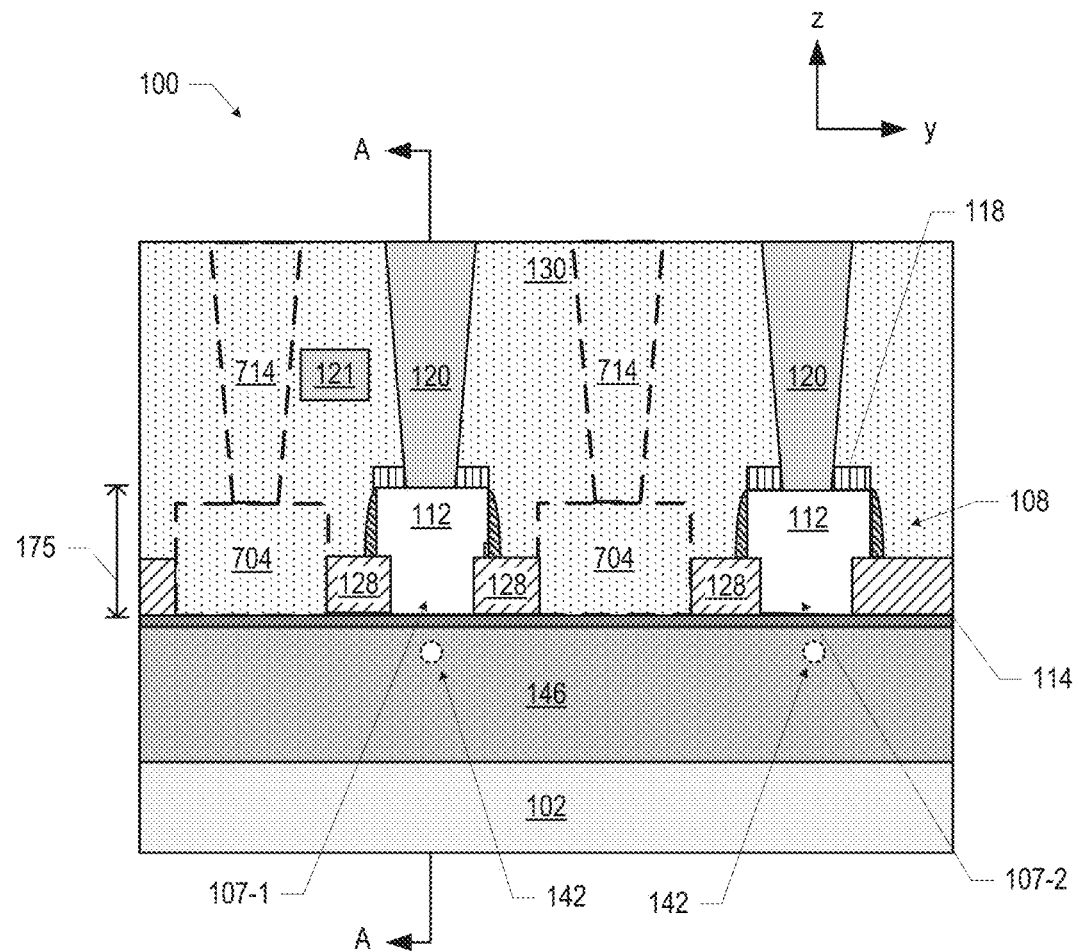

FIGS. 41-43 are cross-sectional views of another embodiment of a quantum dot device 100, in accordance with various embodiments. In particular, FIG. 42 illustrates the quantum dot device 100 taken along the section A-A of FIG. 41 (while FIG. 41 illustrates the quantum dot device 100 taken along the section C-C of FIG. 42), and FIG. 43 illustrates the quantum dot device 100 taken along the section D-D of FIG. 42 (while FIG. 42 illustrates the quantum dot device 100 taken along the section A-A of FIG. 43). Although FIG. 41 indicates that the cross section illustrated in FIG. 42 is taken through the trench 107-1, an analogous cross section taken through the trench 107-2 may be identical, and thus the discussion of FIG. 42 refers generally to the "trench 107." The cross-sectional views of FIGS. 41 and 43 may be a similar perspective as the cross-sectional view of FIG. 1.

The quantum dot device 100 may include a quantum well stack 146 disposed on a base 102. An insulating material 128 may be disposed above the quantum well stack 146, and multiple trenches 107 in the insulating material 128 may extend toward the quantum well stack 146. In the embodiment illustrated in FIGS. 41-43, a gate dielectric 114 may be disposed between the quantum well stack 146 and the insulating material 128 so as to provide the "bottom" of the trenches 107. The quantum well stack 146 of the quantum dot device 100 of FIGS. 41-43 may take the form of any of the quantum well stacks disclosed herein (e.g., as discussed above with reference to FIGS. 32-33). The various layers in the quantum well stack 146 of FIGS. 41-43 may be grown on the base 102 (e.g., using epitaxial processes). In the embodiment of FIGS. 41-43, the quantum well stack 146 may provide a quantum dot formation region 710, as discussed above with reference to FIGS. 1 and 2.

Although only two trenches, 107-1 and 107-2, are shown in FIGS. 41-43, this is simply for ease of illustration, and more than two trenches 107 may be included in the quantum dot device 100 (e.g., in a line, a rectangular array, or any other desired arrangement). As illustrated in FIGS. 41 and 43, in some embodiments, multiple trenches 107 may be oriented in parallel.

As discussed above with reference to FIGS. 3-4, in the quantum dot device 100 of FIGS. 41-43, a quantum well layer itself may provide a geometric constraint on the z-location of quantum dots in the quantum well stack 146. To control the x- and y-location of quantum dots in the quantum well stack 146, voltages may be applied to gates disposed at least partially in the trenches 107 above the quantum well stack 146 to adjust the energy profile along the trenches 107 in the x- and y-direction and thereby constrain the x- and y-location of quantum dots within quantum wells (discussed in detail below with reference to the gates 106/108). The dimensions of the trenches 107 may take any suitable values. For example, in some embodiments, the trenches 107 may each have a width 162 between 10 and 30 nanometers. In some embodiments, the trenches 107 may each have a depth 164 between 200 and 400 nanometers (e.g., between 250 and 350 nanometers, or equal to 300 nanometers). The insulating material 128 may be a dielectric material (e.g., an interlayer dielectric), such as silicon oxide. In some embodiments, the insulating material 128 may be a chemical vapor deposition (CVD) or flowable CVD oxide. In some embodiments, the trenches 107 may be spaced apart by a distance 160 between 50 and 500 nanometers.

Multiple gates may be disposed at least partially in each of the trenches 107. In the embodiment illustrated in FIG. 42, three gates 106 and two gates 108 are shown as distributed at least partially in a single trench 107. This particular number of gates is simply illustrative, and any suitable number of gates may be used. Additionally, as discussed below with reference to FIG. 66, multiple groups of gates (like the gates illustrated in FIG. 42) may be disposed at least partially in the trench 107. As discussed above with reference to FIGS. 3 and 4, the gates 106 and 108 of the embodiment of FIGS. 41-43 may provide the gates 708 (as discussed above with reference to FIGS. 1 and 2), and the gates 106 and 108 disposed at least partially in a common trench 107 may provide a gate group 718 (as discussed above with reference to FIGS. 1 and 2). Example locations for SETs 704 (and an example representation of the conductive pathways 714 to these SETS 704) are depicted with dashed lines in FIGS. 41 and 43.

As shown in FIG. 42, the gate 108-1 may be disposed between the gates 106-1 and 106-2, and the gate 108-2 may be disposed between the gates 106-2 and 106-3. Each of the gates 106/108 may include a gate dielectric 114; in the embodiment illustrated in FIG. 42, the gate dielectric 114 for all of the gates 106/108 is provided by a common layer of gate dielectric material disposed between the quantum well stack 146 and the insulating material 128. In other embodiments, the gate dielectric 114 for each of the gates 106/108 may be provided by separate portions of gate dielectric 114. In some embodiments, the gate dielectric 114 may be a multilayer gate dielectric (e.g., with multiple materials used to improve the interface between the trench 107 and the corresponding gate metal). The gate dielectric 114 may be, for example, silicon oxide, aluminum oxide, or a high-k dielectric, such as hafnium oxide. More generally, the gate dielectric 114 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 114 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 114 to improve the quality of the gate dielectric 114.

Each of the gates 106 may include a gate metal 110 and a hardmask 116. The hardmask 116 may be formed of silicon nitride, silicon carbide, or another suitable material. The gate metal 110 may be disposed between the hardmask 116 and the gate dielectric 114, and the gate dielectric 114 may be disposed between the gate metal 110 and the quantum well stack 146. As shown in FIG. 41, in some embodiments, the gate metal 110 of a gate 106 may extend over the insulating material 128 and into a trench 107 in the insulating material 128. Only one portion of the hardmask 116 is labeled in FIG. 42 for ease of illustration. In some embodiments, the gate metal 110 may be a superconductor, such as aluminum, titanium nitride (e.g., deposited via atomic layer deposition), or niobium titanium nitride. In some embodiments, the hardmask 116 may not be present in the quantum dot device 100 (e.g., a hardmask like the hardmask 116 may be removed during processing, as discussed below). The sides of the gate metal 110 may be substantially parallel, as shown in FIG. 42, and insulating spacers 134 may be disposed on the sides of the gate metal 110 and the hardmask 116 along the longitudinal axis of the trench 107. As illustrated in FIG. 42, the spacers 134 may be thicker closer to the quantum well stack 146 and thinner farther away from the quantum well stack 146. In some embodiments, the spacers 134 may have a convex shape. The spacers 134 may be formed of any suitable material, such as a carbon-doped oxide, silicon nitride, silicon oxide, or other carbides or nitrides (e.g., silicon carbide, silicon nitride doped with carbon, and silicon oxynitride). The gate metal 110 may be any suitable metal, such as titanium nitride. As illustrated in FIG. 42, no spacer material may be disposed between the gate metal 110 and the sidewalls of the trench 107 in the y-direction.

Each of the gates 108 may include a gate metal 112 and a hardmask 118. The hardmask 118 may be formed of silicon nitride, silicon carbide, or another suitable material. The gate metal 112 may be disposed between the hardmask 118 and the gate dielectric 114, and the gate dielectric 114 may be disposed between the gate metal 112 and the quantum well stack 146. As shown in FIG. 43, in some embodiments, the gate metal 112 of a gate 108 may extend over the insulating material 128 and into a trench 107 in the insulating material 128. In the embodiment illustrated in FIG. 42, the hardmask 118 may extend over the hardmask 116 (and over the gate metal 110 of the gates 106), while in other embodiments, the hardmask 118 may not extend over the gate metal 110. In some embodiments, the gate metal 112 may be a different metal from the gate metal 110; in other embodiments, the gate metal 112 and the gate metal 110 may have the same material composition. In some embodiments, the gate metal 112 may be a superconductor, such as aluminum, titanium nitride (e.g., deposited via atomic layer deposition), or niobium titanium nitride. In some embodiments, the hardmask 118 may not be present in the quantum dot device 100 (e.g., a hardmask like the hardmask 118 may be removed during processing, as discussed below).

The gate 108-1 may extend between the proximate spacers 134 on the sides of the gate 106-1 and the gate 106-2 along the longitudinal axis of the trench 107, as shown in FIG. 42. In some embodiments, the gate metal 112 of the gate 108-1 may extend between the spacers 134 on the sides of the gate 106-1 and the gate 106-2 along the longitudinal axis of the trench 107. Thus, the gate metal 112 of the gate 108-1 may have a shape that is substantially complementary to the shape of the spacers 134, as shown. Similarly, the gate 108-2 may extend between the proximate spacers 134 on the sides of the gate 106-2 and the gate 106-3 along the longitudinal axis of the trench 107. In some embodiments in which the gate dielectric 114 is not a layer shared commonly between the gates 108 and 106, but instead is separately deposited in the trench 107 between the spacers 134, the gate dielectric 114 may extend at least partially up the sides of the spacers 134 (and up the proximate sidewalls of the trench 107), and the gate metal 112 may extend between the portions of gate dielectric 114 on the spacers 134 (and the proximate sidewalls of the trench 107). The gate metal 112, like the gate metal 110, may be any suitable metal, such as titanium nitride. As illustrated in FIG. 43, in some embodiments, no spacer material may be disposed between the gate metal 112 and the sidewalls of the trench 107 in the y-direction; in other embodiments, spacers 134 may also be disposed between the gate metal 112 and the sidewalls of the trench 107 in the y-direction.

The dimensions of the gates 106/108 may take any suitable values. For example, in some embodiments, the z-height 166 of the gate metal 110 in the trench 107 may be between 225 and 375 nanometers (e.g., approximately 300 nanometers); the z-height 175 of the gate metal 112 may be in the same range. This z-height 166 of the gate metal 110 in the trench 107 may represent the sum of the z-height of the insulating material 128 (e.g., between 200 and 300 nanometers) and the thickness of the gate metal 110 on top of the insulating material 128 (e.g., between 25 and 75 nanometers, or approximately 50 nanometers). In embodiments like the ones illustrated in FIGS. 41-43, the z-height 175 of the gate metal 112 may be greater than the z-height 166 of the gate metal 110. In some embodiments, the length 168 of the gate metal 110 (i.e., in the x-direction) may be between 20 and 40 nanometers (e.g., 30 nanometers). Although all of the gates 106 are illustrated in the accompanying drawings as having the same length 168 of the gate metal 110, in some embodiments, the "outermost" gates 106 (e.g., the gates 106-1 and 106-3 of the embodiment illustrated in FIG. 42) may have a greater length 168 than the "inner" gates 106 (e.g., the gate 106-2 in the embodiment illustrated in FIG. 42). Such longer "outside" gates 106 may provide spatial separation between the doped regions 140 and the areas under the gates 108 and the inner gates 106 in which quantum dots 142 may form, and thus may reduce the perturbations to the potential energy landscape under the gates 108 and the inner gates 106 caused by the doped regions 140.

In some embodiments, the distance 170 between adjacent ones of the gates 106 (e.g., as measured from the gate metal 110 of one gate 106 to the gate metal 110 of an adjacent gate 106 in the x-direction, as illustrated in FIG. 42) may be between 40 and 100 nanometers (e.g., 50 nanometers). In some embodiments, the thickness 172 of the spacers 134 may be between 1 and 10 nanometers (e.g., between 3 and 5 nanometers, between 4 and 6 nanometers, or between 4 and 7 nanometers). The length of the gate metal 112 (i.e., in the x-direction) may depend on the dimensions of the gates 106 and the spacers 134, as illustrated in FIG. 42. As indicated in FIGS. 41 and 43, the gates 106/108 in one trench 107 may extend over the insulating material 128 between that trench 107 and an adjacent trench 107, but may be isolated from their counterpart gates by the intervening insulating material 130 and spacers 134.

As shown in FIG. 42, the gates 106 and 108 may be alternatingly arranged in the x-direction. During operation of the quantum dot device 100, voltages may be applied to the gates 106/108 to adjust the potential energy in the quantum well stack 146 to create quantum wells of varying depths in which quantum dots 142 may form, as discussed above with reference to the quantum dot device 100 of FIGS. 3-4. Only one quantum dot 142 is labeled with a reference numeral in FIG. 42 for ease of illustration, but five are indicated as dotted circles below each trench 107.

The quantum well stack 146 of the quantum dot device 100 of FIGS. 41-43 may include doped regions 140 that may serve as a reservoir of charge carriers for the quantum dot device 100, in accordance with any of the embodiments discussed above. The quantum dot devices 100 discussed with reference to FIGS. 41-43 may be used to form electron-type or hole-type quantum dots 142, as discussed above with reference to FIGS. 3-4.

Conductive vias and lines may make contact with the gates 106/108 of the quantum dot device 100 of FIGS. 41-43, and to the doped regions 140, to enable electrical connection to the gates 106/108 and the doped regions 140 to be made in desired locations. As shown in FIGS. 41-43, the gates 106 may extend both "vertically" and "horizontally" away from the quantum well stack 146, and conductive vias 120 may contact the gates 106 (and are drawn in dashed lines in FIG. 42 to indicate their location behind the plane of the drawing). The conductive vias 120 may extend through the hardmask 116 and the hardmask 118 to contact the gate metal 110 of the gates 106. The gates 108 may similarly extend away from the quantum well stack 146, and conductive vias 122 may contact the gates 108 (also drawn in dashed lines in FIG. 42 to indicate their location behind the plane of the drawing). The conductive vias 122 may extend through the hardmask 118 to contact the gate metal 112 of the gates 108. Conductive vias 136 may contact the interface material 141 and may thereby make electrical contact with the doped regions 140. The quantum dot device 100 of FIGS. 41-43 may include further conductive vias and/or lines (not shown) to make electrical contact to the gates 106/108 and/or the doped regions 140, as desired. The conductive vias and lines included in a quantum dot device 100 may include any suitable materials, such as copper, tungsten (deposited, e.g., by CVD), or a superconductor (e.g., aluminum, tin, titanium nitride, niobium titanium nitride, tantalum, niobium, or other niobium compounds such as niobium tin and niobium germanium).

In some embodiments, the quantum dot device 100 of FIGS. 41-43 may include one or more magnet lines 121. For example, a single magnet line 121 is illustrated in FIGS. 41-43, proximate to the trench 107-1. The magnet line(s) 121 of the quantum dot device of FIGS. 41-43 may take the form of any of the embodiments of the magnet lines 121 discussed herein. For example, the magnet line 121 may be formed of a conductive material, and may be used to conduct current pulses that generate magnetic fields to influence the spin states of one or more of the quantum dots 142 that may form in the quantum well stack 146. In some embodiments, the magnet line 121 may conduct a pulse to reset (or "scramble") nuclear and/or quantum dot spins. In some embodiments, the magnet line 121 may conduct a pulse to initialize an electron in a quantum dot in a particular spin state. In some embodiments, the magnet line 121 may conduct current to provide a continuous, oscillating magnetic field to which the spin of a qubit may couple. The magnet line 121 may provide any suitable combination of these embodiments, or any other appropriate functionality.

In some embodiments, the magnet line 121 of FIGS. 41-43 may be formed of copper. In some embodiments, the magnet line 121 may be formed of a superconductor, such as aluminum. The magnet line 121 illustrated in FIGS. 41-43 is non-coplanar with the trenches 107, and is also non-coplanar with the gates 106/108. In some embodiments, the magnet line 121 may be spaced apart from the gates 106/108 by a distance 167. The distance 167 may take any suitable value (e.g., based on the desired strength of magnetic field interaction with particular quantum dots 142); in some embodiments, the distance 167 may be between 25 nanometers and 1 micron (e.g., between 50 nanometers and 200 nanometers).

In some embodiments, the magnet line 121 of FIGS. 41-43 may be formed of a magnetic material. For example, a magnetic material (such as cobalt) may be deposited in a trench in the insulating material 130 to provide a permanent magnetic field in the quantum dot device 100.

The magnet line 121 of FIGS. 41-43 may have any suitable dimensions. For example, the magnet line 121 may have a thickness 169 between 25 and 100 nanometers. The magnet line 121 may have a width 171 between 25 and 100 nanometers. In some embodiments, the width 171 and thickness 169 of a magnet line 121 may be equal to the width and thickness, respectively, of other conductive lines in the quantum dot device 100 (not shown) used to provide electrical interconnects, as known in the art. The magnet line 121 may have a length 173 that may depend on the number and dimensions of the gates 106/108 that are to form quantum dots 142 with which the magnet line 121 is to interact. The magnet line 121 illustrated in FIGS. 41-43 are substantially linear, but this need not be the case; the magnet lines 121 disclosed herein may take any suitable shape. Conductive vias 123 may contact the magnet line 121.

The conductive vias 120, 122, 136, and 123 may be electrically isolated from each other by an insulating material 130, all of which may take any of the forms discussed above with reference to FIGS. 3-4. The particular arrangement of conductive vias shown in FIGS. 41-43 is simply illustrative, and any electrical routing arrangement may be implemented.

As discussed above, the structure of the trench 107-1 may be the same as the structure of the trench 107-2; similarly, the construction of gates 106/108 in and around the trench 107-1 may be the same as the construction of gates 106/108 in and around the trench 107-2. The gates 106/108 associated with the trench 107-1 may be mirrored by corresponding gates 106/108 associated with the parallel trench 107-2, and the insulating material 130 may separate the gates 106/108 associated with the different trenches 107-1 and 107-2.

The quantum dot devices 100 disclosed herein may be manufactured using any suitable techniques. In some embodiments, the manufacture of the quantum dot device 100 of FIGS. 41-43 may begin as described above with reference to FIGS. 5-6; however, instead of forming fins 104 in the quantum well stack 146 of the assembly 202, manufacturing may proceed as illustrated in FIGS. 44-65 (and described below). Although the particular manufacturing operations discussed below with reference to FIGS. 44-65 are illustrated as manufacturing a particular embodiment of the quantum dot device 100, these operations may be applied to manufacture many different embodiments of the quantum dot device 100, as discussed herein. Any of the elements discussed below with reference to FIGS. 44-65 may take the form of any of the embodiments of those elements discussed above (or otherwise disclosed herein). The fabrication of the SETs 704 illustrated in FIGS. 41 and 43 is not discussed with reference to FIGS. 44-65, but SET fabrication techniques are discussed below with reference to a number of different embodiments of SETs. These SET fabrication techniques may be integrated with the operations discussed below with reference to FIGS. 44-65 in any suitable manner.

Figure 44:
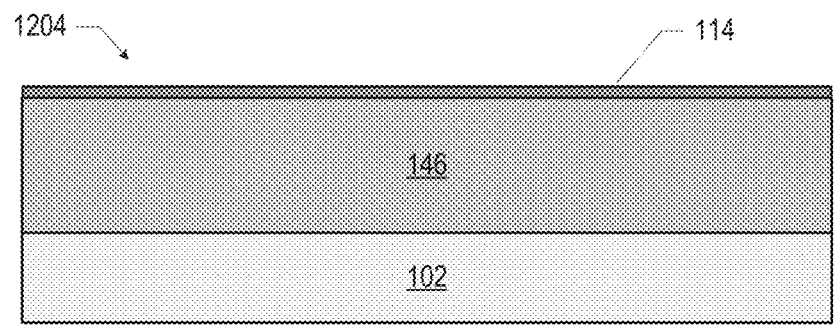
FIGS. 44-65 illustrate various example stages in the manufacture of a quantum dot device, in accordance with various embodiments.

FIG. 44 is a cross-sectional view of an assembly 1204 subsequent to providing a layer of gate dielectric 114 on the quantum well stack 146 of the assembly 202 (FIG. 6). In some embodiments, the gate dielectric 114 may be provided by atomic layer deposition (ALD), or any other suitable technique.

Figure 45:
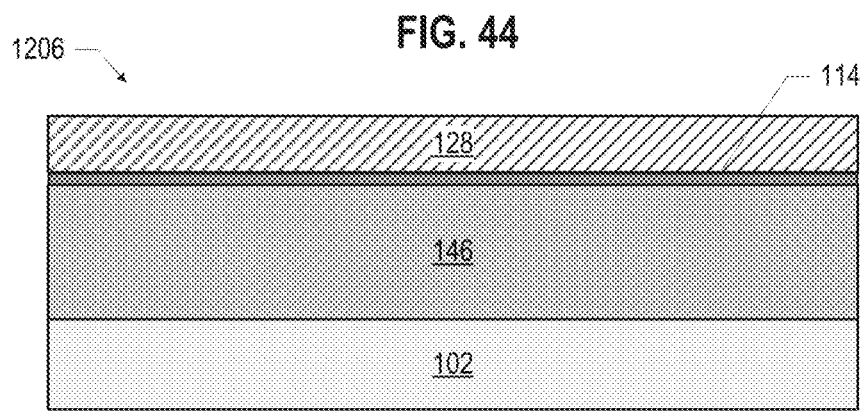

FIG. 45 is a cross-sectional view of an assembly 1206 subsequent to providing an insulating material 128 on the assembly 1204 (FIG. 44). Any suitable material may be used as the insulating material 128 to electrically insulate the trenches 107 from each other, as discussed above. As noted above, in some embodiments, the insulating material 128 may be a dielectric material, such as silicon oxide. In some embodiments, the gate dielectric 114 may not be provided on the quantum well stack 146 before the deposition of the insulating material 128; instead, the insulating material 128 may be provided directly on the quantum well stack 146, and the gate dielectric 114 may be provided in trenches 107 of the insulating material 128 after the trenches 107 are formed (as discussed below with reference to FIG. 46 and FIGS. 54-59).

Figure 46:
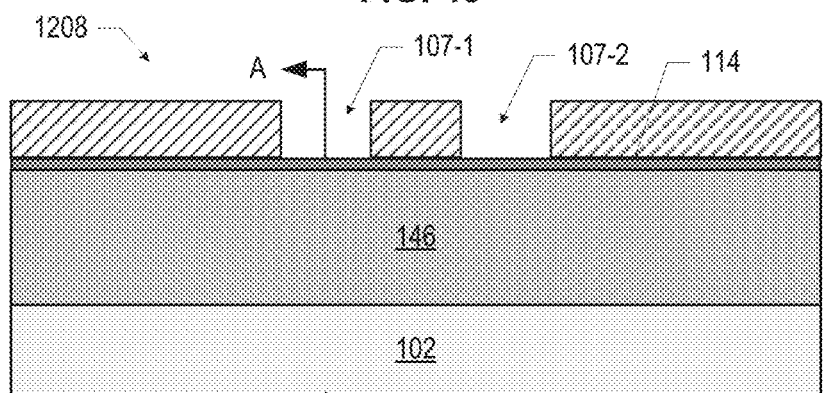
Figure 47:
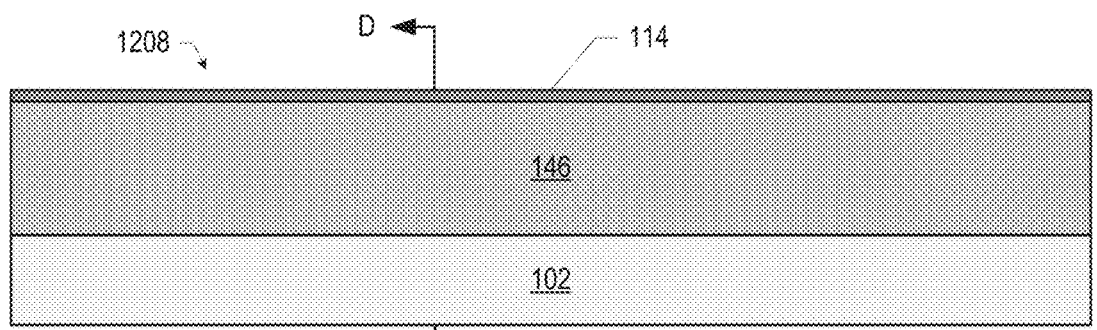

FIG. 46 is a cross-sectional view of an assembly 1208 subsequent to forming trenches 107 in the insulating material 128 of the assembly 1206 (FIG. 45). The trenches 107 may extend down to the gate dielectric 114, and may be formed in the assembly 1206 by patterning and then etching the assembly 1206 using any suitable conventional lithographic process known in the art. For example, a hardmask may be provided on the insulating material 128, and a photoresist may be provided on the hardmask; the photoresist may be patterned to identify the areas in which the trenches 107 are to be formed, the hardmask may be etched in accordance with the patterned photoresist, and the insulating material 128 may be etched in accordance with the etched hardmask (after which the remaining hardmask and photoresist may be removed). In some embodiments, a combination of dry and wet etch chemistry may be used to form the trenches 107 in the insulating material 128, and the appropriate chemistry may depend on the materials included in the assembly 1208, as known in the art. Although the trenches 107 illustrated in FIG. 46 (and other accompanying drawings) are shown as having substantially parallel sidewalls, in some embodiments, the trenches 107 may be tapered, narrowing towards the quantum well stack 146. FIG. 47 is a view of the assembly 1208 taken along the section A-A of FIG. 46, through a trench 107 (while FIG. 46 illustrates the assembly 1208 taken along the section D-D of FIG. 47). FIGS. 48-51 maintain the perspective of FIG. 47.

As noted above, in some embodiments, the gate dielectric 114 may be provided in the trenches 107 (instead of before the insulating material 128 is initially deposited, as discussed above with reference to FIG. 44). For example, the gate dielectric 114 may be provided in the trenches 107 in the manner discussed below with reference to FIG. 78 (e.g., using ALD). In such embodiments, the gate dielectric 114 may be disposed at the bottom of the trenches 107, and extend up onto the sidewalls of the trenches 107.

Figure 48:
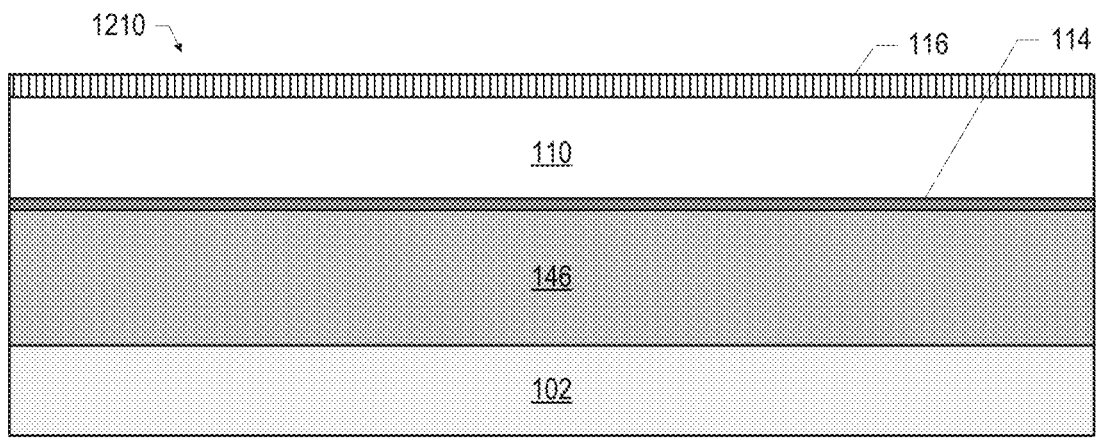

FIG. 48 is a cross-sectional view of an assembly 1210 subsequent to providing a gate metal 110 and a hardmask 116 on the assembly 1208 (FIGS. 46-47). The hardmask 116 may be formed of an electrically insulating material, such as silicon nitride or carbon-doped nitride. The gate metal 110 of the assembly 1210 may fill the trenches 107 and extend over the insulating material 128.

Figure 49:
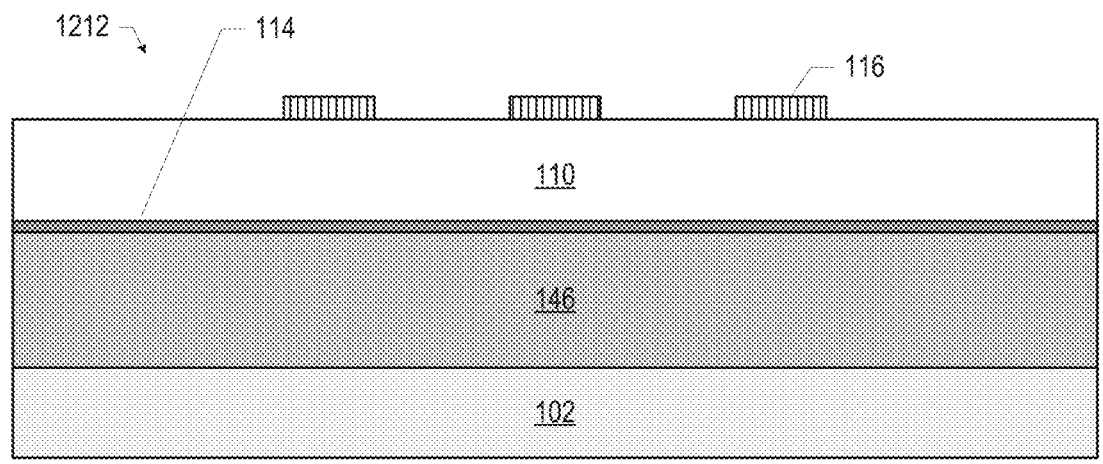

FIG. 49 is a cross-sectional view of an assembly 1212 subsequent to patterning the hardmask 116 of the assembly 1210 (FIG. 48). The pattern applied to the hardmask 116 may correspond to the locations for the gates 106, as discussed below. The hardmask 116 may be patterned by applying a resist, patterning the resist using lithography, and then etching the hardmask (using dry etching or any appropriate technique).

Figure 50:
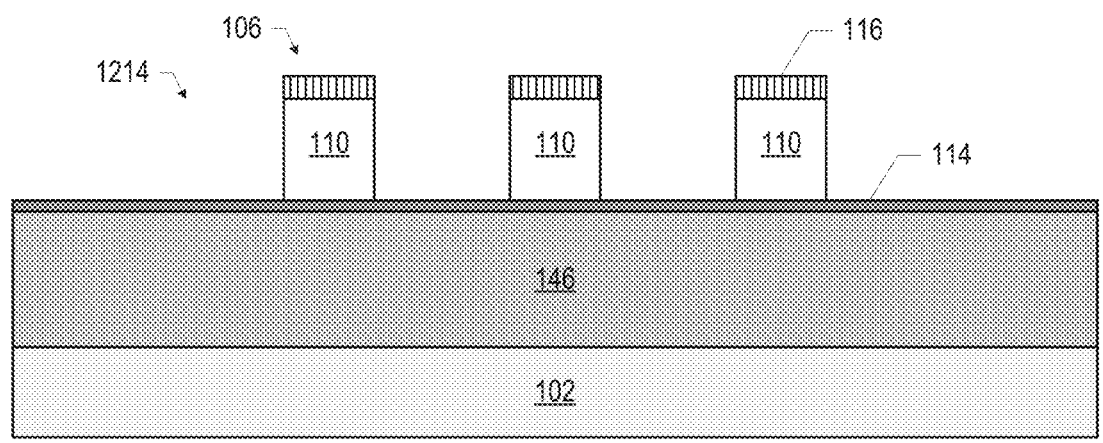

FIG. 50 is a cross-sectional view of an assembly 1214 subsequent to etching the assembly 1212 (FIG. 49) to remove the gate metal 110 that is not protected by the patterned hardmask 116 to form the gates 106. The etching of the gate metal 110 may form multiple gates 106 associated with a particular trench 107 (e.g., as illustrated in FIG. 42), and also separate portions of gate metal 110 corresponding to gates 106 associated with different trenches 107 (e.g., as illustrated in FIGS. 41 and 43). In some embodiments, as illustrated in FIG. 50, the gate dielectric 114 may remain on the quantum well stack 146 after the etched gate metal 110 is etched away; in other embodiments, the gate dielectric 114 may also be etched during the etching of the gate metal 110.

Figure 51:
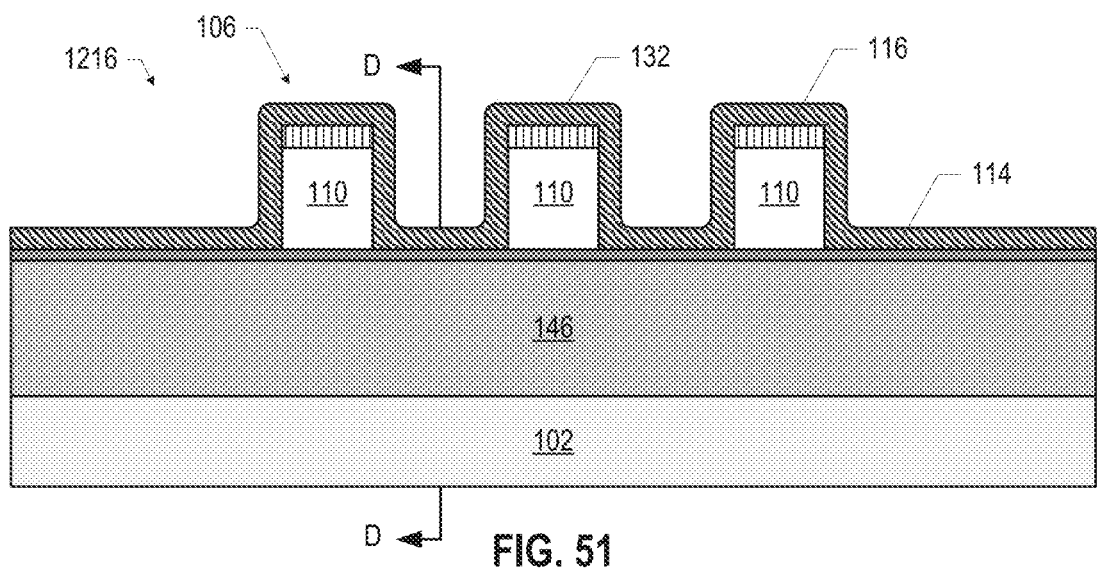
Figure 52:
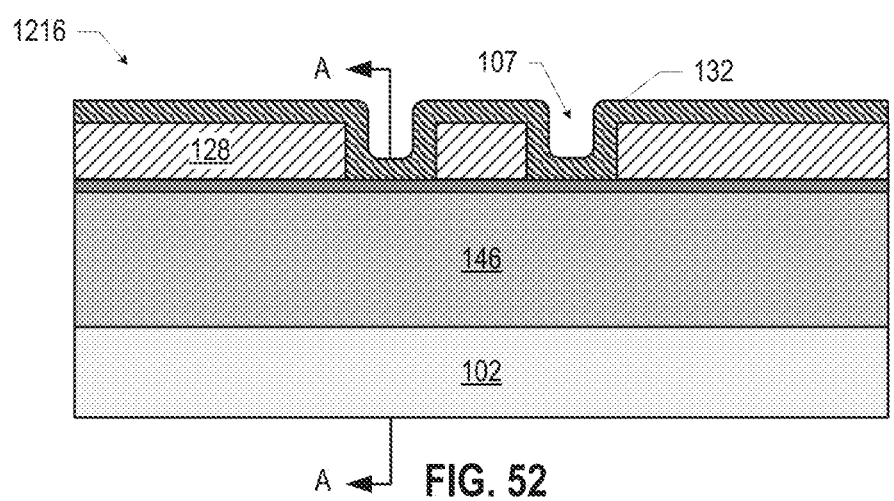

FIG. 51 is a cross-sectional view of an assembly 1216 subsequent to providing spacer material 132 on the assembly 1214 (FIG. 50). FIG. 52 is a view of the assembly 1216 taken along the section D-D of FIG. 51, through the region between adjacent gates 106 (while FIG. 51 illustrates the assembly 1216 taken along the section A-A of FIG. 52, along a trench 107). The spacer material 132 may include any of the materials discussed above with reference to the spacers 134, for example, and may be deposited using any suitable technique. For example, the spacer material 132 may be a nitride material (e.g., silicon nitride) deposited by chemical vapor deposition (CVD) or atomic layer deposition (ALD). As illustrated in FIGS. 51 and 52, the spacer material 132 may be conformally deposited on the assembly 1214.

Figure 53:
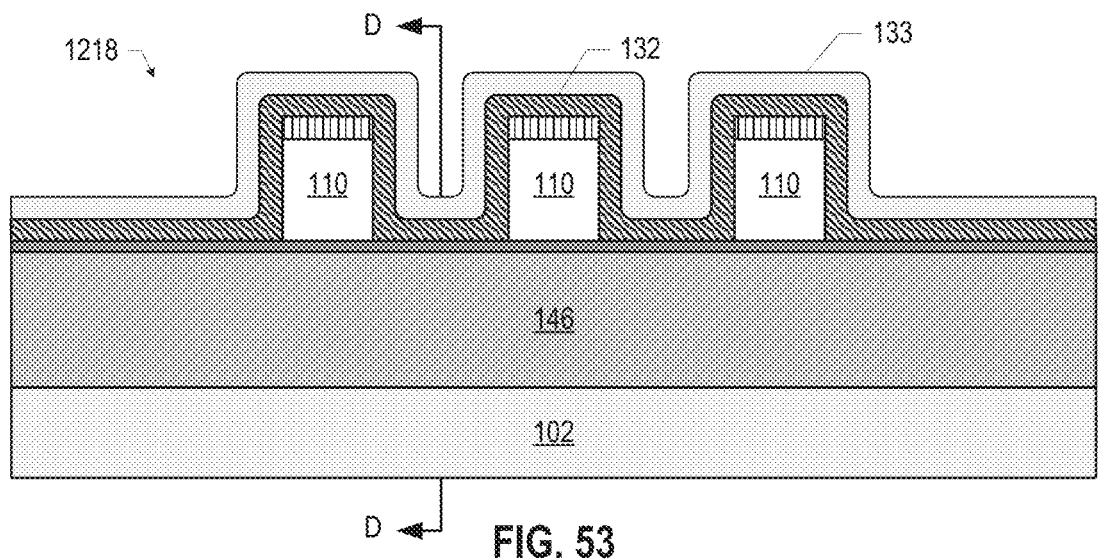
Figure 54:
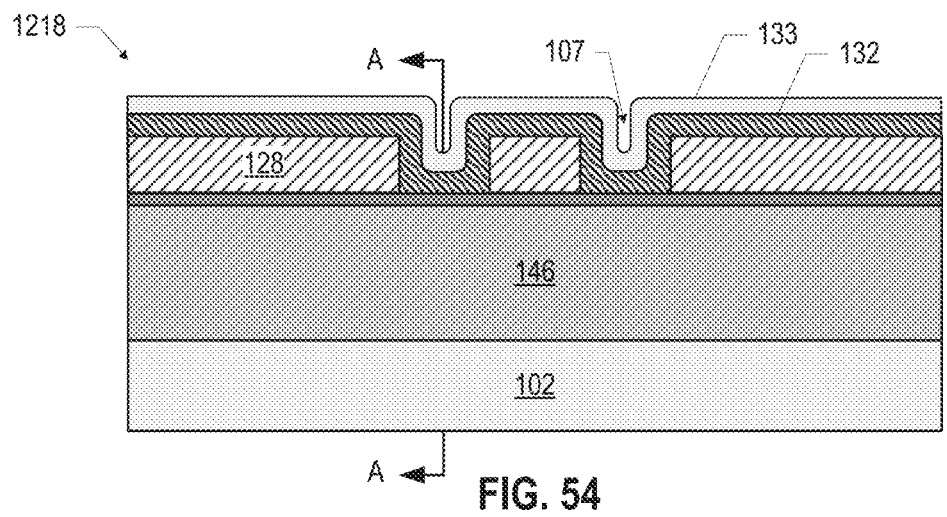

FIG. 53 is a cross-sectional view of an assembly 1218 subsequent to providing capping material 133 on the assembly 1216 (FIGS. 51 and 52). FIG. 54 is a view of the assembly 1218 taken along the section D-D of FIG. 53, through the region between adjacent gates 106 (while FIG. 53 illustrates the assembly 1218 taken along the section A-A of FIG. 54, along a trench 107). The capping material 133 may be any suitable material; for example, the capping material 133 may be silicon oxide deposited by CVD or ALD. As illustrated in FIGS. 53 and 54, the capping material 133 may be conformally deposited on the assembly 1216.

Figure 55:
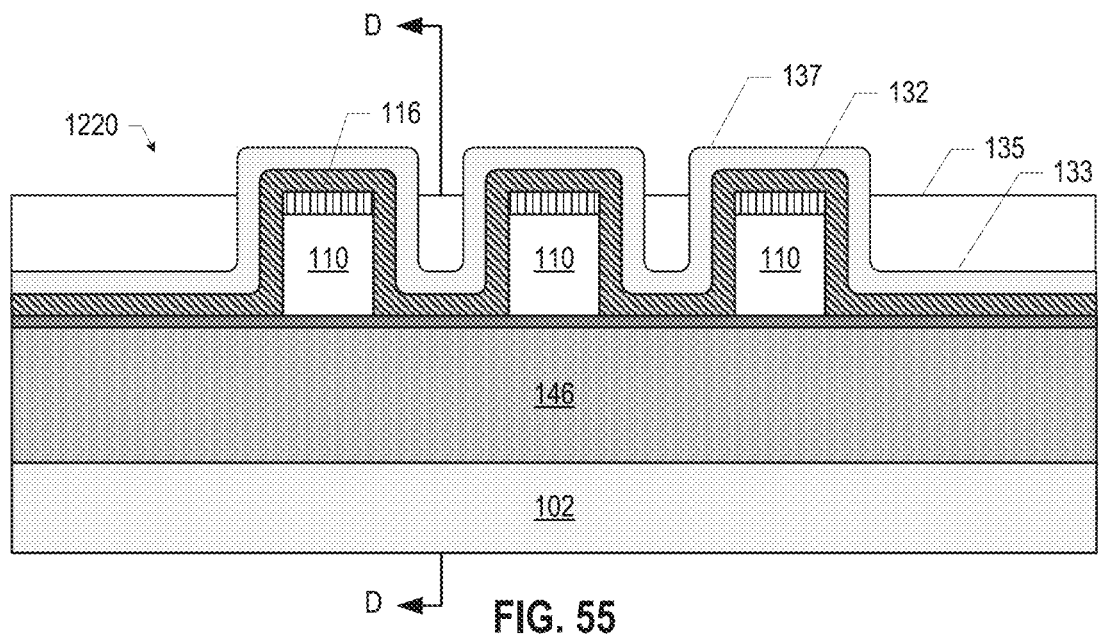
Figure 56:
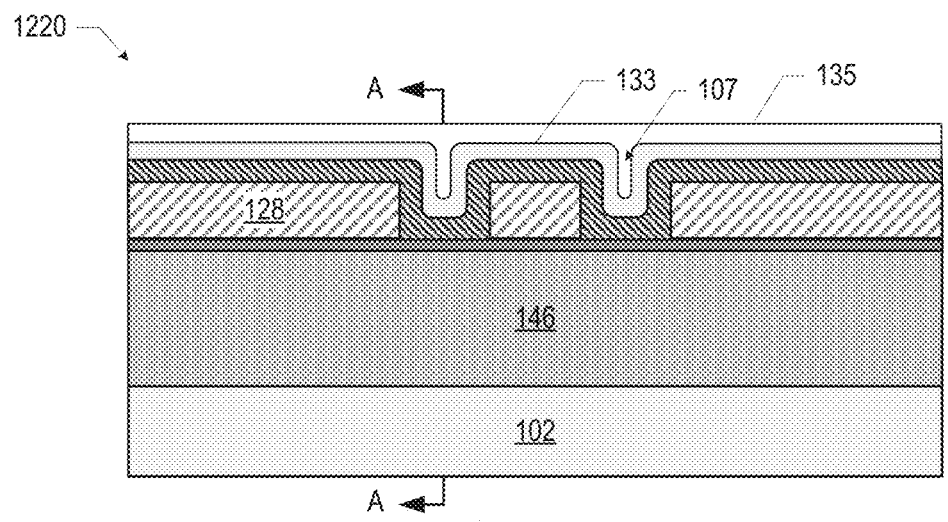

FIG. 55 is a cross-sectional view of an assembly 1220 subsequent to providing a sacrificial material 135 on the assembly 1218 (FIGS. 53 and 54). FIG. 56 is a view of the assembly 1220 taken along the section D-D of FIG. 55, through the region between adjacent gates 106 (while FIG. 55 illustrates the assembly 1220 taken along the section A-A of FIG. 56, through a trench 107). The sacrificial material 135 may be deposited on the assembly 1218 to completely cover the capping material 133, then the sacrificial material 135 may be recessed to expose portions 137 of the capping material 133. In particular, the portions 137 of capping material 133 disposed near the hardmask 116 on the gate metal 110 may not be covered by the sacrificial material 135. As illustrated in FIG. 56, all of the capping material 133 disposed in the region between adjacent gates 106 may be covered by the sacrificial material 135. The recessing of the sacrificial material 135 may be achieved by any etching technique, such as a dry etch. The sacrificial material 135 may be any suitable material, such as a bottom anti-reflective coating (BARC).

Figure 57:
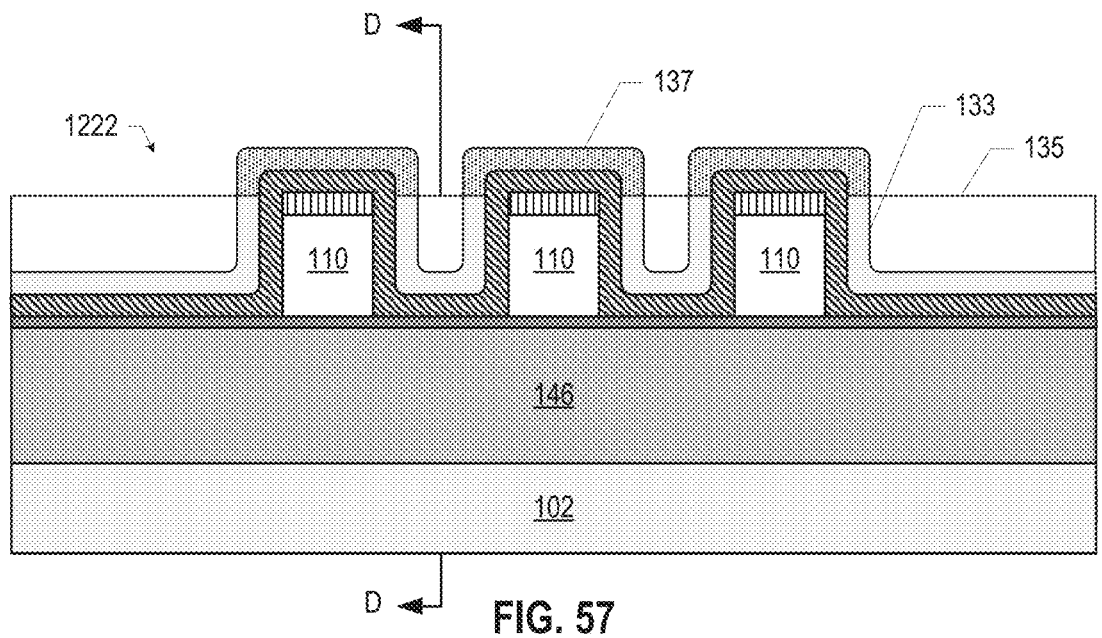
Figure 58:
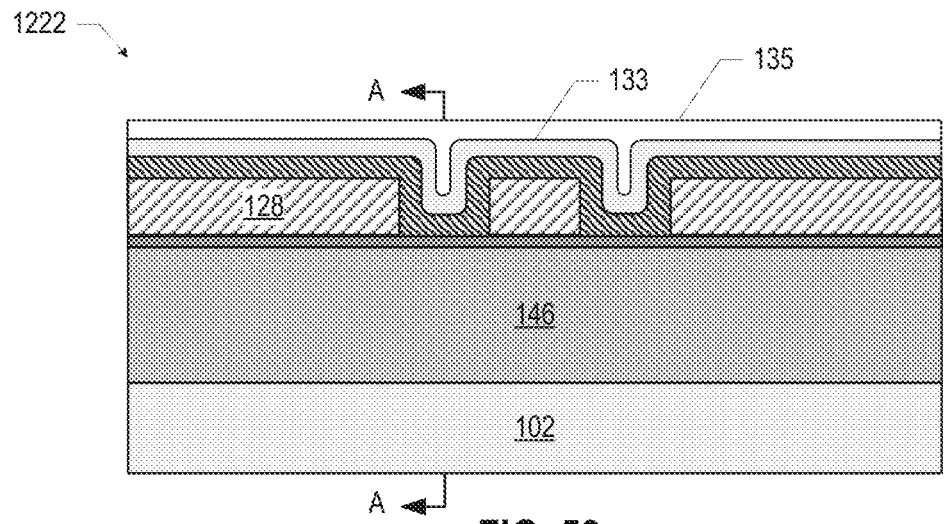

FIG. 57 is a cross-sectional view of an assembly 1222 subsequent to treating the exposed portions 137 of the capping material 133 of the assembly 1220 (FIGS. 55 and 56) to change the etching characteristics of the exposed portions 137 relative to the rest of the capping material 133. FIG. 58 is a view of the assembly 1222 taken along the section D-D of FIG. 57, through the region between adjacent gates 106 (while FIG. 57 illustrates the assembly 1222 taken along the section A-A of FIG. 58, through a trench 107). In some embodiments, this treatment may include performing a high-dose ion implant in which the implant dose is high enough to cause a compositional change in the portions 137 and achieve a desired change in etching characteristics.

Figure 59:
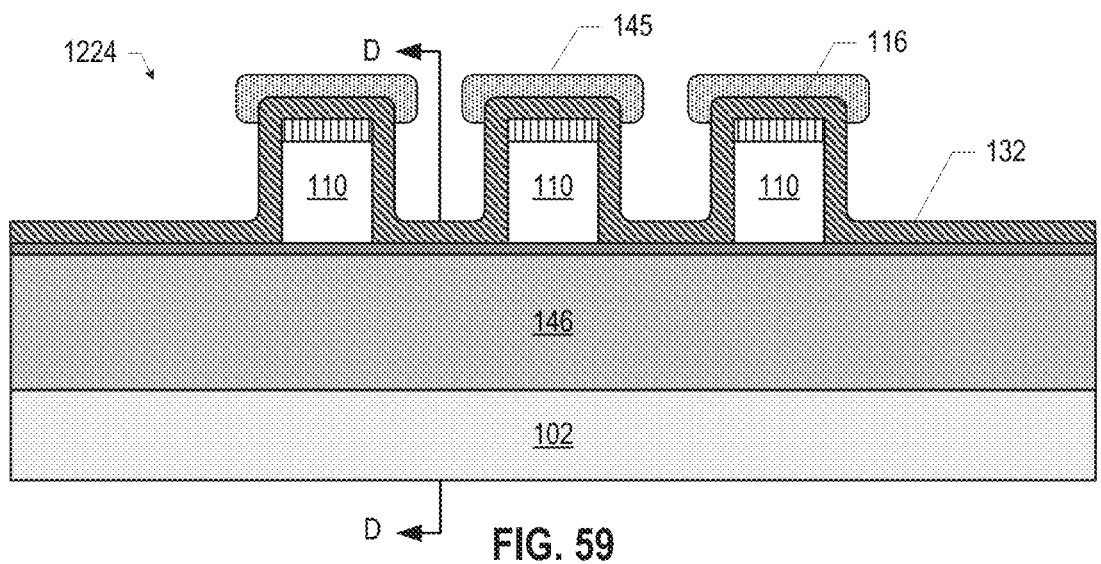
Figure 60:
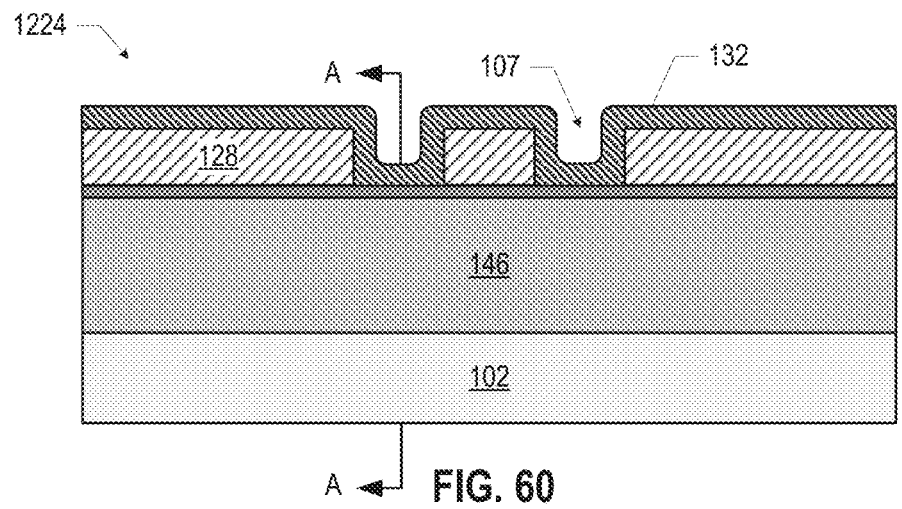

FIG. 59 is a cross-sectional view of an assembly 1224 subsequent to removing the sacrificial material 135 and the unexposed capping material 133 of the assembly 1222 (FIGS. 57 and 58). FIG. 60 is a view of the assembly 1224 taken along the section D-D of FIG. 59, through the region between adjacent gates 106 (while FIG. 59 illustrates the assembly 1224 taken along the section A-A of FIG. 60, through a trench 107). The sacrificial material 135 may be removed using any suitable technique (e.g., by ashing, followed by a cleaning step), and the untreated capping material 133 may be removed using any suitable technique (e.g., by etching). In embodiments in which the capping material 133 is treated by ion implantation (e.g., as discussed above with reference to FIGS. 57 and 58), a high temperature anneal may be performed to incorporate the implanted ions in the portions 137 of the capping material 133 before removing the untreated capping material 133. The remaining treated capping material 133 in the assembly 1224 may provide capping structures 145 disposed proximate to the "tops" of the gates 106 and extending over the spacer material 132 disposed on the "sides" of the gates 106.

Figure 61:
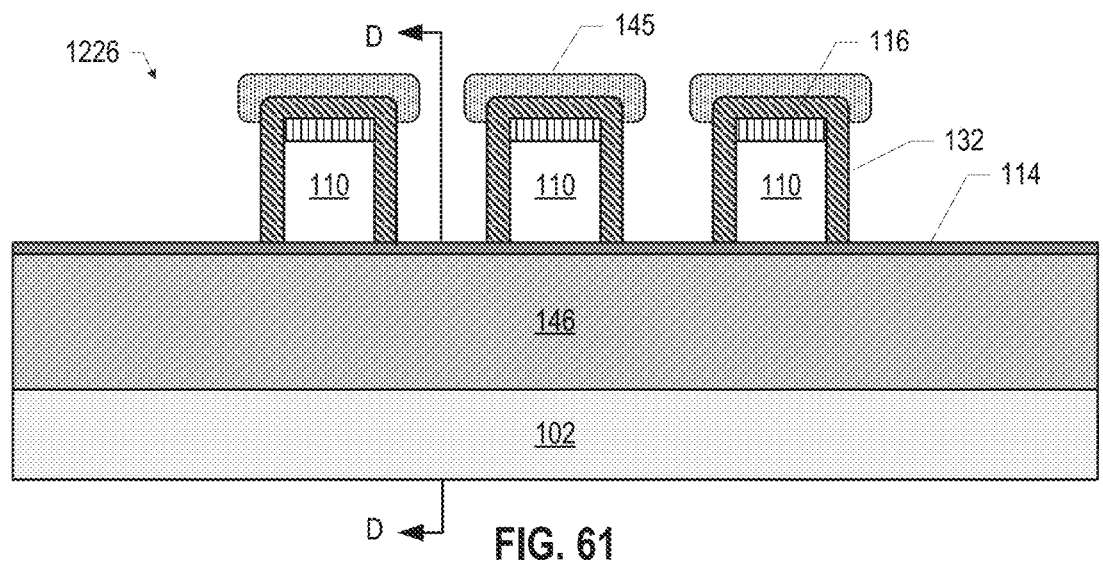
Figure 62:
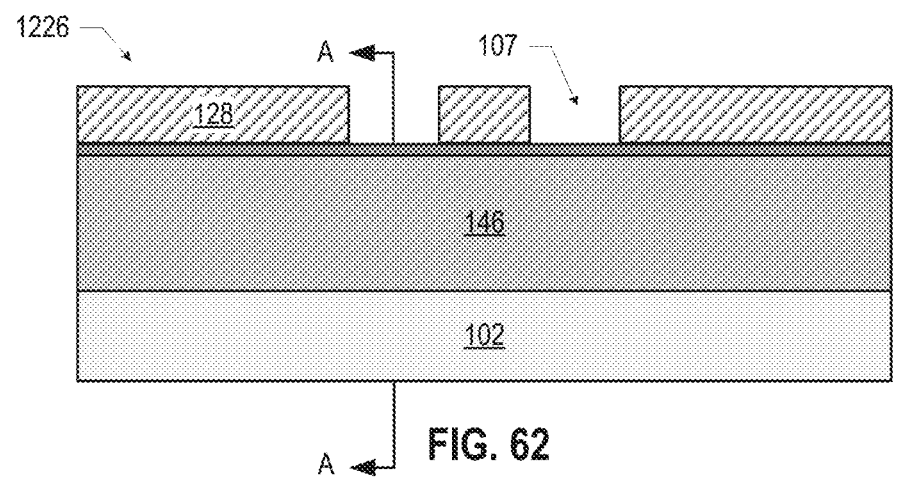
Figure 63:
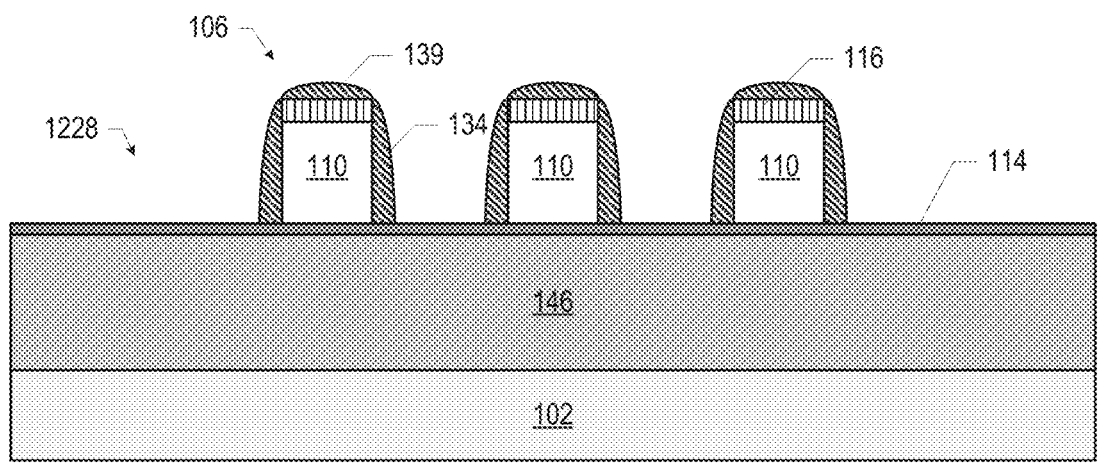
Figure 64:
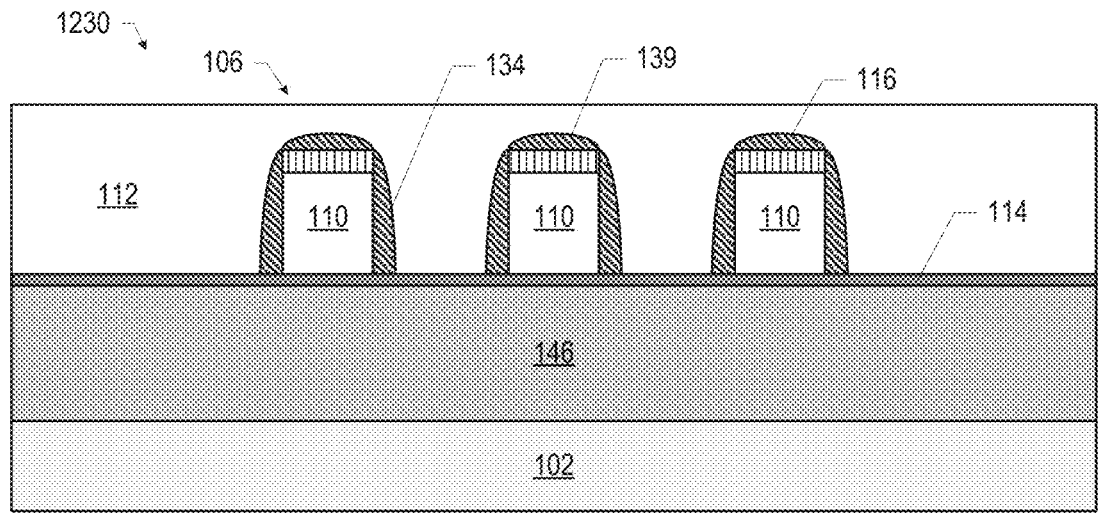
Figure 65:
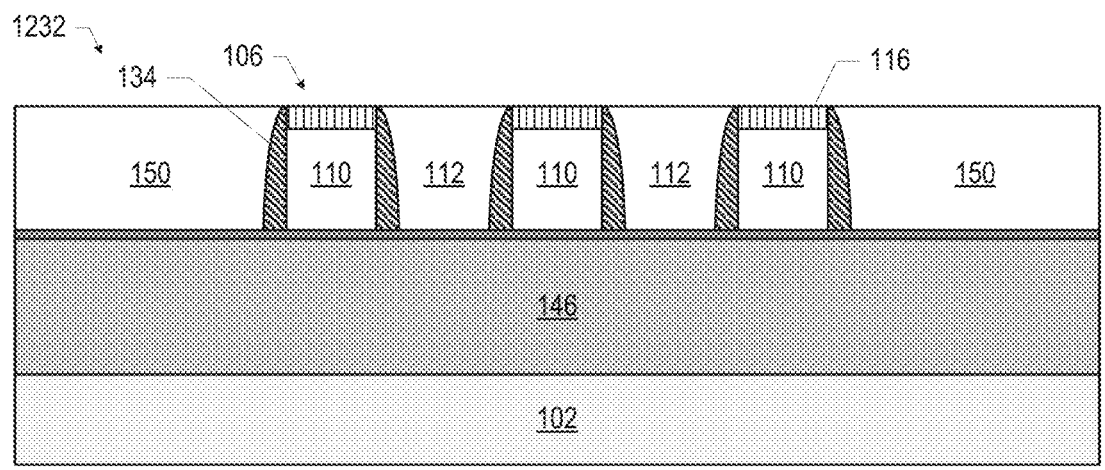

FIG. 61 is a cross-sectional view of an assembly 1226 subsequent to directionally etching the spacer material 132 of the assembly 1224 (FIGS. 59 and 60) that isn't protected by a capping structure 145, leaving spacer material 132 on the sides and top of the gates 106 (e.g., on the sides and top of the hardmask 116 and the gate metal 110). FIG. 62 is a view of the assembly 1226 taken along the section D-D of FIG. 61, through the region between adjacent gates 106 (while FIG. 61 illustrates the assembly 1226 taken along the section A-A of FIG. 62, through a trench 107). The etching of the spacer material 132 may be an anisotropic etch, etching the spacer material 132 "downward" to remove the spacer material 132 in some of the area between the gates 106 (as illustrated in FIGS. 61 and 62), while leaving the spacer material 135 on the sides and tops of the gates 106. In some embodiments, the anisotropic etch may be a dry etch. FIGS. 63-65 maintain the cross-sectional perspective of FIG. 61.

FIG. 63 is a cross-sectional view of an assembly 1228 subsequent to removing the capping structures 145 from the assembly 1226 (FIGS. 61 and 62). The capping structures 145 may be removed using any suitable technique (e.g., a wet etch). The spacer material 132 that remains in the assembly 1228 may include spacers 134 disposed on the sides of the gates 106, and portions 139 disposed on the top of the gates 106.

FIG. 64 is a cross-sectional view of an assembly 1230 subsequent to providing the gate metal 112 on the assembly 1228 (FIG. 63). The gate metal 112 may fill the areas between adjacent ones of the gates 106, and may extend over the tops of the gates 106 and over the spacer material portions 139. The gate metal 112 of the assembly 1230 may fill the trenches 107 (between the gates 106) and extend over the insulating material 128.

FIG. 65 is a cross-sectional view of an assembly 1232 subsequent to planarizing the assembly 1230 (FIG. 64) to remove the gate metal 112 above the gates 106, as well as to remove the spacer material portions 139 above the hardmask 116. In some embodiments, the assembly 1230 may be planarized using a chemical mechanical polishing (CMP) technique. The planarizing of the assembly 1230 may also remove some of the hardmask 116, in some embodiments. Some of the remaining gate metal 112 may fill the areas between adjacent ones of the gates 106, while other portions 150 of the remaining gate metal 112 may be located "outside" of the gates 106. The assembly 1232 may be further processed substantially as discussed above with reference to FIGS. 19-29 to form the quantum dot device 100 of FIGS. 41-43.

In the embodiment of the quantum dot device 100 illustrated in FIGS. 41-43, the magnet line 121 is oriented parallel to the longitudinal axes of the trenches 107. In other embodiments, the magnet line 121 of the quantum dot device 100 of FIGS. 41-43 may not be oriented parallel to the longitudinal axes of the trenches 107; for example, any of the magnet line arrangements discussed above with reference to FIGS. 30-31 may be used.

Although a single magnet line 121 is illustrated in FIGS. 41-43, multiple magnet lines 121 may be included in that embodiment of the quantum dot device 100 (e.g., multiple magnet lines 121 parallel to the longitudinal axes of the trenches 107). For example, the quantum dot device 100 of FIGS. 41-43 may include a second magnet line 121 proximate to the trench 107-2 in a symmetric manner to the magnet line 121 illustrated proximate to the trench 107-1. In some embodiments, multiple magnet lines 121 may be included in a quantum dot device 100, and these magnet lines 121 may or may not be parallel to one another. For example, in some embodiments, a quantum dot device 100 may include two (or more) magnet lines 121 that are oriented perpendicular to each other.

As discussed above, in the embodiment illustrated in FIGS. 41-43 (and FIGS. 44-65), there may not be any substantial spacer material between the gate metal 112 and the proximate sidewalls of the trench 107 in the y-direction. In other embodiments, spacers 134 may also be disposed between the gate metal 112 and the sidewalls of the trench 107 in the y-direction. To manufacture such a quantum dot device 100, the operations discussed above with reference to FIGS. 53-62 may not be performed; instead, the spacer material 132 of the assembly 1216 of FIGS. 51 and 52 may be anisotropically etched (as discussed with reference to FIGS. 61 and 62) to form the spacers 134 on the sides of the gates 106 and on the sidewalls of the trench 107. The assembly 1256 may be further processed as discussed above with reference to FIGS. 64-65 (or other embodiments discussed herein) to form a quantum dot device 100.

As noted above, a single trench 107 may include multiple groups of gates 106/108, spaced apart along the trench by a doped region 140. FIG. 66 is a cross-sectional view of an example of such a quantum dot device 100 having multiple groups of gates 180 at least partially disposed in a single trench 107 above a quantum well stack 146, in accordance with various embodiments. Each of the groups 180 may include gates 106/108 (not labeled in FIG. 66 for ease of illustration) that may take the form of any of the embodiments of the gates 106/108 discussed herein. A doped region 140 (and its interface material 141) may be disposed between two adjacent groups 180 (labeled in FIG. 66 as groups 180-1 and 180-2), and may provide a common reservoir for both groups 180. In some embodiments, this "common" doped region 140 may be electrically contacted by a single conductive via 136. The particular number of gates 106/108 illustrated in FIG. 66, and the particular number of groups 180, is simply illustrative, and a trench 107 may include any suitable number of gates 106/108 arranged in any suitable number of groups 180. Each of the groups 180 may act as a gate group 718, as discussed above with reference to FIGS. 1 and 2, and the quantum dot device 100 of FIG. 66 may also include SETs 704 (not shown) arranged in gate-detector clusters 706 with the groups 180. The quantum dot device 100 of FIG. 66 may also include one or more magnet lines 121, arranged as desired. Similarly, in embodiments of the quantum dot device 100 that include fins, a single fin 104 may include multiple groups of gates 106/108, spaced apart along the fin.

As discussed above with reference to FIGS. 41-43, in some embodiments in which the gate dielectric 114 is not a layer shared commonly between the gates 108 and 106, but instead is separately deposited on the trench 107 between the spacers 134, the gate dielectric 114 may extend at least partially up the sides of the spacers 134, and the gate metal 112 may extend between the portions of gate dielectric 114 on the spacers 134.

In some embodiments, similar techniques may be used to form the gates 108 using alternative manufacturing steps to those illustrated in FIGS. 64-65. For example, the insulating material 130 may be deposited on the assembly 1228 (FIG. 63), the insulating material 130 may be "opened" to expose the areas in which the gates 108 are to be disposed, a layer of gate dielectric 114 and gate metal 112 may be deposited on this structure to fill the openings, the resulting structure may be polished back to remove the excess gate dielectric 114 and gate metal 112 (e.g., as discussed above with reference to FIG. 65), the insulating material 130 at the sides of the outermost gates 106 may be opened to expose the quantum well stack 147, the exposed quantum well stack 147 may be doped and provided with an interface material 141 (e.g., as discussed above with reference to FIGS. 23-24), and the openings may be filled back in with insulating material 130 to form an assembly like the assembly 236 of FIG. 25. Further processing may be performed as described herein.

Any suitable SETs 704 may be included in the gate-detector clusters 706 of a quantum dot device 100, as disclosed herein. FIGS. 67, 80, 85, and 89 illustrate various examples of SET devices 500 that include one or more SETs; any of the SETs discussed with reference to any of the SET devices 500 may be used as the SET 704 in a gate-detector cluster 706 in any of the quantum dot devices 100 disclosed herein.

FIG. 67 provides various views of a first embodiment of a SET device 500. In particular, FIG. 67A is a cross-sectional view of the SET device 500 through the section A-A of FIGS. 67C, 67E, and 67F; FIG. 67B is a cross-sectional view of the SET device 500 through the section B-B of FIGS. 67C, 67E, and 67F; FIG. 67C is a cross-sectional view of the SET device 500 through the section C-C of FIGS. 67A, 67B, 67D, and 67F; FIG. 67D is a side view of the SET device 500 toward the section A-A with the insulator 510 removed; FIG. 67E is a side view of the SET device 500 toward the section C-C from the gate electrode 506 with the insulator 510 removed; and FIG. 67F is a top view of the SET device 500 with the insulator 510 removed.

As illustrated in FIG. 67, the SET device 500 may include a source/drain (S/D) structure 581 including two S/D supports 514 disposed on a substrate 502. The substrate 502 may take the form of any of the quantum dot formation regions 710 disclosed herein. The S/D structure 581 may also include an S/D electrode 504 disposed on the side faces 562 of the S/D supports 514; in the embodiment of FIG. 67, no electrode may be disposed on the opposite side faces 564 of the S/D supports 514. The two S/D supports 514, and the two S/D electrodes 504, may be spaced apart by intervening dielectric 508 and an island 512. In particular, the SET device 500 may include two tunnel junctions (TJs) 570, each formed by a portion of dielectric 508 "sandwiched" between an S/D electrode 504 and the island 512. The S/D structure 581 may include the S/D supports 514, the dielectric 508, the S/D electrodes 504, and the island 512.

The dielectric 508 may extend up the sidewalls 572 of the S/D supports 514, and up the sidewalls 574 of the S/D electrodes 504. In some embodiments, the dielectric 508 may extend along the substrate 502 between the S/D supports 514 and the S/D electrodes 504 such that a portion of the dielectric 508 is disposed between the island 512 and the substrate 502. The dielectric 508 may also extend up sidewalls 576 of the insulator 510, as shown. In some embodiments, the dielectric 508 may have a substantially uniform thickness 524 between 0.5 and 5 nanometers (e.g., 1 nanometer).

The island 512 may be disposed at the bottom of the "box" formed by the dielectric 508. In some embodiments, the top face 578 of the island 512 may be recessed back from the top faces 580 of the S/D supports 514; in some such embodiments, a portion of the insulator 510 may be disposed in the "box" formed by the dielectric 508 such that the island 512 is disposed between this portion of the insulator 510 and the substrate 502. In some embodiments, the island 512 may have a thickness 588 between 5 and 30 nanometers (e.g., 10 nanometers).

The SET device 500 may also include a gate structure 583. The gate structure 583 may include a support 516 disposed on the substrate 502. The gate structure 583 may also include a gate electrode 506 disposed on a side face 568 of the gate support 516; in the embodiment of FIG. 67, no electrode may be disposed on the opposite side face 566 of the gate support 516. The S/D electrodes 504, the dielectric 508, the island 512, and the gate electrode 506 may together provide a SET.

During use of the SET devices 500 disclosed herein, a voltage may be applied across the S/D electrodes 504 and to the gate electrode 506 to provide a potential for carriers (e.g., electrons) to tunnel through the TJs 570 into and out of the island 512. In particular, the gate electrode 506 may be capacitively coupled to the island 512, and thus the potential of the gate electrode 506 may be used to tune the potential of the island 512. Because carriers (e.g., electrons) enter the island 512 via tunneling, the flow of carriers into the island 512 is a discrete phenomenon, and may be characterized by the number of carriers occupying the island 512 at any given time. The conductance of the island 512 (and thus the conductance of the SET device 500) may change in response to electrical charges proximate to the island 512, and the rate of change of this conductance may be a function of the voltage on the gate electrode 506. Thus, when the SET device 500 is to be used as a charge detector (and thus a large change in conductance is desired when a charge is present), the voltage on the gate electrode 506 may be set to a bias level corresponding to a steep slope of the bias-conductance curve of the SET device 500. In some embodiments, the SET device 500 may be used as a charge detector in a quantum computing setting to detect the state of a proximate qubit (e.g., to detect the spin state of an electron trapped in a proximate quantum well).

In some embodiments, the SET devices 500 disclosed herein may themselves be used as a qubit in a quantum computing device. For example, an electron may be confined in the island 512, and the spin of the electron may be used as a qubit for quantum computations. Thus, any of the SET devices 500 disclosed herein may be used in a computing device to detect the state of spin-based qubits, provide spin-based qubits, or both.

In some embodiments, the top faces 582 of the S/D electrodes 504 may be recessed back from the top faces 580 of the S/D supports 514. Similarly, in some embodiments, the top face 584 of the gate electrode 506 may be recessed back from the top face 586 of the gate support 516. In some embodiments, the gate electrode 506 and the S/D electrodes 504 may have a same height 526. In other embodiments, the gate electrode 506 and the S/D electrodes 504 may have different heights. Generally, the height 526 of the gate electrode 506 and/or the S/D electrodes 504 may be between 5 and 15 nanometers (e.g., 10 nanometers). In some embodiments, the S/D supports 514 and the gate support 516 may have a same height 522. In other embodiments, the S/D supports 514 and the gate support 516 may have different heights. Generally, the height 522 of the gate support 516 and/or the S/D supports 514 may be between 20 and 100 nanometers (e.g., between 30 and 80 nanometers, or approximately equal to 50 nanometers). In some embodiments, the S/D supports 514 and the gate support 516 may have a same width 518. In other embodiments, the S/D supports 514 and the gate support 516 have different widths. Generally, the width 518 of the S/D supports 514 and/or the gate support 516 may be between 20 and 100 nanometers (e.g., 40 nanometers).

Figure 67A:
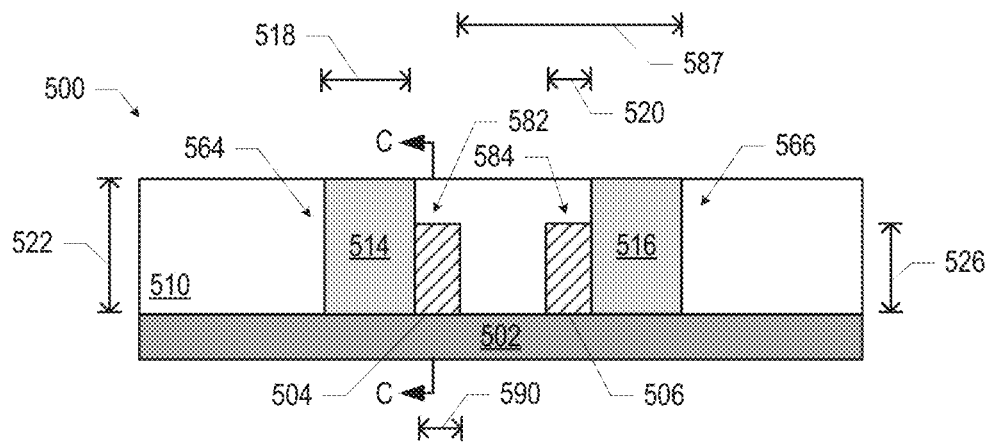
FIGS. 67A-67F are various views of a single electron transistor (SET) device, in accordance with various embodiments.
Figure 67B:
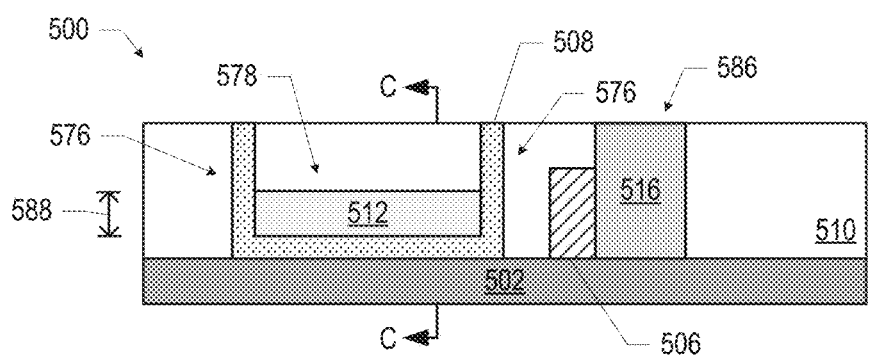
Figure 67C:
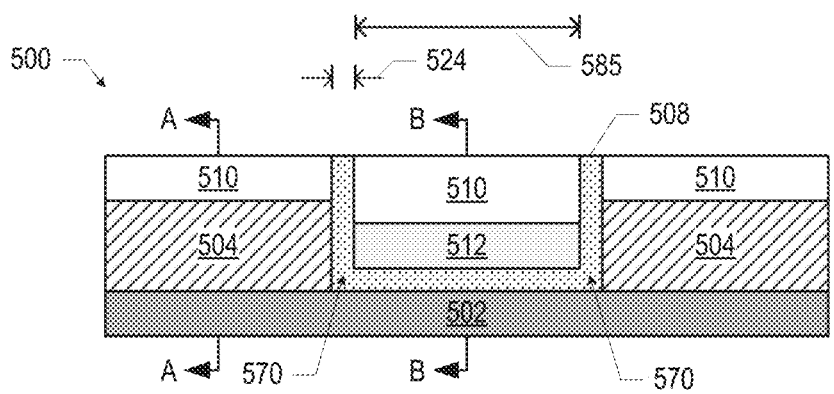
Figure 67D:
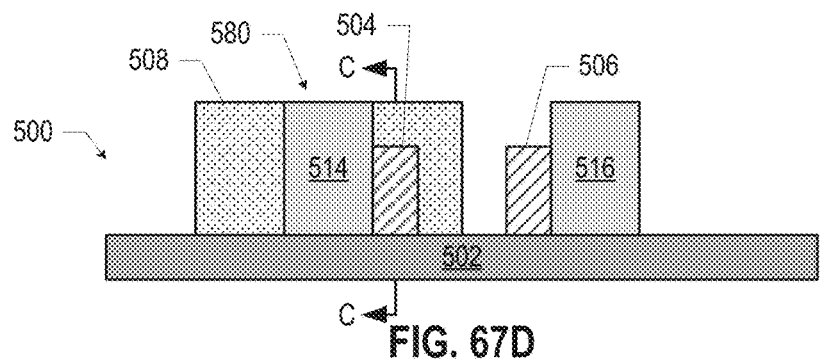
Figure 67E:
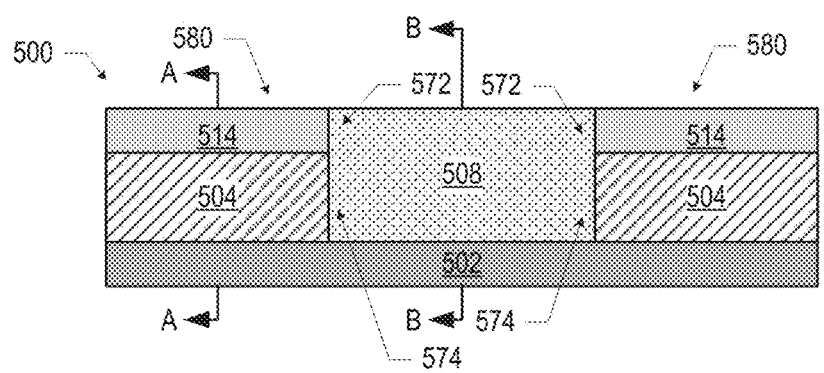

The S/D electrodes 504 may have a width 590 between 1 and 10 nanometers (e.g., 5 nanometers). Smaller S/D electrodes 504 may be suitable for higher temperature (e.g., room temperature) operation; for example, the width 590 may between 1 and 5 nanometers (e.g., 2 nanometers). In some embodiments, the width 520 of the gate electrode 506 may be the same as the width 590 of the S/D electrodes 504. In some embodiments, the width 520 of the gate electrode 506 may be different from the width 590 of the S/D electrodes 504. Generally, the width 520 of the gate electrode 506 may take the form of any of the embodiments discussed herein with reference to the width 590 of the S/D electrodes 504. In some embodiments, the spacing 587 of the S/D electrodes 504 and the gate support 516, as shown in FIG. 67A, may be between 80 and 200 nanometers (e.g., 100 nanometers).

As illustrated in FIG. 67, in some embodiments, the dielectric 508 may laterally extend beyond the area between the two S/D supports 514 (e.g., in the dimension indicated by the arrow 511). The dielectric 508 may also laterally extend beyond the area between the two S/D electrodes 504. Similarly, in some embodiments, the island 512 may laterally extend beyond the area between the two S/D supports 514, and the island 512 may laterally extend beyond the area between the two S/D electrodes 504. In some embodiments, the footprint of the dielectric 508 may have a lateral dimension 530 (in the direction of the axis between the S/D electrodes 504) between 25 and 105 nanometers (e.g., between 40 and 50 nanometers). In some embodiments, the island 512 may have a lateral dimension 585 (in the direction of the axis between the S/D electrodes 504) between 25 and 100 nanometers (e.g., 40 nanometers). In some embodiments, the dielectric 508 may have a lateral dimension 528 (perpendicular to the axis between the S/D electrodes 504) between 25 and 100 nanometers (e.g., 40 nanometers).

Generally, the smaller the island 512, the better the charge sensitivity of any of the SET devices 500 disclosed herein for a given temperature when the self-capacitance of the SETs is the dominant capacitance. In particular, the SET device 500 may have an associated charging energy, representative of the rate of change of conductance in response to proximate charges; a larger charging energy represents greater sensitivity to proximate charges. The charging energy may be inversely proportional to the self-capacitance of the island 512, and the self-capacitance of the island may be proportional to the size of the island 512. As the temperature of the environment of a SET device 500 increases (e.g., to room temperature), the sensitivity of the SET device 500 is typically compromised. Larger charging energies may help a SET device 500 achieve an adequate sensitivity at higher temperatures (e.g., room temperature), and thus smaller islands 512 may be advantageous in SET devices 500 that are to operate at these higher temperatures when self-capacitance of the islands 512 are the dominant capacitances.

Any suitable materials may be used in the SET device 500 of FIG. 67. The S/D supports 514 and the gate support 516 may be "dummy" structures that provide a mechanical support against which the S/D electrodes 504 and the gate electrode 506 may be formed, respectively. In some embodiments, the S/D supports 514 and the gate support 516 may be formed from an insulating material, such as an oxide. The S/D electrodes 504 and the gate electrode 506 may be formed from any suitable conductive material, such as a metal. In some embodiments, the S/D electrodes 504 and the gate electrode 506 may be formed of a noble metal, which may provide advantageous resistance to corrosion during manufacture and thereby facilitate the reliable construction of the TJs 570 (due to the absence of oxide interference).

The insulator 510 may be a suitable dielectric material, such as any interlayer dielectric (ILD) material. The dielectric 508 may be silicon oxide, carbon-doped oxide, or any suitable low-k dielectric material. The island 512 may be a semiconductor material (e.g., silicon) or a metal (e.g., a noble metal, such as copper), in various embodiments.

Figure 67F:
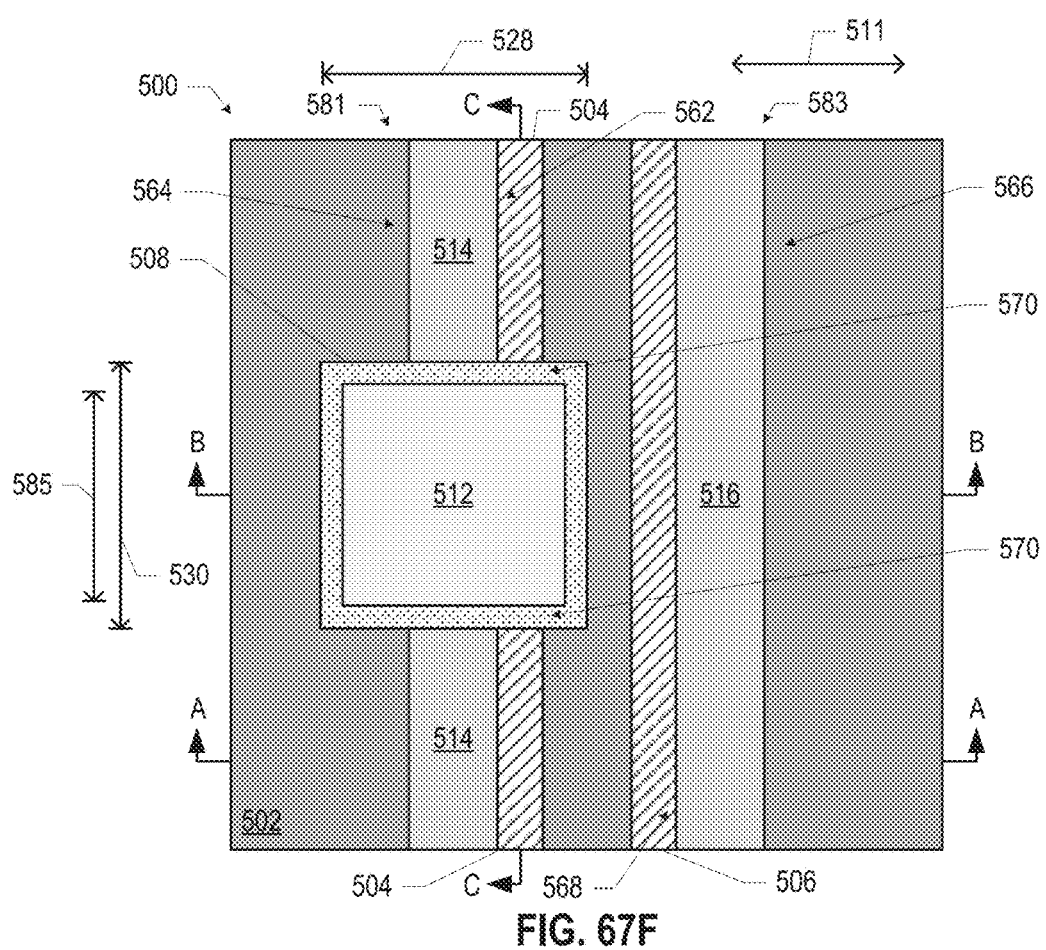

Although a single SET device 500 is illustrated in FIG. 67, a device may include an array of SET devices 500 (e.g., by tiling the SET device 500 illustrated in FIG. 67F in a one-dimensional or two-dimensional array, alternating the S/D structures 581 and the gate structures 583).

Any suitable process may be used to manufacture the SET device 500 of FIG. 67. For example, FIGS. 68-79 depict various cross-sectional views of stages in an example process for manufacturing the SET device 500 of FIG. 67. The materials and dimensions of various components of the stages illustrated in FIGS. 68-79 may take the form of any of the embodiments discussed herein. In FIGS. 68-79, the "A" sub-figures represent cross-sectional views through the section A-A (analogous to FIG. 67A), the "B" sub-figures represent cross-sectional views through the section B-B (analogous to FIG. 67B), and the "C" sub-figures represent cross-sectional views through the section C-C (analogous to FIG. 67C).

Figure 68A:
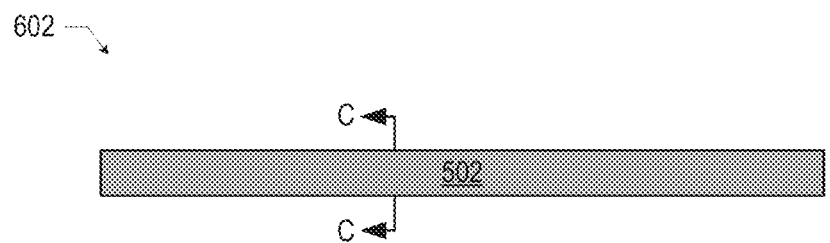
FIGS. 68A-68C, 69A-69C, 70A-70C, 71A-71C, 72A-72C, 73A-73C, 74A-74C, 75A-75C, 76A-76C, 77A-77C, 78A-78C, and 79A-79C illustrate various example stages in the manufacture of the SET device of FIGS. 67A-67F, in accordance with various embodiments.
Figure 68B:
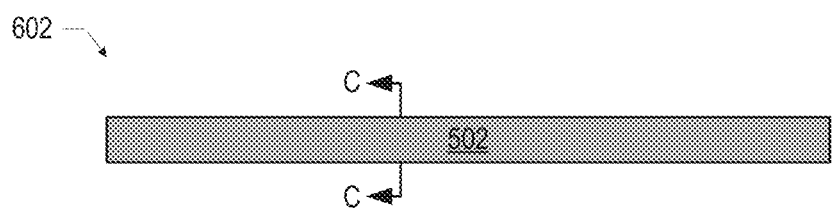
Figure 68C:
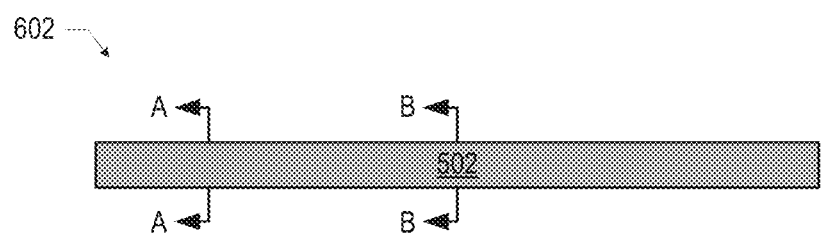

FIG. 68 depicts an assembly 602 including a substrate 502. The substrate 502 may take any of the forms discussed above with reference to FIG. 67; for example, the substrate 502 may be a quantum dot formation region 710.

Figure 69A:
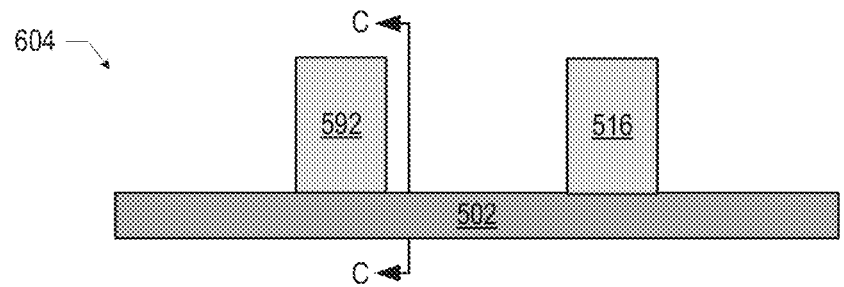
Figure 69B:
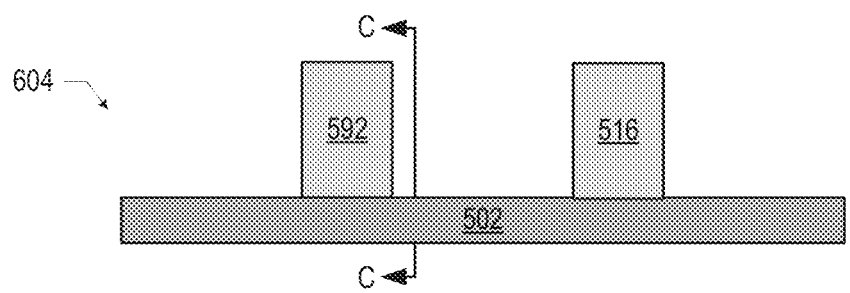
Figure 69C:
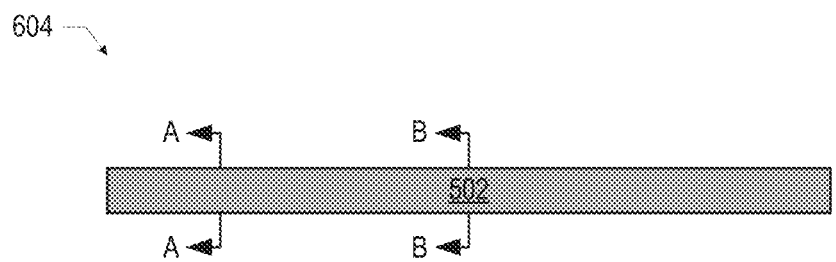

FIG. 69 depicts an assembly 604 subsequent to providing support material 592 and the gate support 516 on the substrate 502 of the assembly 604 (FIG. 68). In some embodiments, the support material 592 and the gate support 516 may each be shaped substantially as a rectangular solid. The support material 592 and the gate support 516 may each take the form of "fins" extending from the substrate 502, and may be formed using any suitable technique. For example, in some embodiments, an insulating material may be blanket-deposited on the substrate 502, and patterned to form the support material 592 and the gate support 516. In other embodiments, a sacrificial material may be blanket-deposited on the substrate 502, trenches may be formed in the sacrificial material down to the substrate 502, the trenches may be filled with insulating material to form the support material 592 and the gate support 516, and then the sacrificial material may be removed. These embodiments are simply examples, and any desired technique may be used to form the support material 592 and the gate support 516 on the substrate 502.

Figure 70A:
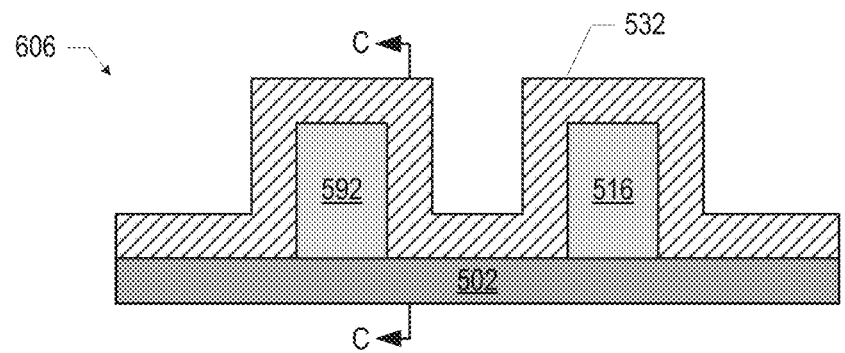
Figure 70B:
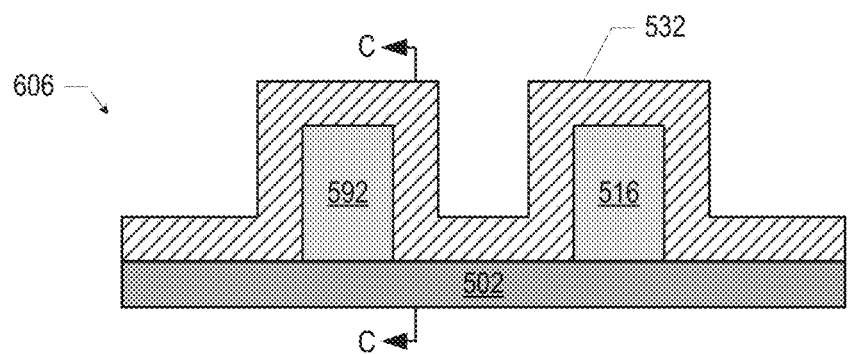
Figure 70C:
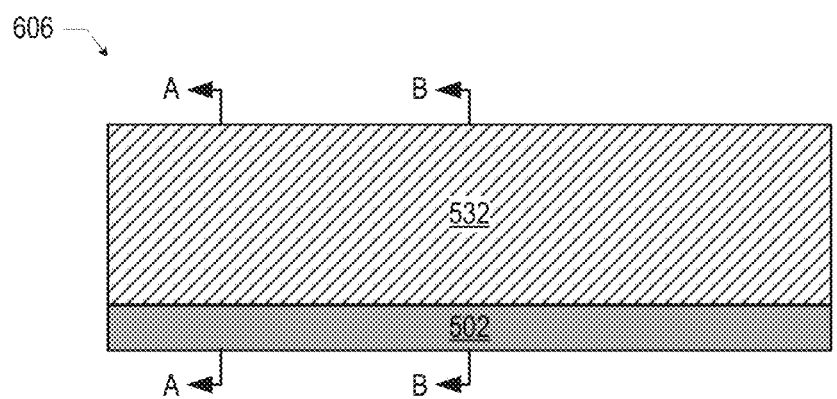

FIG. 70 depicts an assembly 606 subsequent to depositing conductive material 532 on the assembly 604 (FIG. 69). In some embodiments, the conductive material 532 may be conformally deposited on the assembly 604, extending over the support material 592 and the gate support 516 and the exposed substrate 502, to a desired thickness. The thickness of the conductive material 532 may be substantially equal to the widths 590 and 520, discussed above. Such conformal deposition may be performed by, for example, atomic layer deposition (ALD). Using ALD to deposit the conductive material 532 may allow the thickness of the deposition to be very well controlled, helping achieve a small and reliably sized SET device 500.

Figure 71A:
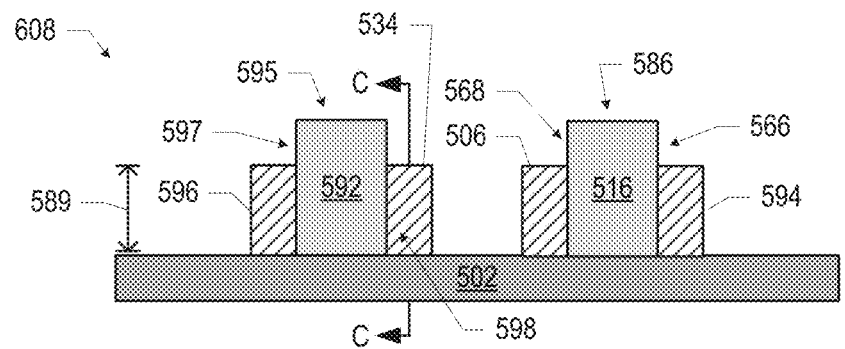
Figure 71B:
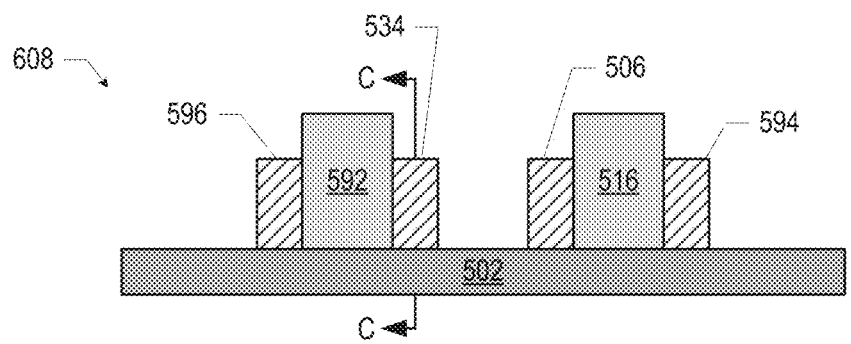
Figure 71C:
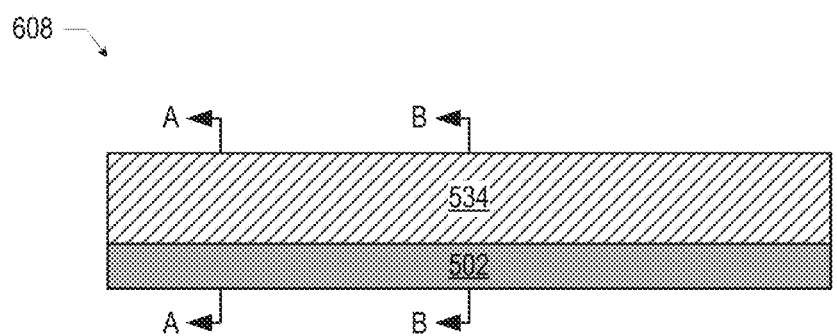

FIG. 71 depicts an assembly 608 subsequent to directionally etching back the conductive material 532 of the assembly 606 (FIG. 70) to remove a desired thickness of the conductive material 532 in the "vertical" direction and leave a desired height 589 of the conductive material 532. The height 589 may be equal to the height 526 discussed above. In particular, the conductive material 532 may be removed from the top face 595 of the support material 592, the top face 586 of the gate support 516, and from exposed areas of the substrate 502 where the thickness of the conductive material 532 was less than or equal to the thickness removed. The directional etching may leave portions of the conductive material 532 on the side faces of the support material 592 and the gate support 516. In particular, conductive material 596 may be disposed on the side face 597 of the support material 592, conductive material 534 may be disposed on the side face 598 of the support material 592, the gate electrode 506 may be disposed on the side face 568 of the gate support 516, and conductive material 594 may be disposed on the side face 566 of the gate support 516. As discussed above with reference to FIG. 67, in some embodiments, the conductive material 532 may be recessed below the top faces 595 and 586 of the support material 592 and the gate support 516, respectively. Techniques other than the directional etching described above may be used to form the assembly 608 from the assembly 606. For example, in some embodiments, a sacrificial light absorbing material (SLAM) may be deposited on the assembly 606 and recessed back to the desired height 589 (e.g., using a timed dry etch); a desired thickness of the conductive material 532 that extends beyond the SLAM may be etched away, then the SLAM may be removed and the conductive material 532 etched again to further recess the conductive material 532 on the side faces of the support material 592 and the gate support 516 and remove the conductive material 532 from exposed areas of the substrate 502.

Figure 72A:
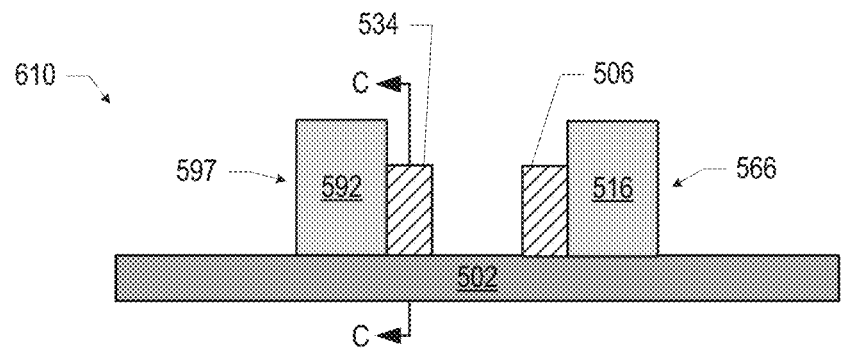
Figure 72B:
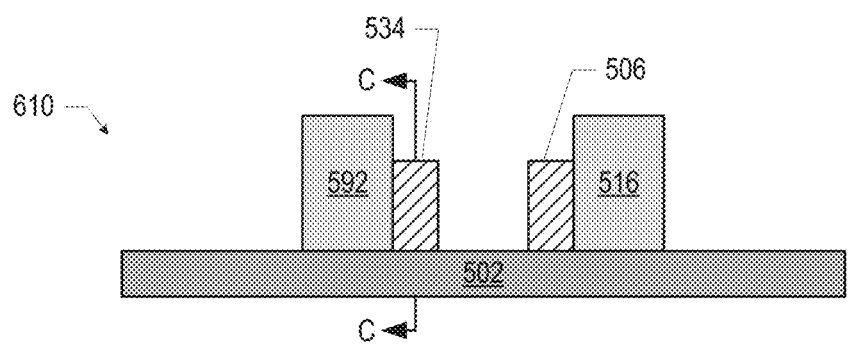
Figure 72C:
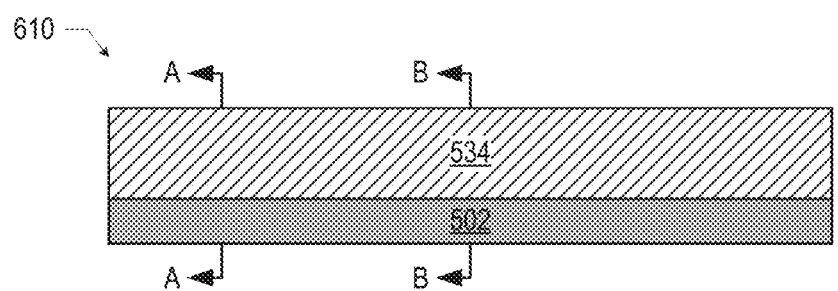

FIG. 72 depicts an assembly 610 subsequent to removing the conductive material 596 from the side face 597 of the support material 592 of the assembly 608 (FIG. 71), and removing the conductive material 594 from the side face 566 of the gate support 516 of the assembly 608. In some embodiments, the conductive material 596 and the conductive material 594 may be removed by providing an appropriate mask to the assembly 608 (that exposes the conductive material 596 and the conductive material 594) and then etching away the exposed conductive material 596 and the conductive material 594. In other embodiments, the conductive material 596 and the conductive material 594 may not be formed on the support material 592 and the gate support 516, respectively, at all. Instead, an insulating material (e.g., the insulator 510, as discussed below with reference to FIG. 73) may be deposited on the assembly 604 (FIG. 69) and polished back to expose the top face 595 of the support material 592 and the top face 586 of the gate support 516;

the insulating material may be patterned to expose the substrate 502 between the support material 592 and the gate support 516; the conductive material 532 may be conformally deposited on this assembly (e.g., using the techniques discussed above with reference to FIG. 70); and then a directional etch may be performed on the conductive material 532, resulting in an assembly similar to that illustrated in FIG. 72 but with insulating material on the side face 597 of the support material 592 and the side face 566 of the gate support 516. This assembly may be processed in substantially the same manner as discussed below, and thus represents one alternative approach to that explicitly illustrated in FIGS. 68-79.

Figure 73A:
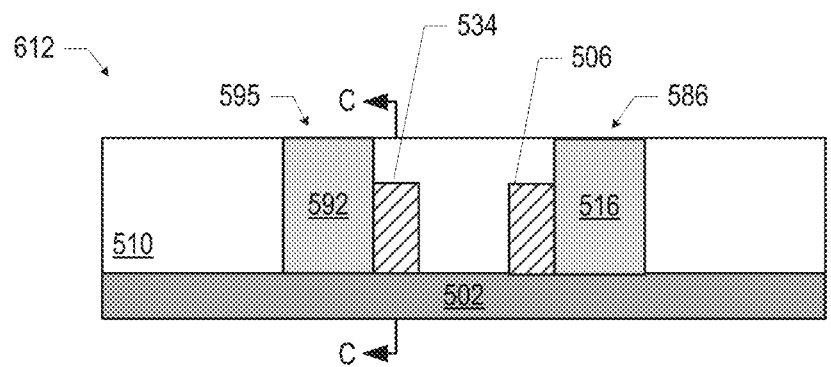
Figure 73B:
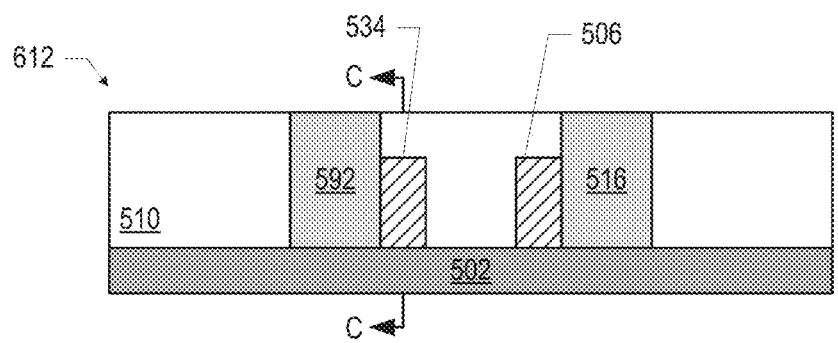
Figure 73C:
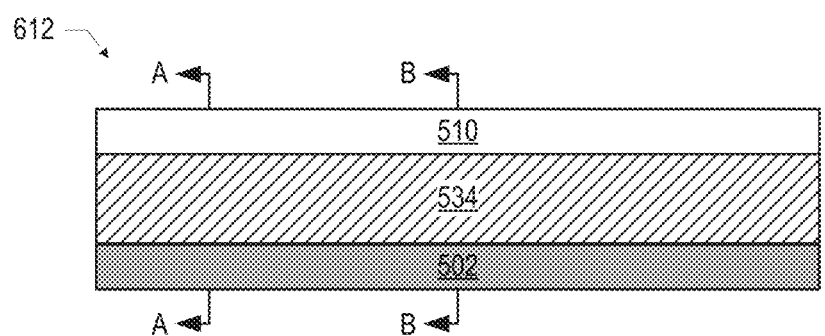

FIG. 73 depicts an assembly 612 subsequent to depositing an insulator 510 on the assembly 610 (FIG. 72). In the assembly 612, the top face 595 of the support material 592 and the top face 586 of the gate support 516 are shown as exposed, but in other embodiments, the insulator 510 may extend over the top face 595 and the top face 586. In some embodiments, deposition of the insulator 510 may be followed by a polishing step in which the insulator 510 is polished to create a flat face (e.g., by chemical mechanical polishing); in some such embodiments, the top face 595 and the top face 586 may be exposed subsequent to polishing.

Figure 74A:
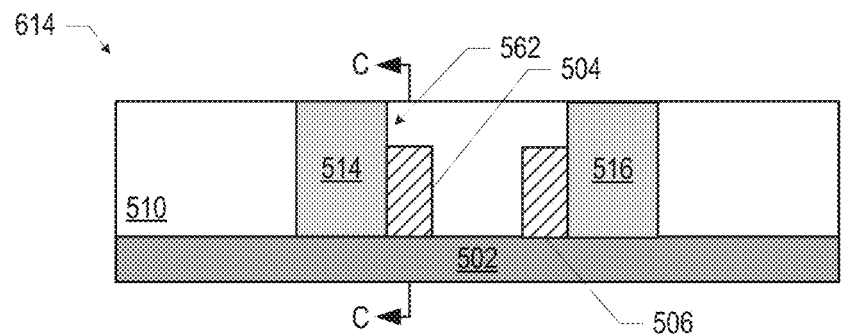
Figure 74B:
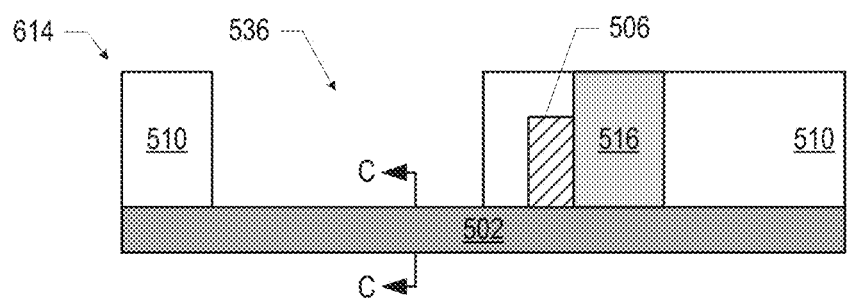
Figure 74C:
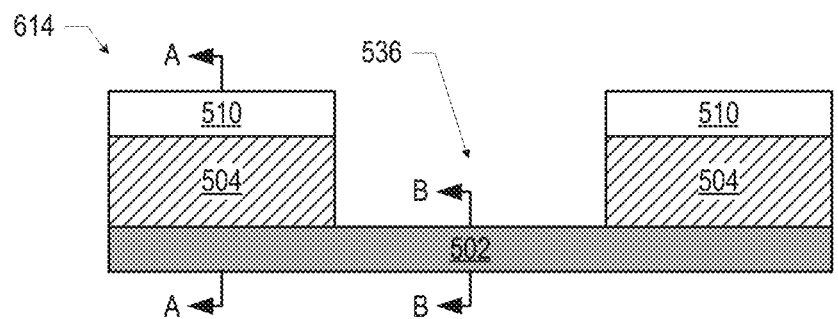

FIG. 74 depicts an assembly 614 subsequent to forming a recess 536 in the assembly 612 (FIG. 73). The recess 536 may have the footprint of the dielectric 508 illustrated in FIG. 67F (e.g., a substantially rectangular footprint), and may divide the support material 592 of FIG. 73 into the two S/D supports 514, and thus the lateral dimensions of the recess 536 may take any of the forms of the lateral dimensions 530 and 528 discussed herein. The recess 536 may similarly divide the conductive material 534 into two S/D electrodes 504 (disposed on the side faces 562 of the S/D supports 514). The recess 536 may be spaced apart from the gate electrode 506 by a portion of the insulator 510, as shown. Any suitable technique may be used to form the recess 536, and the appropriate technique may depend on the desired dimensions of the recess 536. In some embodiments, the recess 536 may be formed by a hole shrink technique, or extreme ultraviolet lithography, for example.

Figure 75A:
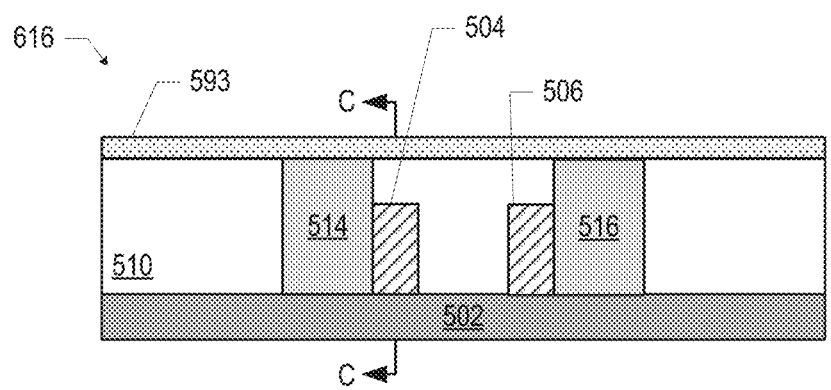
Figure 75B:
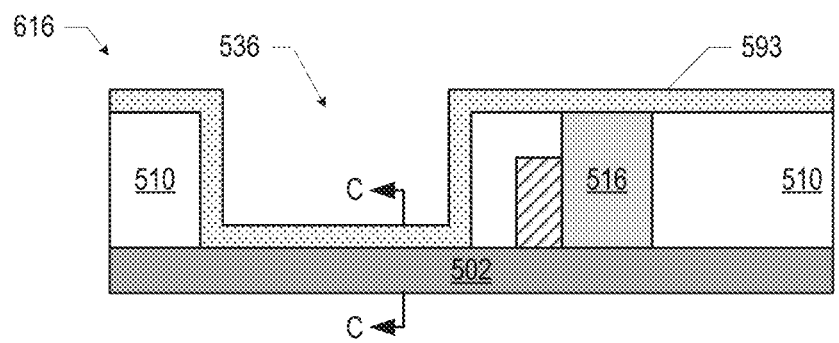
Figure 75C:
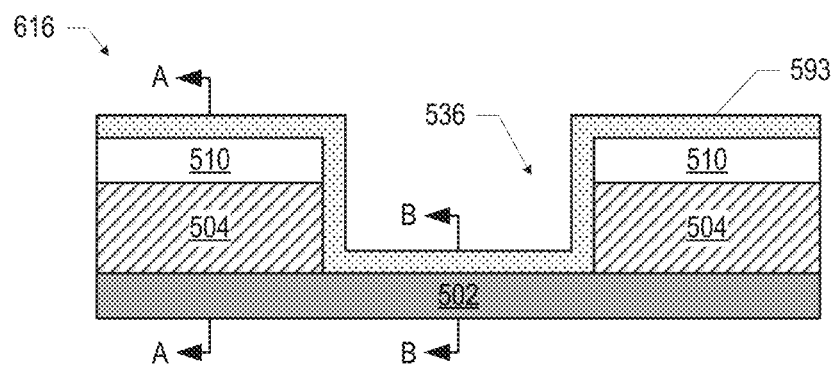

FIG. 75 depicts an assembly 616 subsequent to conformally depositing a dielectric material 593 on the assembly 614 (FIG. 74). The dielectric material 593 may be the material of the dielectric 508 (as discussed below), and it may be deposited on the sidewalls and bottom of the recess 536, as shown. The thickness of the dielectric material 593 may be substantially equal to the thickness 524, discussed above. Such conformal deposition may be performed by, for example, ALD (which may provide a desirably well-controlled deposition thickness).

Figure 76A:
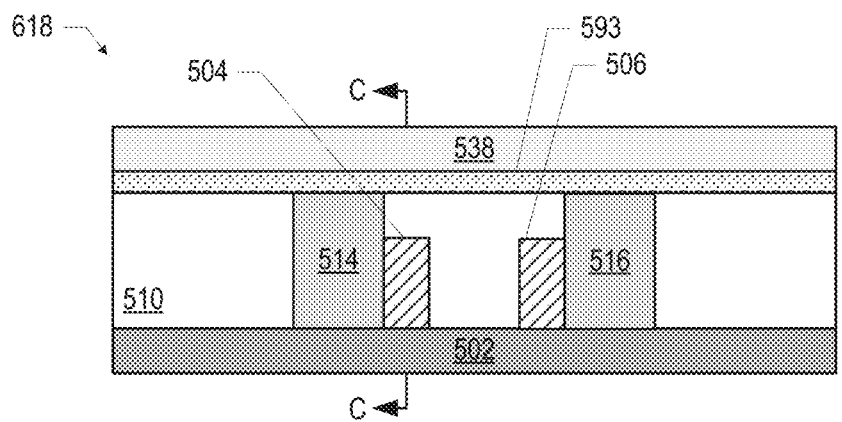
Figure 76B:
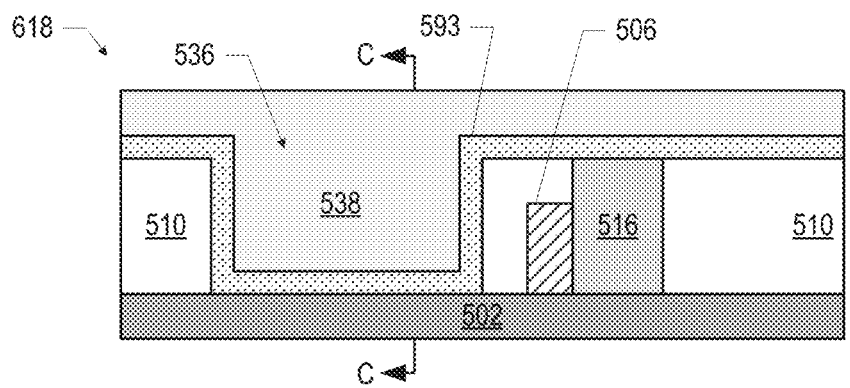
Figure 76C:
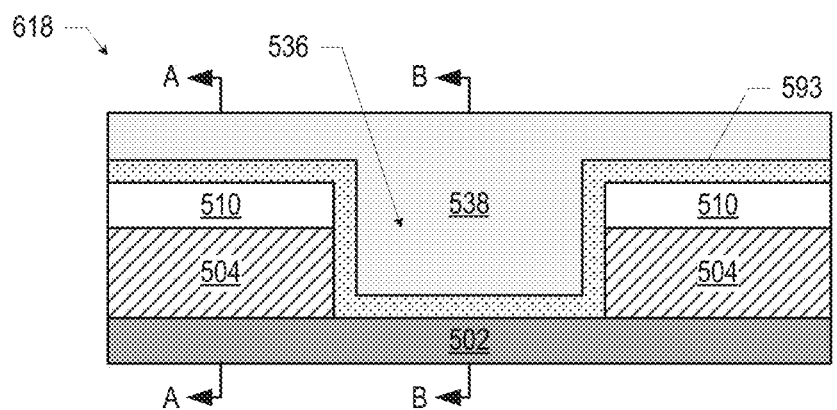

FIG. 76 depicts an assembly 618 subsequent to depositing an island material 538 on the assembly 616 (FIG. 75). The island material 538 may, as illustrated in FIG. 76, fill the recess 536, and in some embodiments, may extend beyond the recess 536 and over the S/D supports 514 and the gate support 516. The island material 538 may be deposited using any suitable technique, such as chemical vapor deposition (CVD) or atomic layer deposition (ALD).

Figure 77A:
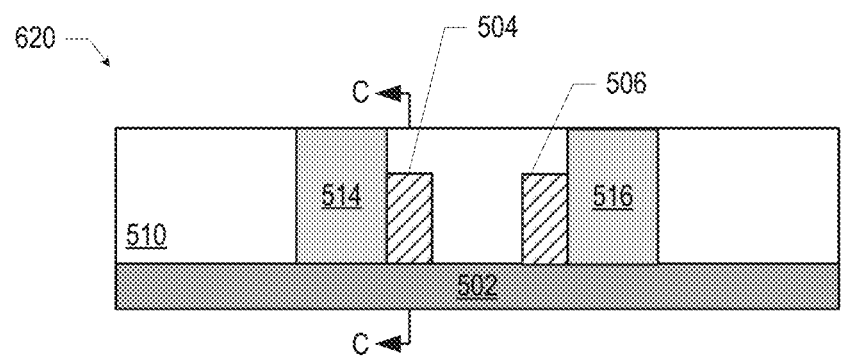
Figure 77B:
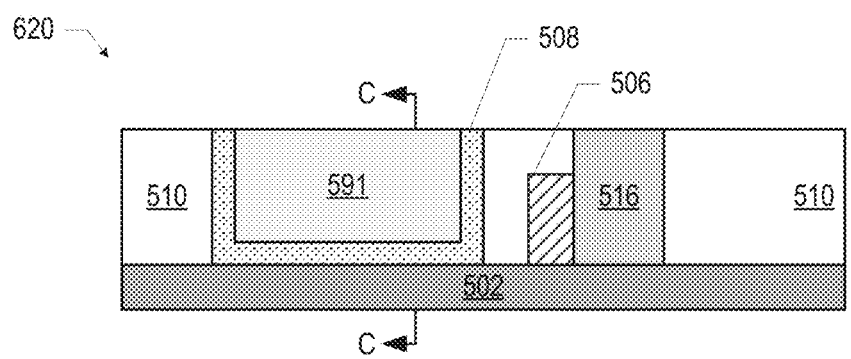
Figure 77C:
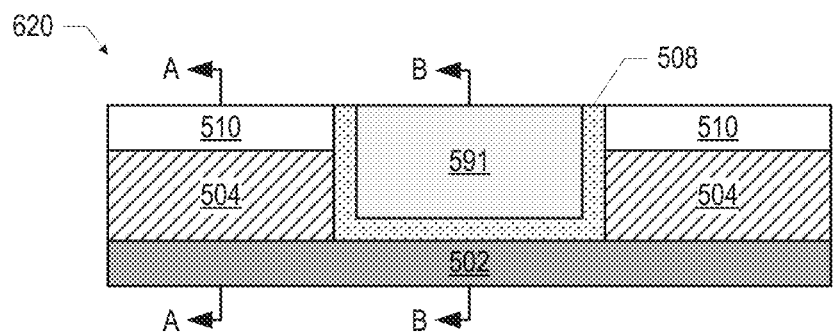

FIG. 77 depicts an assembly 620 subsequent to polishing the assembly 618 (FIG. 76) to remove the dielectric material 593 and the island material 538 that extended beyond the recess 536 in the assembly 618, forming the dielectric 508 and island material 591, respectively. In some embodiments, a CMP technique may be used to polish the assembly 618. In some embodiments, this polishing operation may not remove all of the dielectric material 593 that extends beyond the recess 536; some or all of that "excess" dielectric material 593 may remain in the assembly 620.

Figure 78A:
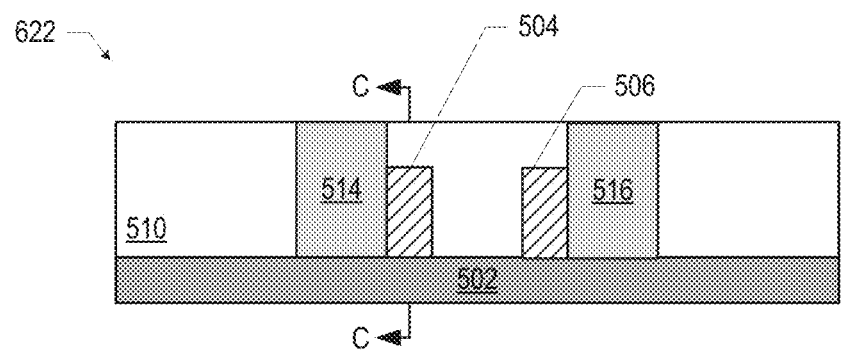
Figure 78B:
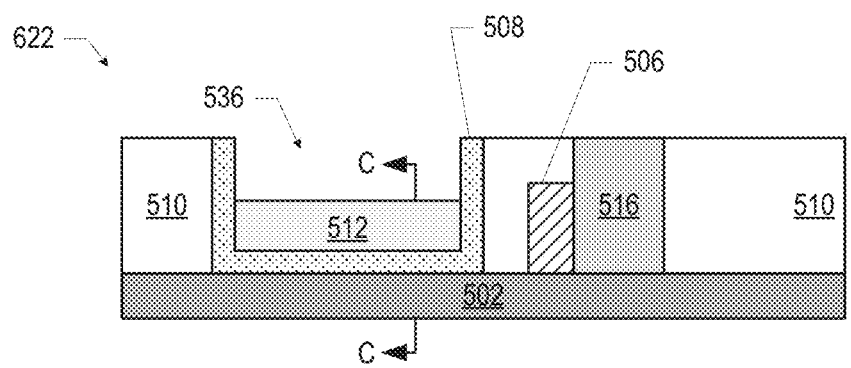
Figure 78C:
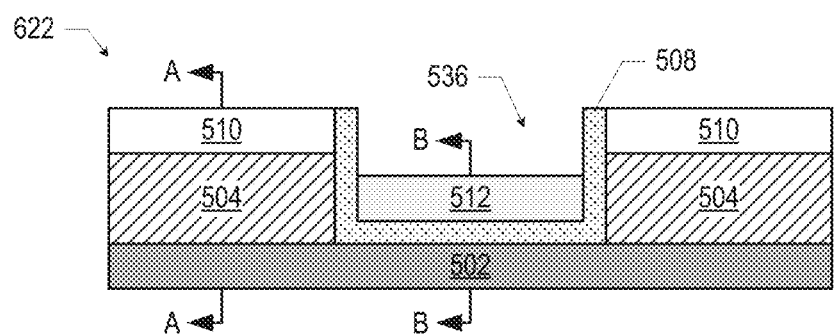

FIG. 78 depicts an assembly 622 subsequent to recessing the island material 591 of the assembly 620 (FIG. 77) back into the recess 536 to form the island 512. The island material 591 may be recessed using any suitable technique (e.g., using a dry etch, followed by a wet clean, as appropriate for the material composition of the island material 591).

Figure 79A:
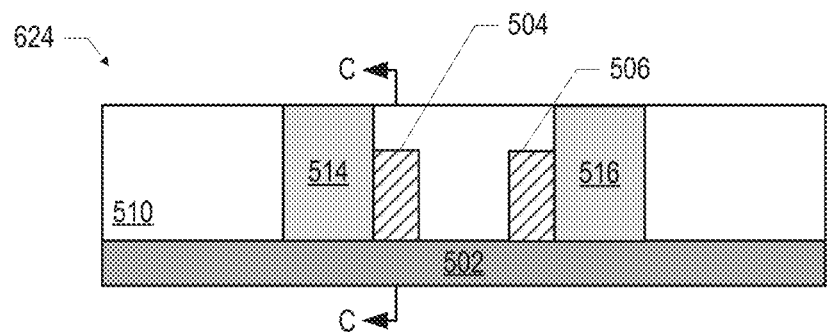
Figure 79B:
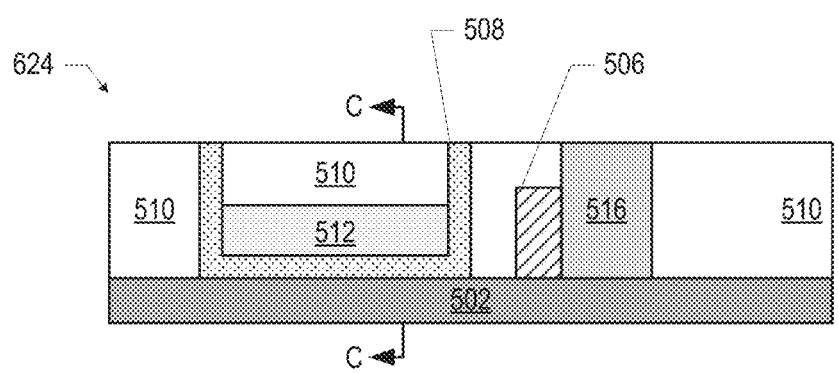
Figure 79C:
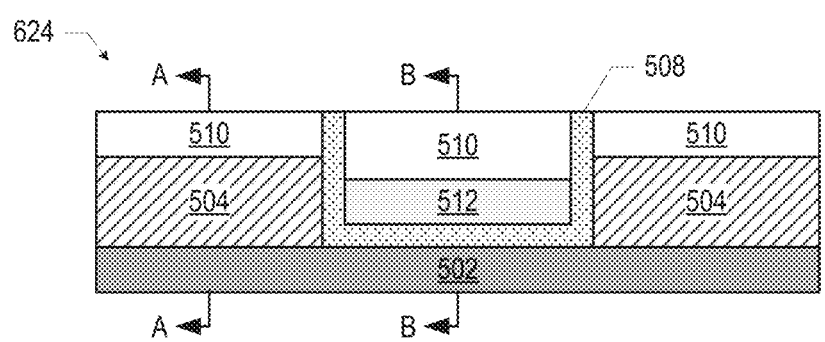
Figure 80A:
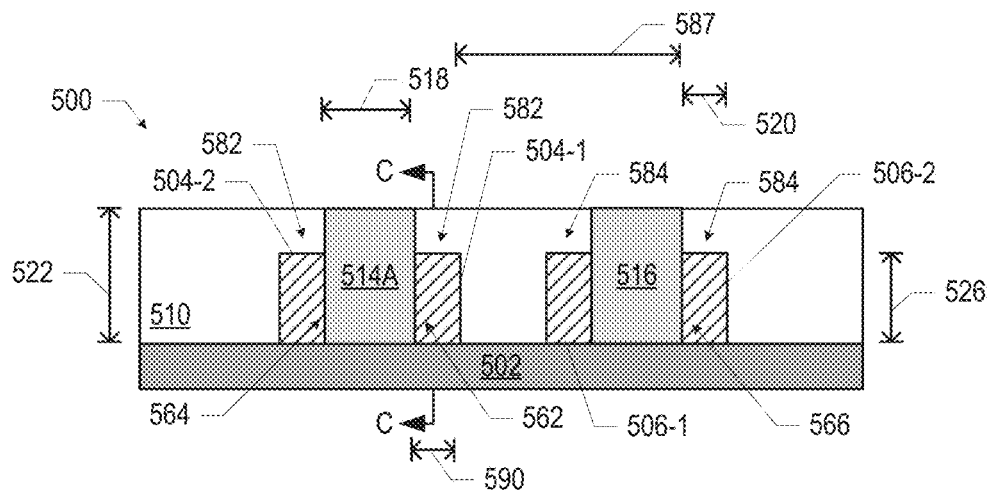
FIGS. 80A-80F are various views of another SET device, in accordance with various embodiments.
Figure 80B:
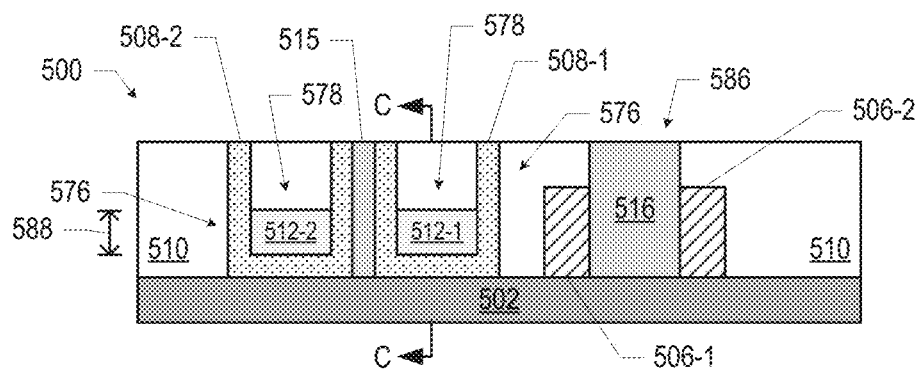
Figure 80C:
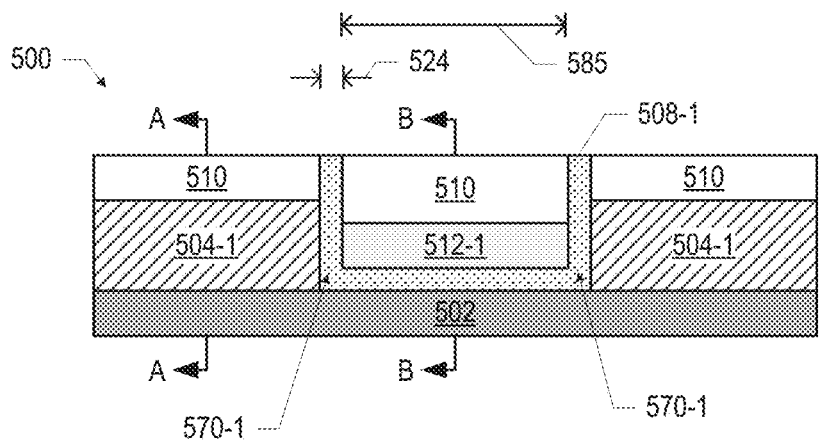
Figure 80D:
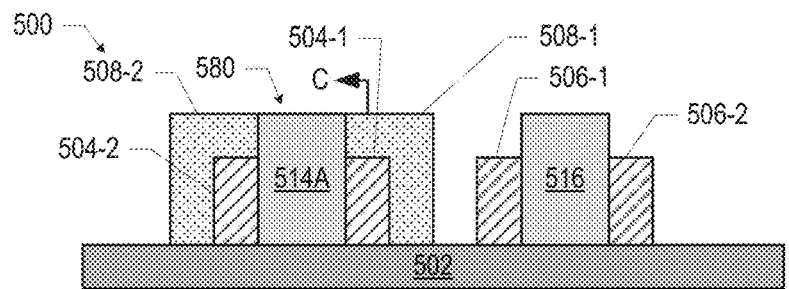
Figure 80E:
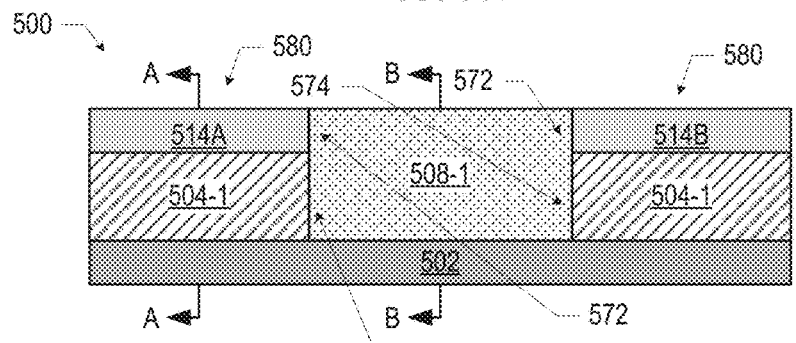
Figure 80F:
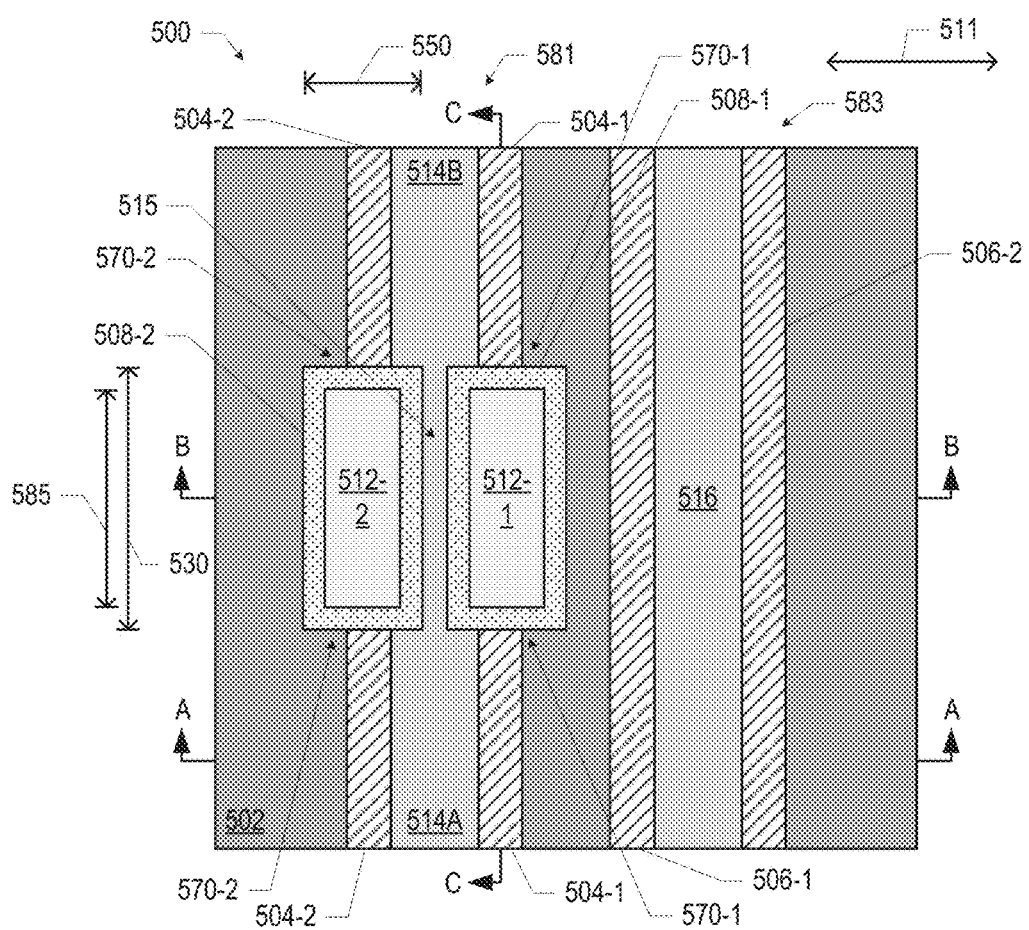

FIG. 79 depicts an assembly 624 subsequent to providing additional insulator 510 in the recess 536 of the assembly 622 (FIG. 78) above the island 512. The additional insulator 510 may be provided using any of the techniques discussed above with reference to FIG. 73. The assembly 624 may take the form of the SET device 500 discussed above with reference to FIG. 67. In some embodiments, the additional insulator 510 may extend beyond the recess 536, and may be deposited over all of the assembly 622; this is not shown in FIG. 79 for economy of illustration. As discussed below with reference to FIG. 91, conductive pathways (including, e.g., conductive vias) may extend through the insulator 510 to make contact with the S/D electrodes 504 and the gate electrode 506.

FIG. 80 provides various views of a second embodiment of a SET device 500. In particular, FIG. 80A is a cross-sectional view of the SET device 500 through the section A-A of FIGS. 80C, 80E, and 80F; FIG. 80B is a cross-sectional view of the SET device 500 through the section B-B of FIGS. 80C, 80E, and 80F; FIG. 80C is a cross-sectional view of the SET device 500 through the section C-C of FIGS. 80A, 80B, 80D, and 80F; FIG. 80D is a side view of the SET device 500 toward the section A-A with the insulator 510 removed; FIG. 80E is a side view of the SET device 500 toward the section C-C from the gate electrode 506-1 with the insulator 510 removed; and FIG. 80F is a top view of the SET device 500 with the insulator 510 removed. As discussed below, FIG. 80 depicts one complete SET, and two "halves" of additional SETs 500.

As illustrated in FIG. 80, the SET device 500 may include an S/D structure 581 including two source/drain (S/D) supports 514A and 514B disposed on a substrate 502. The S/D structure 581 may also include support material 515 between the S/D supports 514A and 514B. In some embodiments, the S/D supports 514A and 514B and the support material 515 may be materially contiguous (e.g., as discussed below with reference to FIGS. 81-82). Reference to an "S/D support 514" may refer to both the S/D supports 514A and 514B. Each S/D support 514 may have an S/D electrode 504-1 disposed on a side face 562 of the S/D support 514. Two S/D electrodes 504-1 of the S/D structure 581 may be spaced apart by intervening dielectric 508-1 and an island 512-1. In particular, a SET may include two TJs 570-1, each formed by a portion of dielectric 508-1 "sandwiched" between an S/D electrode 504-1 and the island 512-1.

A gate structure 583 including a gate support 516 may also be disposed on the substrate 502. The gate structure 583 may also include a gate electrode 506-1 disposed on a side face 568 of the gate support 516. During use, as discussed above with reference to FIG. 67, voltages may be applied to the gate electrode 506-1 and the S/D electrodes 504-1 to control electron transport and electron occupancy in the island 512-1; the gate electrode 506-1, the S/D electrodes 504-1, the dielectric 508-1, and the island 512-1 may thus together provide a SET.

FIG. 80 also illustrates portions of additional SETs. In particular, the S/D structure 581 may include additional S/D electrodes 504-2 disposed on the side faces 564 of the S/D supports 514 (opposite to the side faces 562). The two S/D electrodes 504-2 may be spaced apart by intervening dielectric 508-2 and an island 512-2. In particular, this arrangement may result in two TJs 570-2, each formed by a portion of dielectric 508-2 "sandwiched" between an S/D electrode 504-2 and the island 512-2. Similarly, the gate structure 583 may include an additional gate electrode 506-2 disposed on the side face 566 of the gate support 516 (opposite to the side face 568). If the S/D structures 581 and the gate structures 583 of FIG. 80 are repeatedly alternatingly arranged (continuing the pattern illustrated in FIG. 80), the gate electrode 506-2 of an additional gate structure 583 (not shown) disposed to the "left" of the S/D structure 581 of FIG. 80F may, together with the S/D electrodes 504-2, the dielectric 508-2, and the island 512-2, provide another SET. In this manner, an array of SETs may be formed. Use of these SETs may take the form of any of the embodiments disclosed herein.

Reference to a "dielectric 508" may refer to both the dielectrics 508-1 and 508-2, and reference to an "island 512" may refer to both the islands 512-1 and 512-2. Similarly, reference to an "S/D electrode 504" may refer to both the S/D electrodes 504-1 and 504-2, and reference to a "gate electrode 506" may refer to both the gate electrodes 506-1 and 506-2.

The dielectrics 508 of FIG. 80 may extend up the sidewalls 572 of the S/D supports 514, and up the sidewalls 574 of the S/D electrodes 504. In some embodiments, the dielectrics 508 may extend along the substrate 502 between the S/D supports 514 and the S/D electrodes 504 such that a portion of the dielectrics 508 is disposed between the islands 512 and the substrate 502. The dielectrics 508 may also extend up sidewalls 576 of the insulator 510, as shown.

The islands 512 of FIG. 80 may be disposed at the bottom of the "boxes" formed by the dielectrics 508. In some embodiments, the top faces 578 of the islands 512 may be recessed back from the top faces 580 of the S/D supports 514; in some such embodiments, portions of the insulator 510 may be disposed in the "boxes" formed by the dielectrics 508 such that the islands 512 are disposed between these portions of the insulator 510 and the substrate 502.

In some embodiments, the top faces 582 of the S/D electrodes 504 of FIG. 80 may be recessed back from the top faces 580 of the S/D supports 514. Similarly, in some embodiments, the top faces 584 of the gate electrodes 506 may be recessed back from the top face 586 of the gate support 516. The dimensions 524, 588, 526, 522, 518, 590, 520, 530, 585, and 587 of FIG. 80 may take any of the forms discussed above with reference to the SET device 500 of FIG. 67.

As illustrated in FIG. 80, in some embodiments, the dielectrics 508 may laterally extend beyond the area between the two S/D supports 514 (e.g., in the dimension indicated by the arrow 511). The dielectrics 508 may also laterally extend beyond the area between the two S/D electrodes 504. Similarly, in some embodiments, the islands 512 may laterally extend beyond the area between the two S/D supports 514, and the islands 512 may laterally extend beyond the area between the two associated S/D electrodes 504. In some embodiments, the dielectric 508 may have a lateral dimension 550 (perpendicular to the axis between the S/D electrodes 504) between 10 and 50 nanometers (e.g., 20 nanometers).

Any suitable materials discussed above with reference to the SET device 500 of FIG. 67 may be used in the SET device 500 of FIG. 80. Additionally, although a single complete SET is illustrated in FIG. 80 (and a one-dimensional array of the SETs of FIG. 80 is discussed above), a device may include a two-dimensional array of the SETs illustrated in FIG. 80 (or any other arrangement of multiple SETs).

Any suitable process may be used to manufacture the SET device 500 of FIG. 80. For example, FIGS. 81-84 depict various cross-sectional views of stages in an example process for manufacturing the SET device 500 of FIG. 80. The materials and dimensions of various components of the stages illustrated in FIGS. 81-84 may take the form of any of the embodiments discussed herein. In FIGS. 81-84, the "A" sub-figures represent cross-sectional views through the section A-A (analogous to FIG. 80A), the "B" sub-figures represent cross-sectional views through the section B-B (analogous to FIG. 80B), and the "C" sub-figures represent cross-sectional views through the section C-C (analogous to FIG. 80C).

Figure 81A:
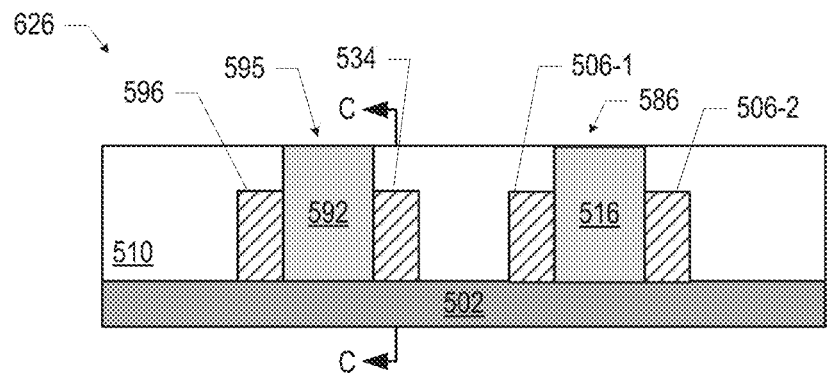
FIGS. 81A-81C, 82A-82C, 83A-83C, and 84A-84C illustrate various example stages in the manufacture of the SET device of FIGS. 80A-80F, in accordance with various embodiments.
Figure 81B:
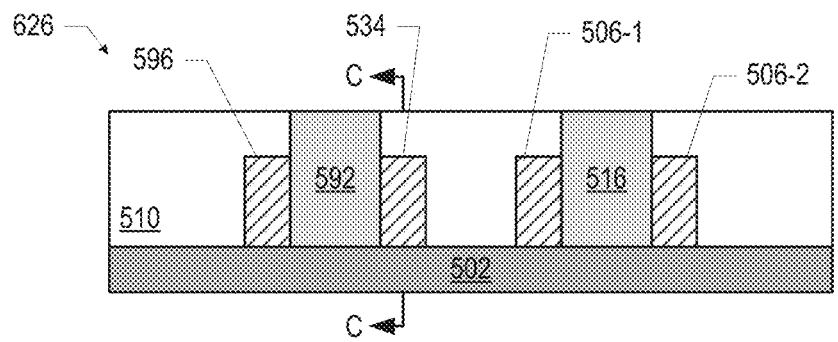
Figure 81C:
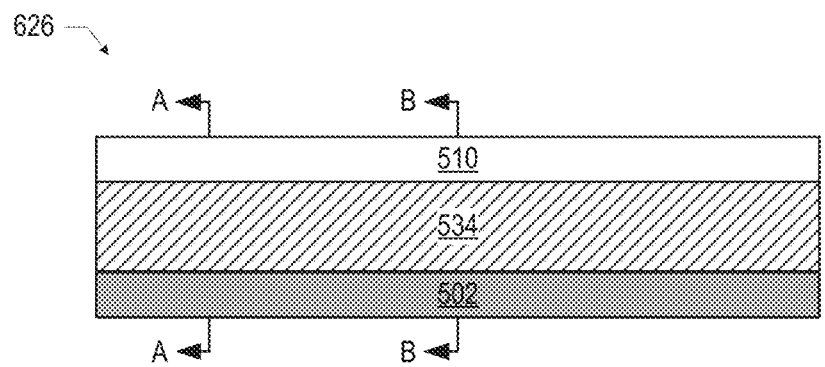

FIG. 81 depicts an assembly 626 subsequent to depositing an insulator 510 on the assembly 608 (FIG. 71). In contrast to the manufacturing process discussed above with reference to FIG. 67, the conductive material 596 disposed on the side face 597 of the support material 592 may not be removed (as discussed above with reference to FIG. 72); similarly, the conductive material 594 disposed on the side face 566 of the gate support 516 in FIG. 71 may not be removed. In FIG. 81, the conductive material 594 is relabeled as 506-2, consistent with FIG. 80, and the gate electrode 506 of FIG. 71 is relabeled as the gate electrode 506-1. In the assembly 626, the top face 595 of the support material 592 and the top face 586 of the gate support 516 are shown as exposed, but in other embodiments, the insulator 510 may extend over the top face 595 and the top face 586. In some embodiments, deposition of the insulator 510 may be followed by a polishing step in which the insulator 510 is polished to create a flat face (e.g., by chemical mechanical polishing); in some such embodiments, the top face 595 and the top face 586 may be exposed subsequent to polishing.

Figure 82A:
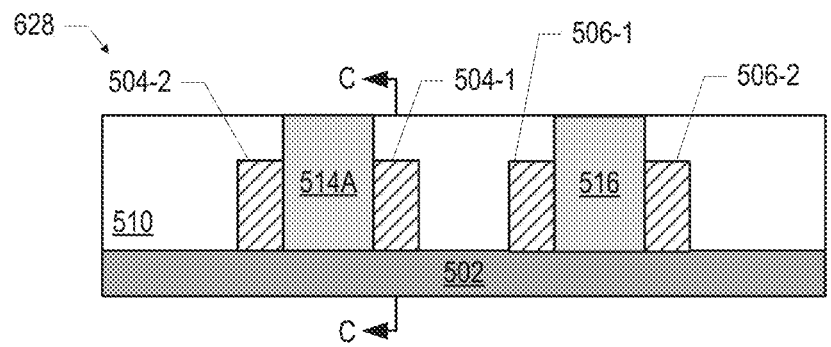
Figure 82B:
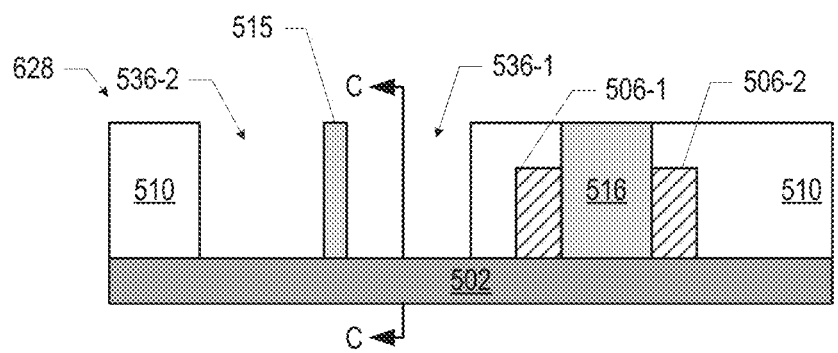
Figure 82C:
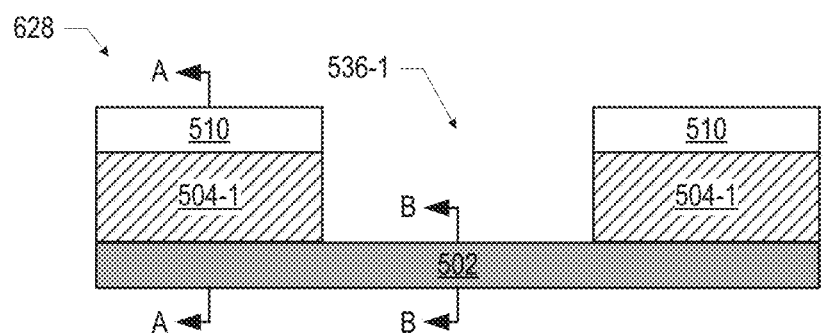

FIG. 82 depicts an assembly 628 subsequent to forming two recesses 536-1 and 536-2 in the assembly 626 (FIG. 81). Reference to a "recess 536" may refer to both the recesses 536-1 and 536-2. The recesses 536 may have the footprints of the dielectrics 508 illustrated in FIG. 80F (e.g., substantially rectangular footprints), and may divide the support material 592 of FIG. 81 into the two S/D supports 514A and 514B, joined by the support material 515. The lateral dimensions of the recesses 536 may take any of the forms of the lateral dimensions 550 and 530 discussed herein. The recess 536-1 may divide the conductive material 534 into two S/D electrodes 504-1 (disposed on the side faces 562 of the S/D supports 514), and the recess 536-2 may divide the conductive material 534 into two S/D electrodes 504-2 (disposed on the side faces 564 of the S/D supports 514). The recess 536-1 may be spaced apart from the gate electrode 506-1 by a portion of the insulator 510, as shown. The recesses 536-1 and 536-2 may be spaced apart from each other by the support material 515. The recesses 536-1 and 536-2 may be formed using any of the techniques discussed above with reference to FIG. 74.

Figure 83A:
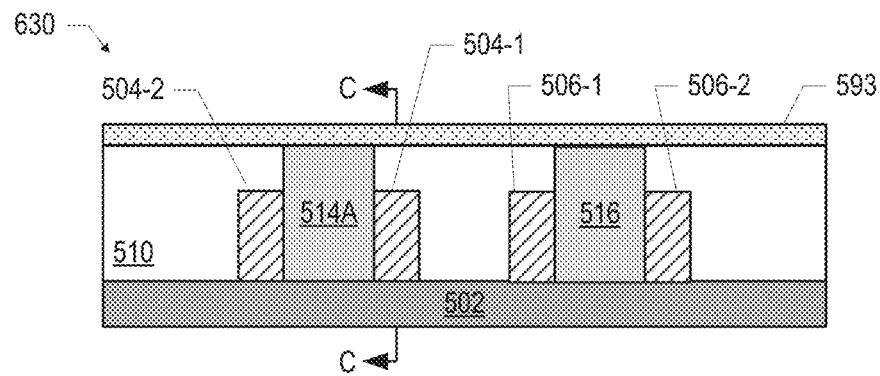
Figure 83B:
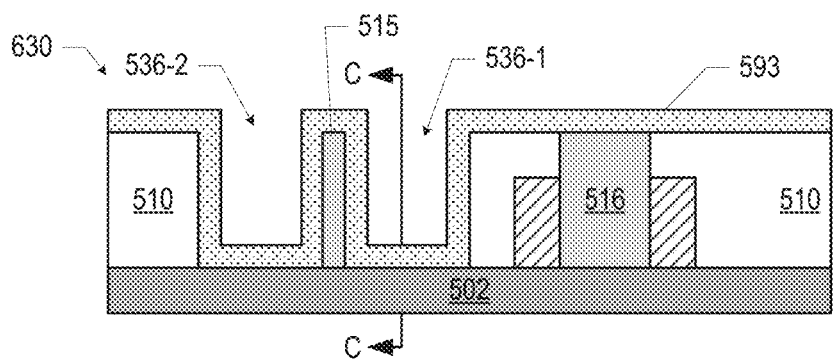
Figure 83C:
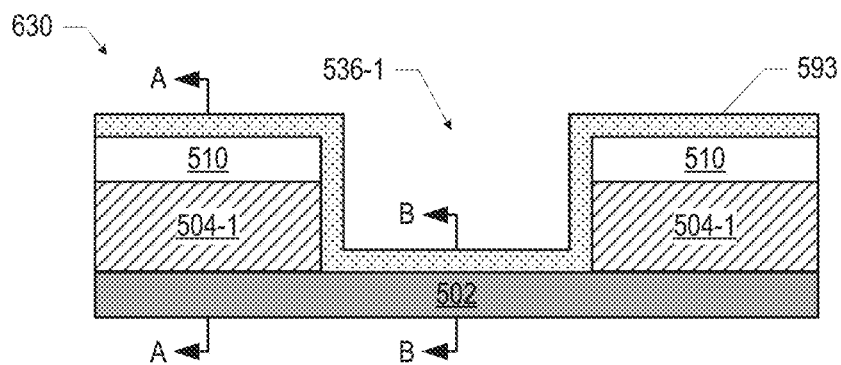

FIG. 83 depicts an assembly 630 subsequent to conformally depositing a dielectric material 593 on the assembly 628 (FIG. 82). The dielectric material 593 may be the material of the dielectrics 508, and it may be deposited on the sidewalls and bottom of the recesses 536-1 and 536-2, as shown. The thickness of the dielectric material 593 may be substantially equal to the thickness 524, discussed above. Such conformal deposition may be performed by, for example, ALD.

Figure 84A:
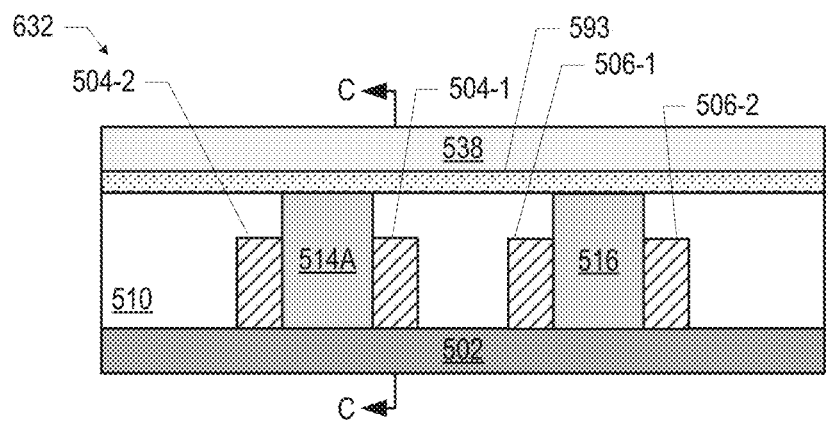
Figure 84B:
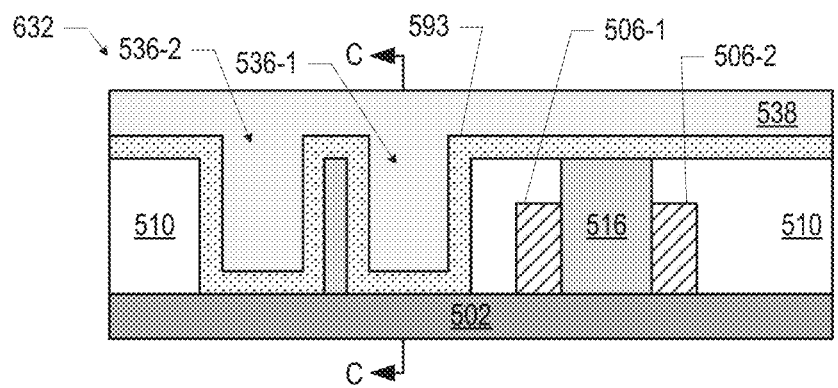
Figure 84C:
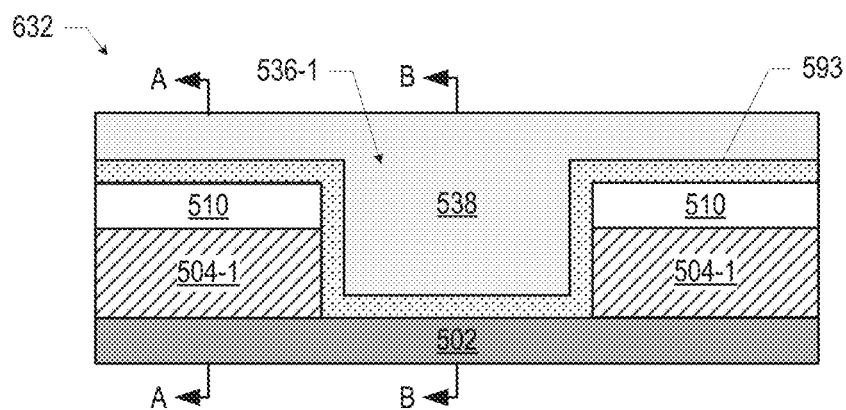

FIG. 84 depicts an assembly 632 subsequent to depositing an island material 538 on the assembly 630 (FIG. 83). The island material 538 may, as illustrated in FIG. 84, fill the recesses 536, and in some embodiments, may extend beyond the recess 536 and over the S/D supports 514 and the gate support 516. The island material 538 may be deposited using any suitable technique, such as those discussed above with reference to FIG. 76. The assembly 632 may be further processed as discussed above with reference to FIGS. 77-79 to form the SET device 500 illustrated in FIG. 80.

FIG. 85 provides various views of a third embodiment of a SET device 500. In particular, FIG. 85A is a cross-sectional view of the SET device 500 through the section A-A of FIGS. 85C, 85E, and 85F; FIG. 85B is a cross-sectional view of the SET device 500 through the section B-B of FIGS. 85C, 85E, and 85F; FIG. 85C is a cross-sectional view of the SET device 500 through the section E-E of FIGS. 85A, 85B, 85D, and 85F; FIG. 85D is a side view of the SET device 500 toward the section A-A with the insulator 510 removed; FIG. 85E is a side view of the SET device 500 toward the section E-E from the gate electrodes 506 with the insulator 510 removed; and FIG. 85F is a top view of the SET device 500 with the insulator 510 removed.

As illustrated in FIG. 85, the SET device 500 may include an S/D structure 581 including S/D electrodes 504 disposed on a substrate 502. The S/D electrodes 504 of the S/D structure 581 may be spaced apart by intervening dielectric 508 and an island 512. The S/D structure 581 may include two TJs 570, each formed by a portion of dielectric 508 "sandwiched" between an S/D electrode 504 and the island 512.

A gate structure 583 may be spaced apart from the S/D structure 581 on the substrate 502, and may include a gate electrode 506. During use, as discussed above with reference to FIG. 67, voltages may be applied to the gate electrode 506 and the S/D electrodes 504 to control electron transport and electron occupancy in the island 512; the gate electrode 506, the S/D electrodes 504, the dielectric 508, and the island 512 of FIG. 85 may thus provide a SET.

The dielectric 508 of FIG. 85 may extend up the sidewalls 574 of the S/D electrodes 504. In some embodiments, the dielectric 508 may extend along the substrate 502 between the S/D electrodes 504 such that a portion of the dielectric 508 is disposed between the island 512 and the substrate 502. The dielectric 508 may also extend up sidewalls 576 of the insulator 510, as shown.

The island 512 of FIG. 85 may be disposed at the bottom of the "box" formed by the dielectric 508. In some embodiments, the top face 578 of the island 512 may be recessed back from the top faces 582 of the S/D electrodes 504; in some such embodiments, a portion of the insulator 510 may be disposed in the "box" formed by the dielectric 508 such that the island 512 is disposed between this portion of the insulator 510 and the substrate 502.

Figure 85A:
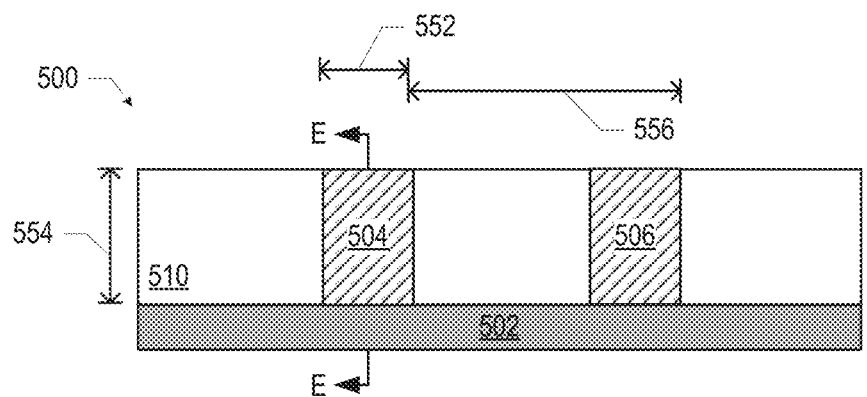
FIGS. 85A-85F are various views of another SET device, in accordance with various embodiments.
Figure 85B:
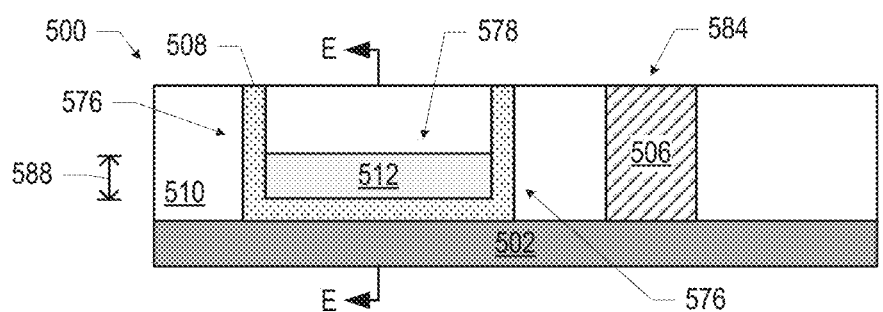
Figure 85C:
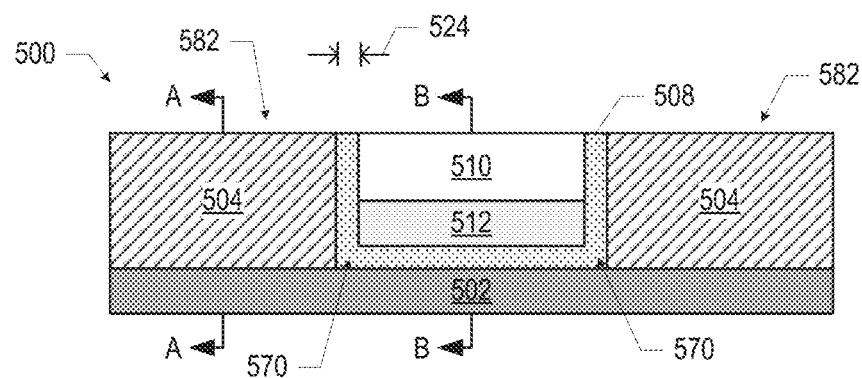
Figure 85D:
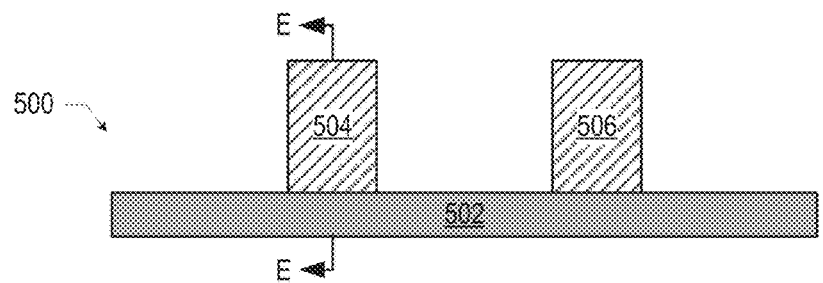
Figure 85E:
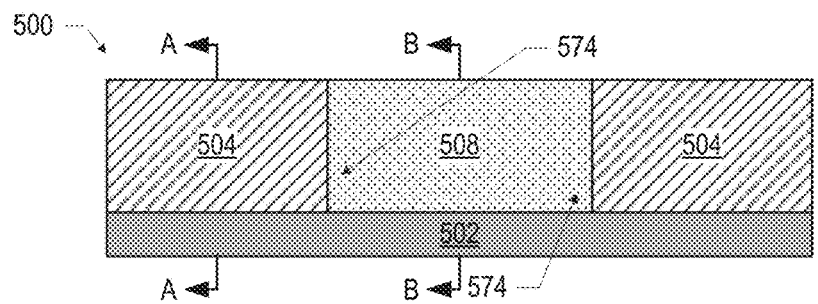
Figure 85F:
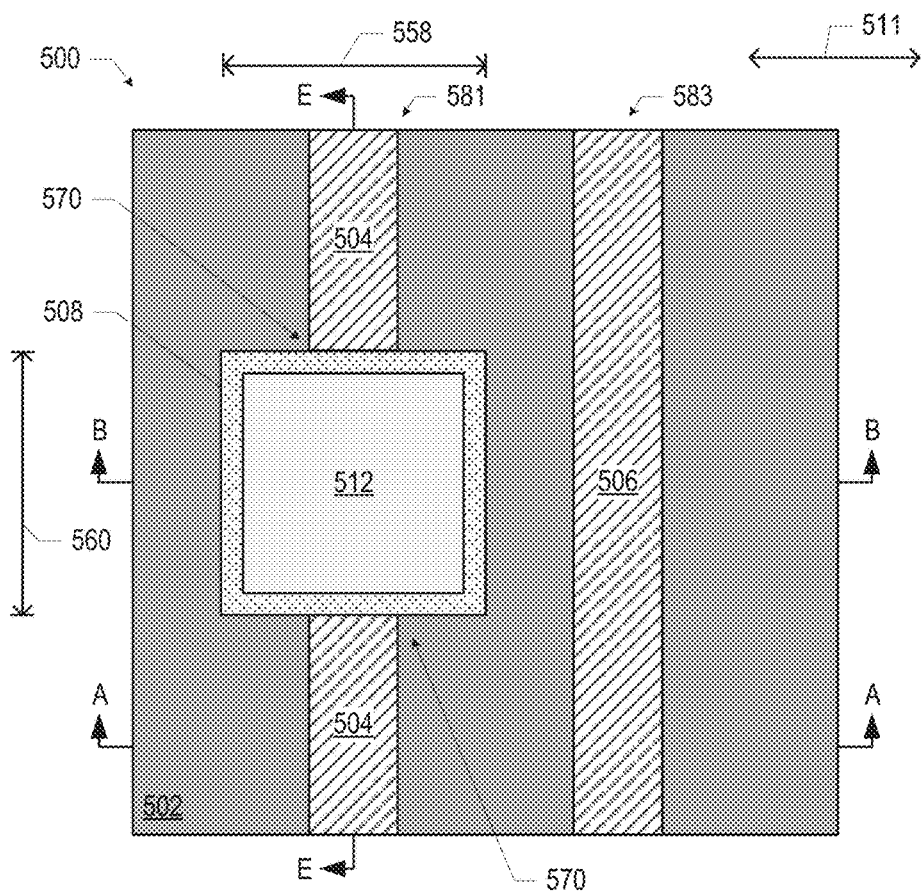

The width 552 and the height 554 of the S/D electrodes 504 may take any suitable values. For example, the width 552 may be between 20 and 80 nanometers (e.g., 40 nanometers), and the height 554 may be between 30 and 100 nanometers (e.g., 50 nanometers). The width and height of the gate electrode 506 may take the form of any of the embodiments of the width 552 and the height 554. In some embodiments, the spacing 556 of the S/D electrodes 504 and the gate electrode 506, as shown in FIG. 85A, may be between 80 and 200 nanometers (e.g., 100 nanometers). The dimensions 524 and 588 of FIG. 85 may take any of the forms discussed above with reference to the SET device 500 of FIG. 67.

As illustrated in FIG. 85, in some embodiments, the dielectric 508 may laterally extend beyond the area between the two S/D electrodes 504 (e.g., in the dimension indicated by the arrow 511). Similarly, in some embodiments, the island 512 may laterally extend beyond the area between the two S/D electrodes 504. In some embodiments, the dielectric 508 may have a lateral dimension 560 (parallel to the axis between the S/D electrodes 504) between 25 and 100 nanometers (e.g., 50 nanometers). In some embodiments, the dielectric 508 may have a lateral dimension 558 (perpendicular to the axis between the S/D electrodes 504) between 25 and 100 nanometers (e.g., 50 nanometers).

Any suitable materials discussed above with reference to the SET device 500 of FIG. 67 may be used in the SET device 500 of FIG. 85. Additionally, although a single complete SET device 500 is illustrated in FIG. 85, a device may include a one- or two-dimensional array of the SET devices 500 of FIG. 85 (or any other arrangement of multiple SET devices 500).

Figure 86A:
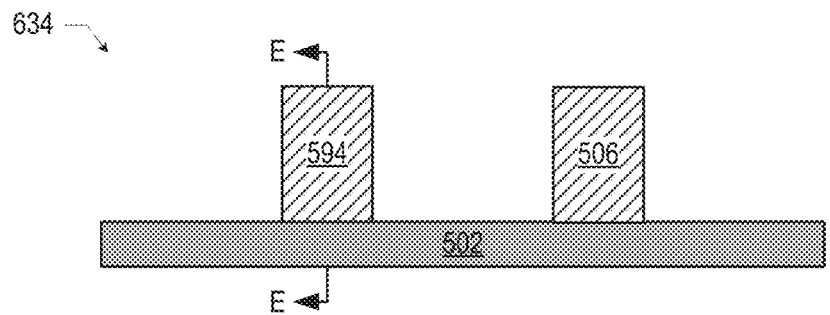
FIGS. 86A-86C, 87A-87C, and 88A-88C illustrate various example stages in the manufacture of the SET device of FIGS. 85A-85F, in accordance with various embodiments.
Figure 86B:
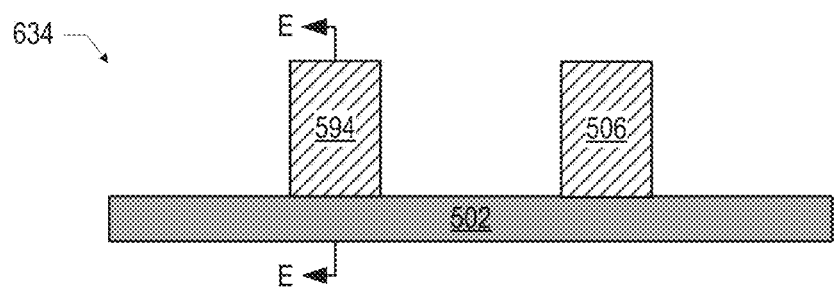
Figure 86C:
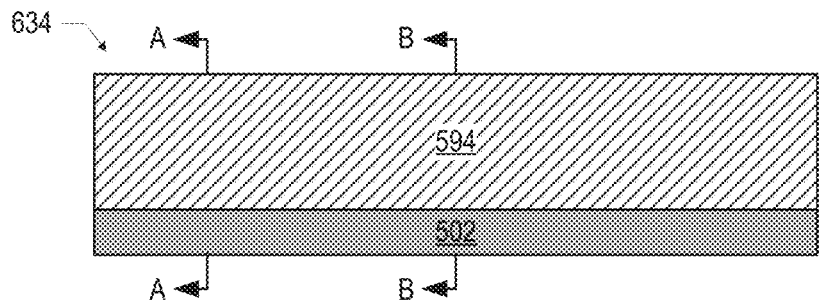
Figure 87A:
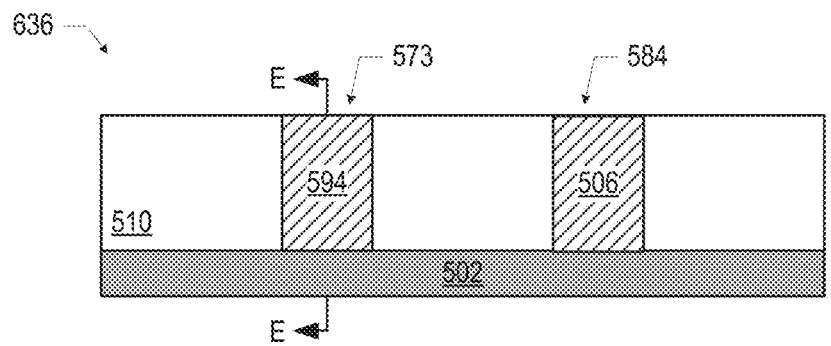
Figure 87B:
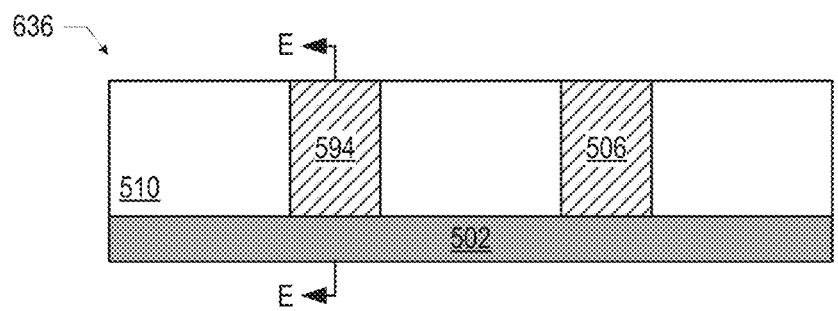
Figure 87C:
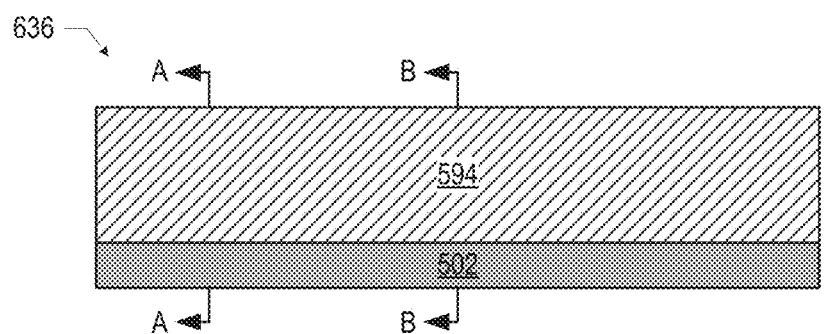
Figure 88A:
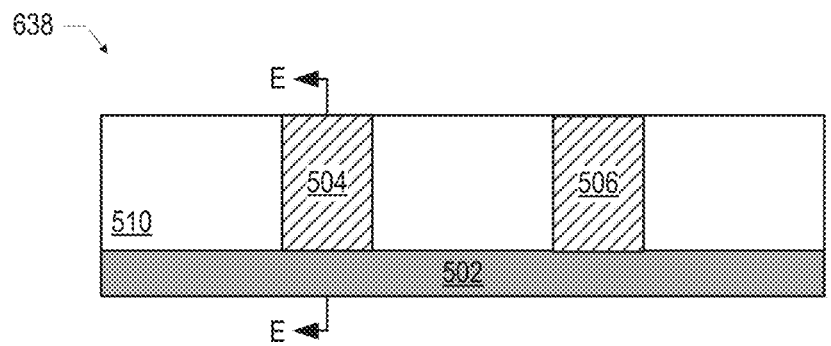
Figure 88B:
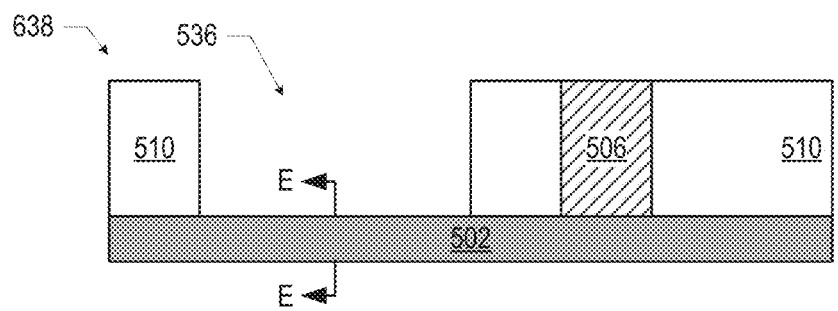
Figure 88C:
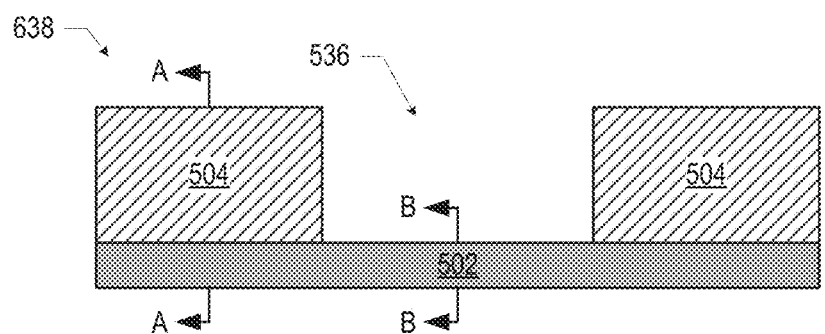
Figure 89A:
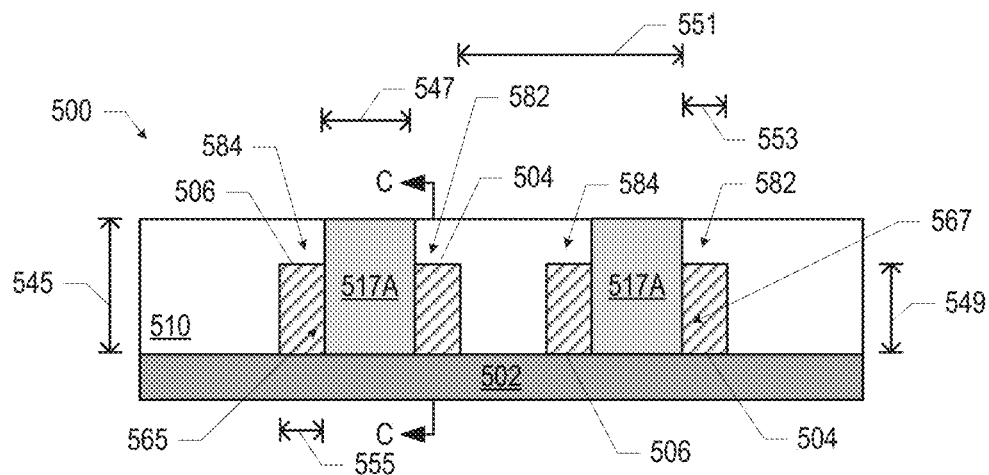
FIGS. 89A-89F are various views of another SET device, in accordance with various embodiments.
Figure 89B:
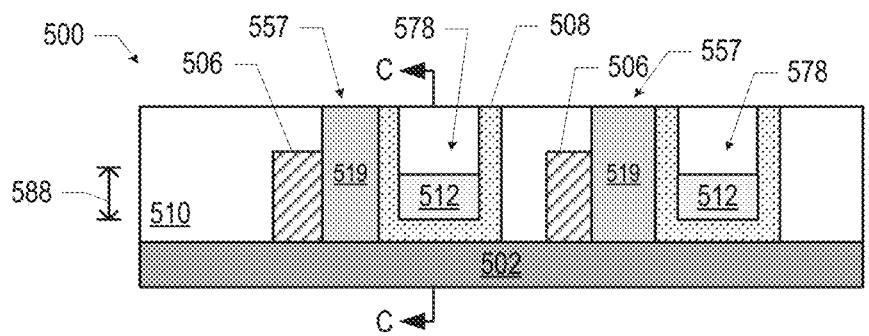
Figure 89C:
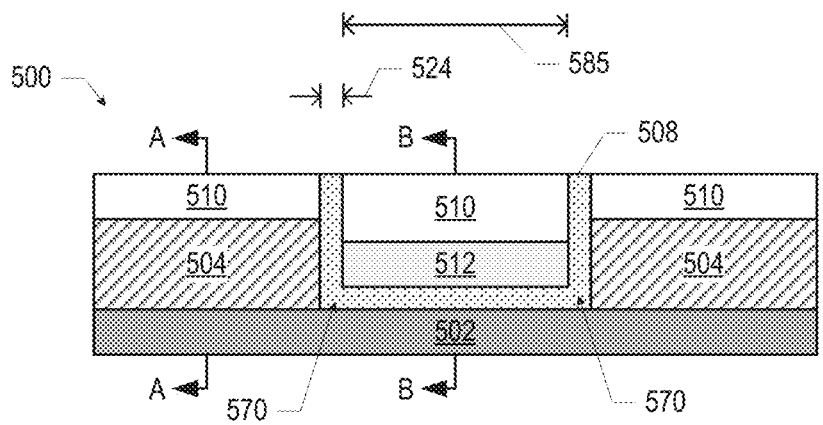
Figure 89D:
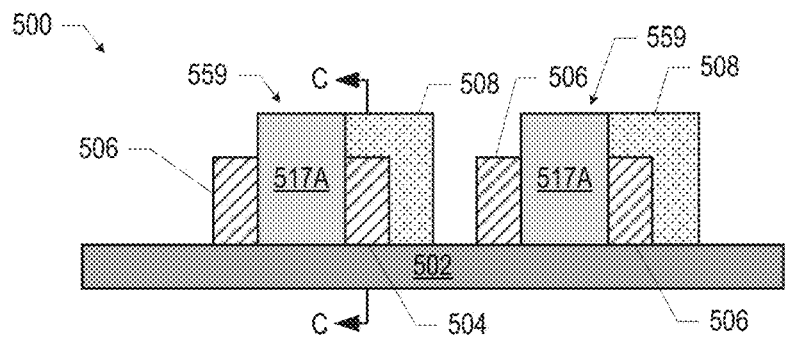
Figure 89E:
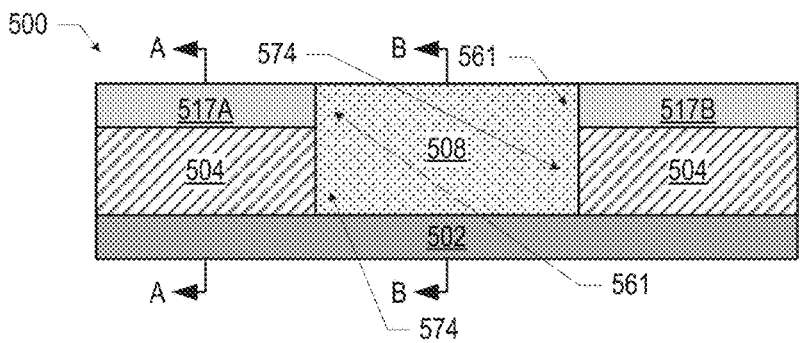
Figure 89F:
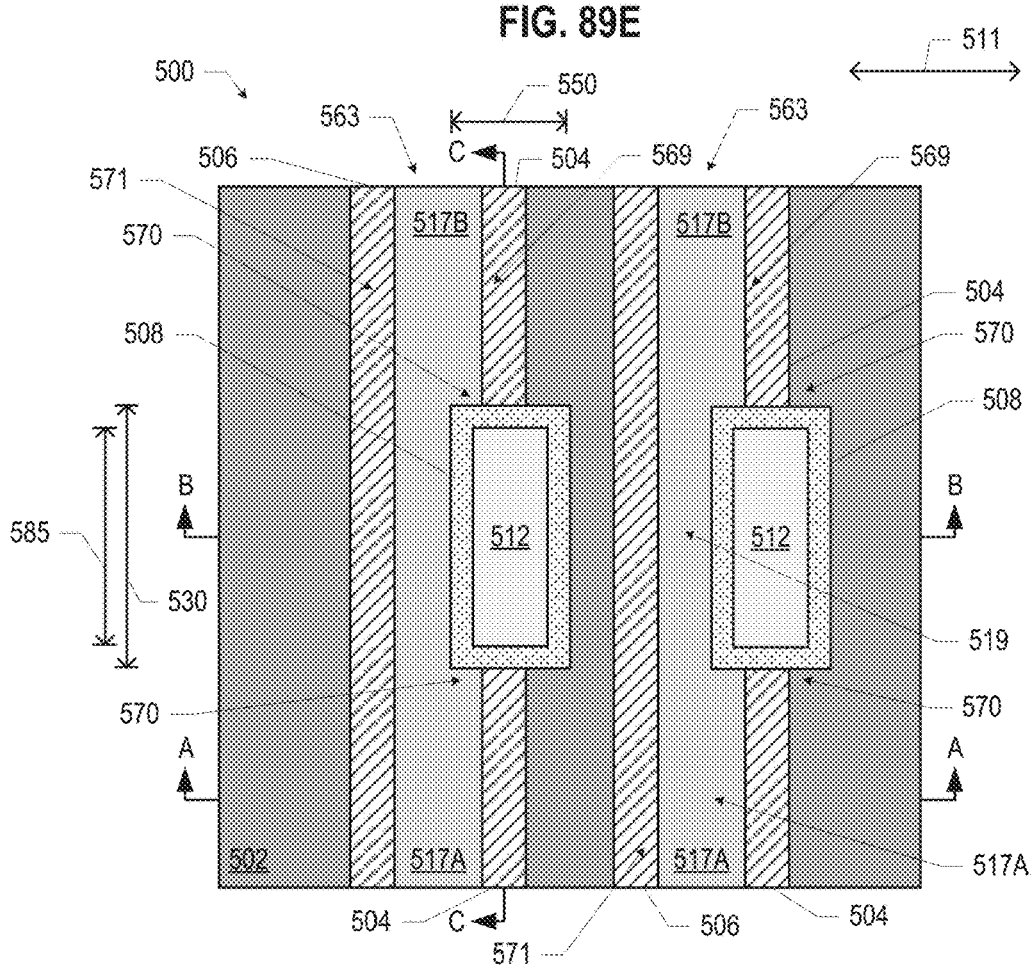

Any suitable process may be used to manufacture the SET device 500 of FIG. 85. For example, FIGS. 86-88 depict various cross-sectional views of stages in an example process for manufacturing the SET device 500 of FIG. 85. The materials and dimensions of various components of the stages illustrated in FIGS. 86-88 may take the form of any of the embodiments discussed herein. In FIGS. 86-88, the "A" sub-figures represent cross-sectional views through the section A-A (analogous to FIG. 85A), the "B" sub-figures represent cross-sectional views through the section B-B (analogous to FIG. 85B), and the "C" sub-figures represent cross-sectional views through the section E-E (analogous to FIG. 85C).

FIG. 86 depicts an assembly 634 subsequent to providing conductive material 594 and the gate electrode 506 on the substrate 502 of the assembly 602 (FIG. 68). In some embodiments, the conductive material 594 and the gate electrode 506 may each be shaped substantially as a rectangular solid. The conductive material 594 and the gate electrode 506 may each take the form of "fins" extending from the substrate 502, and may be formed using any suitable technique. For example, in some embodiments, a conductive material may be blanket-deposited on the substrate 502, and patterned to form the conductive material 594 and the gate electrode 506. In other embodiments, a sacrificial material may be blanket-deposited on the substrate 502, trenches may be formed in the sacrificial material down to the substrate 502, the trenches may be filled with conductive material to form the conductive material 594 and the gate electrode 506, and then the sacrificial material may be removed. These embodiments are simply examples, and any desired technique may be used to form the conductive material 594 and the gate electrode 506 on the substrate 502.

FIG. 87 depicts an assembly 636 subsequent to depositing an insulator 510 on the assembly 634 (FIG. 86). In the assembly 636, the top face 573 of the conductive material 594 and the top face 584 of the gate electrode 506 are shown as exposed, but in other embodiments, the insulator 510 may extend over the top face 573 and the top face 584. In some embodiments, deposition of the insulator 510 may be followed by a polishing step in which the insulator 510 is polished to create a flat face (e.g., by chemical mechanical polishing); in some such embodiments, the top face 573 and the top face 584 may be exposed subsequent to polishing.

FIG. 88 depicts an assembly 638 subsequent to forming a recess 536 in the assembly 636 (FIG. 87). The recess 536 may have the footprint of the dielectric 508 illustrated in FIG. 85F (e.g., a substantially rectangular footprint), and may divide the conductive material 594 of FIG. 87 into the two S/D electrodes 504. The lateral dimensions of the recess 536 may take any of the forms of the lateral dimensions 560 and 558 discussed herein. The recess 536 may be spaced apart from the gate electrode 506 by a portion of the insulator 510, as shown. The recess 536 may be formed using any of the techniques discussed above with reference to FIG. 74. The assembly 638 may be further processed as discussed above with reference to FIGS. 75-79 to form the SET device 500 illustrated in FIG. 85.

FIG. 89 provides various views of additional embodiments of a SET device 500. In particular, FIG. 89A is a cross-sectional view of the SET device 500 through the section A-A of FIGS. 89C, 89E, and 89F; FIG. 89B is a cross-sectional view of the SET device 500 through the section B-B of FIGS. 89C, 89E, and 89F; FIG. 89C is a cross-sectional view of the SET device 500 through the section C-C of FIGS. 89A, 89B, 89D, and 89F; FIG. 89D is a side view of the SET device 500 toward the section A-A with the insulator 510 removed; FIG. 89E is a side view of the SET device 500 toward the section C-C from the gate electrode 506 with the insulator 510 removed; and FIG. 89F is a top view of the SET device 500 with the insulator 510 removed. As discussed below, the SET device 500 of FIG. 89 may configured to so as to include two complete SETs (each provided by a gate/S/D structure 563), or one complete SET and two "halves" of additional SETs.

As illustrated in FIG. 89, the SET device 500 may include one or more gate/S/D structures 563, each including two supports 517A and 517B disposed on a substrate 502. A gate/S/D structure 563 may also include support material 519 between the supports 517A and 517B. In some embodiments, the supports 517A and 517B and the support material 519 may be materially contiguous (e.g., as discussed below with reference to FIG. 90). Reference to a "support 517" may refer to both the supports 517A and 517B. Two gate/S/D structures 563 are illustrated in FIG. 89, but any number of gate/S/D structures 563 may be included in a SET device 500. Each support 517 may have an S/D electrode 504 disposed on a side face 569 of the support 517. The two S/D electrodes 504 of a gate/S/D structure 563 may be spaced apart by intervening dielectric 508 and an island 512. In particular, a SET device 500 may include two TJs 570, each formed by a portion of dielectric 508 "sandwiched" between an S/D electrode 504 and the island 512. A gate/S/D structure 563 may also include a gate electrode 506 disposed on the side face 571 of the supports 517 and support material 519 (opposite to the side face 569).

The SET device 500 may be configured for use in a number of different ways. In some embodiments, the S/D electrodes 504, the island 512, and the dielectric 508 of one gate/S/D structure 563 may form a SET along with the proximate gate electrode 506 of a different adjacent gate/S/D structure 563. For example, in the embodiment shown in FIG. 89F, the "leftmost" S/D electrodes 504 and the "rightmost" gate electrode 506 (on different gate/S/D structures 563) may be used together as a SET, in any of the manners described above. In such embodiments, FIG. 89F may depict portions of additional SETs, accordingly; additional ones of the gate/S/D structures 563 may continue the linear array of FIG. 89F to provide as many complete SETs as desired. In other embodiments, the S/D electrodes 504, the island 512, the dielectric 508, and the gate electrode 506 in a single gate/S/D structure 563 may be used together as a SET. For example, in the embodiment shown in FIG. 89F, the "leftmost" S/D electrodes 504 and the "leftmost" gate electrode 506 (part of the same gate/S/D structure 563) may be used together as a SET; in such embodiments, FIG. 89F may depict two complete SETs. In either of these embodiments, an array of SETs may be formed (e.g., a one- or two-dimensional array, or any other arrangement of SETs).

The dielectric 508 of FIG. 89 may extend up the sidewalls 561 of the support 517, and up the sidewalls 574 of the S/D electrodes 504. In some embodiments, the dielectric 508 may extend along the substrate 502 between the S/D electrodes 504 such that a portion of the dielectric 508 is disposed between the islands 512 and the substrate 502. The dielectric 508 may also extend up sidewalls 576 of the insulator 510, as shown.

The island 512 of FIG. 89 may be disposed at the bottom of the "boxes" formed by the dielectric 508. In some embodiments, the top face 578 of the island 512 may be recessed back from the top face 559 of the support 517; in some such embodiments, a portion of the insulator 510 may be disposed in the "box" formed by the dielectric 508 such that the island 512 is disposed between this portion of the insulator 510 and the substrate 502.

In some embodiments, the top face 582 of the S/D electrodes 504 of FIG. 89 may be recessed back from the top face 559 of the support 517. Similarly, in some embodiments, the top face 584 of the gate electrode 506 may be recessed back from the top face 559 of the support 517. The dimensions 524, 588, 530, 550 and 585 of FIG. 89 may take any of the forms discussed above with reference to the SET device 500 of FIG. 67. The dimensions 549, 545, 547, 555, 553, and 551 may take any of the forms of the dimensions 526, 522, 518, 590, 520, and 587 disclosed herein.

As illustrated in FIG. 89, in some embodiments, the dielectric 508 may laterally extend beyond the area between the two S/D electrodes 504 of a gate/S/D structure 563 (e.g., in the dimension indicated by the arrow 511). Similarly, in some embodiments, the island 512 may laterally extend beyond the area between the two associated S/D electrodes 504.

Any suitable materials discussed above with reference to the SET device 500 of FIG. 67 may be used in the SET device 500 of FIG. 89. For example, the support 517 may be formed of any of the materials discussed above with reference to the S/D supports 514 and the gate supports 516.

Figure 90A:
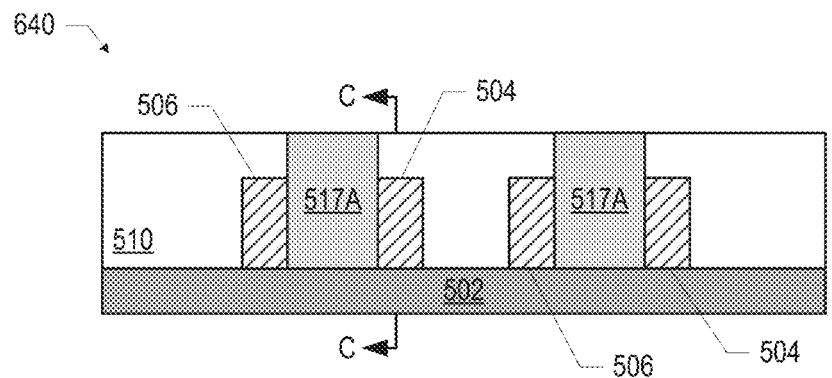
FIGS. 90A-90C illustrate an example stage in the manufacture of the SET device of FIGS. 89A-89F, in accordance with various embodiments.
Figure 90B:
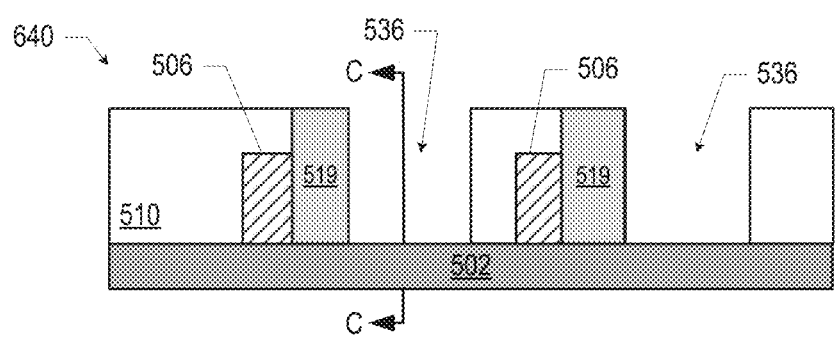
Figure 90C:
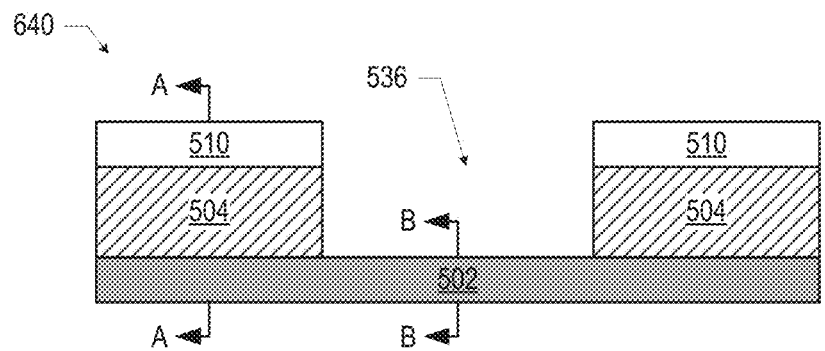

Any suitable process may be used to manufacture the SET device 500 of FIG. 89. For example, FIG. 90 depicts various cross-sectional views of a stage in an example process for manufacturing the SET device 500 of FIG. 89. The materials and dimensions of various components of the stage illustrated in FIG. 90 may take the form of any of the embodiments discussed herein. In FIG. 90, the "A" sub-figure represents a cross-sectional view through the section A-A (analogous to FIG. 89A), the "B" sub-figure represents a cross-sectional view through the section B-B (analogous to FIG. 89B), and the "C" sub-figure represents a cross-sectional view through the section C-C (analogous to FIG. 89C).

FIG. 90 depicts an assembly 640 subsequent to forming recesses 536 in the assembly 626 (FIG. 81). The recesses 536 may have the footprints of the dielectrics 508 illustrated in FIG. 89F (e.g., substantially rectangular footprints), and may divide the support material 592 of FIG. 81 into the two supports 517A and 517B, joined by the support material 519. The lateral dimensions of the recesses 536 may take any of the forms of the lateral dimensions 550 and 530 discussed herein. The recess 536 may divide the conductive material 534 into two S/D electrodes 504 (disposed on the side faces 569 of the supports 517). In FIG. 90, the conductive material 596 is relabeled as the gate electrode 506, and the gate support 516 has been relabeled as the support 517, consistent with FIG. 89. The recess 536 may be spaced apart from the gate electrode 506 by the support material 519, as shown, and a recess 536 of one gate/S/D structure 563 (not labeled in FIG. 90) may be spaced apart by a proximate gate electrode 506 of another gate/S/D structure 563 by a portion of the insulator 510, as shown. The recesses 536 may be formed using any of the techniques discussed above with reference to FIG. 74. The assembly 640 may be further processed as discussed above with reference to FIGS. 83-84 and/or 75-79 to form the SET device 500 illustrated in FIG. 89.

Figure 91:
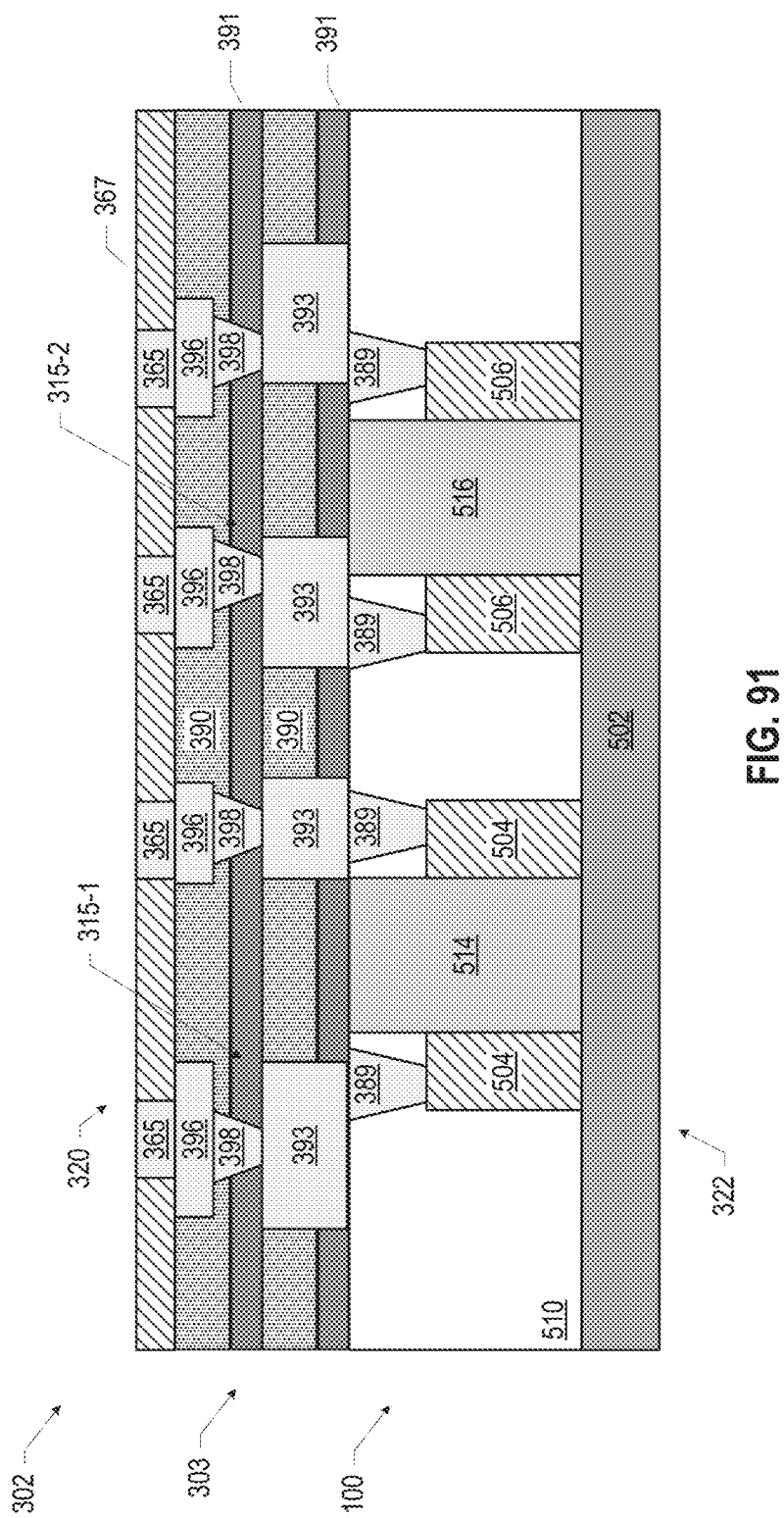
FIG. 91 is a cross-sectional view of a die that may include any of the quantum dot devices disclosed herein, in accordance with various embodiments.
Figure 92:
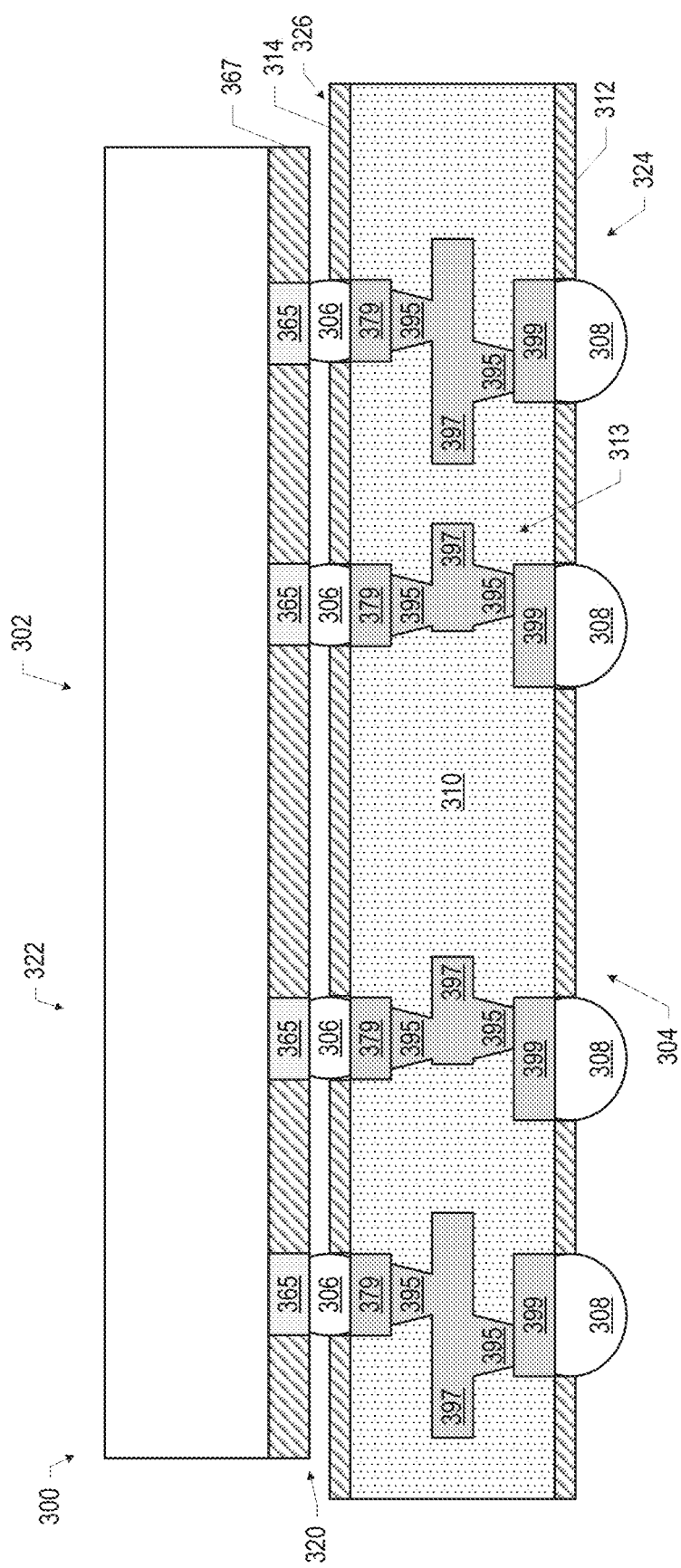
FIG. 92 is a cross-sectional view of a package that may include any of the quantum dot devices disclosed herein, in accordance with various embodiments.

In some embodiments, a quantum dot device 100 may be included in a die and coupled to a package substrate to form a device package. For example, FIG. 91 is a side cross-sectional view of a die 302 showing a quantum dot device 100 (including an example SET of a gate-detector cluster 706) and conductive pathway layers 303 disposed thereon, while FIG. 92 is a side cross-sectional view of a device package 300 in which the die 302 is coupled to a package substrate 304. Only a single complete SET of the quantum dot device 100 is illustrated in FIG. 91 (in particular, the SET device 500 illustrated in FIG. 92) for economy of illustration, but the gates 708, other gate-detector clusters 706, or other embodiments of the SET 704 may be included in a die (e.g., the die 302) and coupled to a package substrate (e.g., the package substrate 304), in accordance with the teachings of the present disclosure.

The die 302 may include a first face 320 and an opposing second face 322. The substrate 502 may be proximate to the second face 322, and conductive pathways 315 from various components of the quantum dot device 100 may extend to conductive contacts 365 disposed at the first face 320. The conductive pathways 315 may include conductive vias, conductive lines, and/or any combination of conductive vias and lines. For example, FIG. 91 illustrates an embodiment in which a conductive pathway 315-1 (extending between an S/D electrode 504 and an associated conductive contact 365) includes a conductive via 389, a conductive line 393, a conductive via 398, and a conductive line 396. In the embodiment of FIG. 91, another conductive pathway 315-2 (extending between a gate electrode 506 and an associated conductive contact 365) includes a conductive via 389, a conductive line 393, a conductive via 398, and a conductive line 396. More or fewer structures may be included in the conductive pathways 315, and analogous conductive pathways 315 may be provided between ones of the conductive contacts 365 and any components of the quantum dot device 100. In some embodiments, conductive lines of the die 302 (and the package substrate 304, discussed below) may extend into and out of the plane of the drawing, providing conductive pathways to route electrical signals to and/or from various elements in the die 302.

The conductive vias and/or lines that provide the conductive pathways 315 in the die 302 may be formed using any suitable techniques. Examples of such techniques may include subtractive fabrication techniques, additive or semi-additive fabrication techniques, single Damascene fabrication techniques, dual Damascene fabrication techniques, or any other suitable technique. In some embodiments, layers of oxide material 390 and layers of nitride material 391 may insulate various structures in the conductive pathways 315 from proximate structures, and/or may serve as etch stops during fabrication. In some embodiments, an adhesion layer (not shown) may be disposed between conductive material and proximate insulating material of the die 302 to improve mechanical adhesion between the conductive material and the insulating material. Although FIG. 91 illustrates a layer of nitride material 391 disposed directly on the S/D support 514 and the gate support 516 of the SET device 500, this need not be the case, and in some embodiments, additional insulator 510 may be disposed between the S/D support 514 (and the gate support 516) and the first layer of nitride material 391.

The SETs 704 and the gates 708 (as well as the proximate conductive vias/lines, such as the conductive vias 389) may be referred to as part of the "device layer" of the quantum dot device 100. The conductive lines 393 may be referred to as a Metal 1 or "M1" interconnect layer, and may couple the structures in the device layer to other interconnect structures. The conductive vias 398 and the conductive lines 396 may be referred to as a Metal 2 or "M2" interconnect layer, and may be formed directly on the M1 interconnect layer. More or fewer interconnect layers may be included in the die 302, as desired.

A solder resist material 367 may be disposed around the conductive contacts 365, and in some embodiments may extend onto the conductive contacts 365. The solder resist material 367 may be a polyimide or similar material, or may be any appropriate type of packaging solder resist material. In some embodiments, the solder resist material 367 may be a liquid or dry film material including photoimageable polymers. In some embodiments, the solder resist material 367 may be non-photoimageable (and openings therein may be formed using laser drilling or masked etch techniques). The conductive contacts 365 may provide the contacts to couple other components (e.g., a package substrate 304, as discussed below, or another component) to the conductive pathways 315 in the quantum dot device 100, and may be formed of any suitable conductive material (e.g., a superconducting material). For example, solder bonds may be formed on the one or more conductive contacts 365 to mechanically and/or electrically couple the die 302 with another component (e.g., a circuit board), as discussed below. The conductive contacts 365 illustrated in FIG. 91 take the form of bond pads, but other first level interconnect structures may be used (e.g., posts) to route electrical signals to/from the die 302, as discussed below.

The combination of the conductive pathways and the proximate insulating material (e.g., the proximate insulator 510, the oxide material 390, and the nitride material 391) in the die 302 may provide an interlayer dielectric (ILD) stack of the die 302. As noted above, interconnect structures may be arranged within the quantum dot device 100 to route electrical signals according to a wide variety of designs (in particular, the arrangement is not limited to the particular configuration of interconnect structures depicted in FIG. 91 or any of the other accompanying figures, and may include more or fewer interconnect structures). During operation of the quantum dot device 100, electrical signals (such as power and/or input/output (I/O) signals) may be routed to and/or from the SETs 704 and the gates 708 (and/or other components) of the quantum dot device 100 through the interconnects provided by conductive vias and/or lines, and through the conductive pathways of the package substrate 304 (discussed below).

In the device package 300 (FIG. 92), first level interconnects 306 may be disposed between the first face 320 of the die 302 and the second face 326 of a package substrate 304. Having first level interconnects 306 disposed between the first face 320 of the die 302 and the second face 326 of the package substrate 304 (e.g., using solder bumps as part of flip chip packaging techniques) may enable the device package 300 to achieve a smaller footprint and higher die-to-package-substrate connection density than could be achieved using conventional wirebond techniques (in which conductive contacts between the die 302 and the package substrate 304 are constrained to be located on the periphery of the die 302). For example, a die 302 having a square first face 320 with side length N may be able to form only 4N wirebond interconnects to the package substrate 304, versus $N^2$ flip chip interconnects (utilizing the entire "full field" face area of the first face 320). Additionally, in some applications, wirebond interconnects may generate unacceptable amounts of heat that may damage or otherwise interfere with the performance of the device 500. Using solder bumps as the first level interconnects 306 may enable the device package 300 to have much lower parasitic inductance relative to using wirebonds to couple the die 302 and the package substrate 304, which may result in an improvement in signal integrity for high-speed signals communicated between the die 302 and the package substrate 304.

The package substrate 304 may include a first face 324 and an opposing second face 326. Conductive contacts 399 may be disposed at the first face 324, and conductive contacts 379 may be disposed at the second face 326. Solder resist material 314 may be disposed around the conductive contacts 379, and solder resist material 312 may be disposed around the conductive contacts 399; the solder resist materials 314 and 312 may take any of the forms discussed above with reference to the solder resist material 367. In some embodiments, the solder resist material 312 and/or the solder resist material 314 may be omitted. Conductive pathways 313 may extend through insulating material 310 between the first face 324 and the second face 326 of the package substrate 304, electrically coupling various ones of the conductive contacts 399 to various ones of the conductive contacts 379, in any desired manner. The insulating material 310 may be a dielectric material (e.g., an ILD), and may take the form of any of the embodiments of the insulator 510 disclosed herein, for example. The conductive pathways 313 may include one or more conductive vias 395 and/or one or more conductive lines 397, for example.

In some embodiments, the device package 300 may be a cored package, one in which the package substrate 304 is built on a carrier material (not shown) that remains in the package substrate 304. In such embodiments, the carrier material may be a dielectric material that is part of the insulating material 310; laser vias or other through-holes may be made through the carrier material to allow conductive pathways 313 to extend between the first face 324 and the second face 326.

In some embodiments, the package substrate 304 may be or may otherwise include a silicon interposer, and the conductive pathways 313 may be through-silicon vias. Silicon may have a desirably low coefficient of thermal expansion compared with other dielectric materials that may be used for the insulating material 310, and thus may limit the degree to which the package substrate 304 expands and contracts during temperature changes relative to such other materials (e.g., polymers having higher coefficients of thermal expansion). A silicon interposer may also help the package substrate 304 achieve a desirably small line width and maintain high connection density to the die 302.

Limiting differential expansion and contraction may help preserve the mechanical and electrical integrity of the device package 300 as the device package 300 is fabricated (and exposed to higher temperatures) and used in a cooled environment (and exposed to lower temperatures). In some embodiments, thermal expansion and contraction in the package substrate 304 may be managed by maintaining an approximately uniform density of the conductive material in the package substrate 304 (so that different portions of the package substrate 304 expand and contract uniformly), using reinforced dielectric materials as the insulating material 310 (e.g., dielectric materials with silicon dioxide fillers), or utilizing stiffer materials as the insulating material 310 (e.g., a prepreg material including glass cloth fibers).

The conductive contacts 365 of the die 302 may be electrically coupled to the conductive contacts 379 of the package substrate 304 via the first level interconnects 306. In some embodiments, the first level interconnects 306 may include solder bumps or balls (as illustrated in FIG. 92); for example, the first level interconnects 306 may be flip chip (or controlled collapse chip connection, "C4") bumps disposed initially on the die 302 or on the package substrate 304. Second level interconnects 308 (e.g., solder balls or other types of interconnects) may couple the conductive contacts 399 on the first face 324 of the package substrate 304 to another component, such as a circuit board (not shown). Examples of arrangements of electronics packages that may include an embodiment of the device package 300 are discussed below with reference to FIG. 94. The die 302 may be brought in contact with the package substrate 304 using a pick-and-place apparatus, for example, and a reflow or thermal compression bonding operation may be used to couple the die 302 to the package substrate 304 via the first level interconnects 306.

The conductive contacts 365, 379, and/or 399 may include multiple layers of material that may be selected to serve different purposes. In some embodiments, the conductive contacts 365, 379, and/or 399 may be formed of aluminum, and may include a layer of gold (e.g., with a thickness of less than 1 micron) between the aluminum and the adjacent interconnect to limit the oxidation of the surface of the contacts and improve the adhesion with adjacent solder. In some embodiments, the conductive contacts 365, 379, and/or 399 may be formed of aluminum, and may include a layer of a barrier metal such as nickel, as well as a layer of gold, wherein the layer of barrier metal is disposed between the aluminum and the layer of gold, and the layer of gold is disposed between the barrier metal and the adjacent interconnect. In such embodiments, the gold may protect the barrier metal face from oxidation before assembly, and the barrier metal may limit the diffusion of solder from the adjacent interconnects into the aluminum.

In some embodiments, the structures and materials in the quantum dot device 100 may be damaged if the quantum dot device 100 is exposed to the high temperatures that are common in conventional integrated circuit processing (e.g., greater than 100 degrees Celsius, or greater than 200 degrees Celsius). In particular, in embodiments in which the first level interconnects 306 include solder, the solder may be a low-temperature solder (e.g., a solder having a melting point below 100 degrees Celsius) so that it can be melted to couple the conductive contacts 365 and the conductive contacts 379 without having to expose the die 302 to higher temperatures and risk damaging the quantum dot device 100. Examples of solders that may be suitable include indium-based solders (e.g., solders including indium alloys). When low-temperature solders are used, however, these solders may not be fully solid during handling of the device package 300 (e.g., at room temperature or temperatures between room temperature and 100 degrees Celsius), and thus the solder of the first level interconnects 306 alone may not reliably mechanically couple the die 302 and the package substrate 304 (and thus may not reliably electrically couple the die 302 and the package substrate 304). In some such embodiments, the device package 300 may further include a mechanical stabilizer to maintain mechanical coupling between the die 302 and the package substrate 304, even when solder of the first level interconnects 306 is not solid. Examples of mechanical stabilizers may include an underfill material disposed between the die 302 and the package substrate 304, a corner glue disposed between the die 302 and the package substrate 304, an overmold material disposed around the die 302 on the package substrate 304, and/or a mechanical frame to secure the die 302 and the package substrate 304.

In some embodiments, various conductive components of the die 302 and/or the device package 300 may be formed of superconducting materials. Example superconducting materials that may be used for the structures in the conductive pathways 313 and 315, and/or conductive contacts of the die 302 and/or the package substrate 304, may include aluminum, niobium, tin, titanium, osmium, zinc, molybdenum, tantalum, vanadium, or composites of such materials (e.g., niobium-titanium, niobium-aluminum, or niobium-tin). In some embodiments, the conductive contacts 365, 379, and/or 399 may include aluminum, and the first level interconnects 306 and/or the second level interconnects 308 may include an indium-based solder.

FIGS. 93A-B are top views of a wafer 450 and dies 452 that may be formed from the wafer 450; the dies 452 may be included in any of the device packages (e.g., the device package 300) disclosed herein. The wafer 450 may include semiconductor material and may include one or more dies 452 having conventional and quantum dot device elements formed on a surface of the wafer 450. Each of the dies 452 may be a repeating unit of a semiconductor product that includes any suitable conventional and/or quantum dot device. After the fabrication of the semiconductor product is complete, the wafer 450 may undergo a singulation process in which each of the dies 452 is separated from one another to provide discrete "chips" of the semiconductor product. A die 452 may include one or more quantum dot devices 100 and/or supporting circuitry to route electrical signals to the quantum dot devices 100 (e.g., interconnects including conductive vias and lines), as well as any other IC components. In some embodiments, the wafer 450 or the die 452 may include a memory device (e.g., a static random access memory (SRAM) device), a logic device (e.g., AND, OR, NAND, or NOR gate), or any other suitable circuit element. Multiple ones of these devices may be combined on a single die 452. For example, a memory array formed by multiple memory devices may be formed on a same die 452 as a processing device (e.g., the processing device 2002 of FIG. 97) or other logic that is configured to store information in the memory devices or execute instructions stored in the memory array.

FIG. 94 is a cross-sectional side view of a device assembly 400 that may include any of the embodiments of the device packages 300 disclosed herein. The device assembly 400 includes a number of components disposed on a circuit board 402. The device assembly 400 may include components disposed on a first face 440 of the circuit board 402 and an opposing second face 442 of the circuit board 402; generally, components may be disposed on one or both faces 440 and 442.

In some embodiments, the circuit board 402 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 402. In other embodiments, the circuit board 402 may be a package substrate or flexible board.

The device assembly 400 illustrated in FIG. 94 includes a package-on-interposer structure 436 coupled to the first face 440 of the circuit board 402 by coupling components 416. The coupling components 416 may electrically and mechanically couple the package-on-interposer structure 436 to the circuit board 402, and may include solder balls (as shown in FIG. 81), male and female portions of a socket, an adhesive, an underfill material, and/or any other suitable electrical and/or mechanical coupling structure.

The package-on-interposer structure 436 may include a package 420 coupled to an interposer 404 by coupling components 418. The coupling components 418 may take any suitable form for the application, such as the forms discussed above with reference to the coupling components 416. For example, the coupling components 418 may be the second level interconnects 308. Although a single package 420 is shown in FIG. 94, multiple packages may be coupled to the interposer 404; indeed, additional interposers may be coupled to the interposer 404. The interposer 404 may provide an intervening substrate used to bridge the circuit board 402 and the package 420. The package 420 may be a device package 300 or may be a conventional IC package, for example. In some embodiments, the package 420 may take the form of any of the embodiments of the device package 300 disclosed herein, and may include a die 302 coupled to a package substrate 304 (e.g., by flip chip connections). Generally, the interposer 404 may spread a connection to a wider pitch or reroute a connection to a different connection. For example, the interposer 404 may couple the package 420 (e.g., a die) to a ball grid array (BGA) of the coupling components 416 for coupling to the circuit board 402. In the embodiment illustrated in FIG. 94, the package 420 and the circuit board 402 are attached to opposing sides of the interposer 404; in other embodiments, the package 420 and the circuit board 402 may be attached to a same side of the interposer 404. In some embodiments, three or more components may be interconnected by way of the interposer 404. In some embodiments, a device package 300 including the die 302 may be one of the packages disposed on an interposer like the interposer 404.

The interposer 404 may be formed of an epoxy resin, a fiberglass-reinforced epoxy resin, a ceramic material, or a polymer material such as polyimide. In some embodiments, the interposer 404 may be formed of alternate rigid or flexible materials that may include the same materials described above for use in a semiconductor substrate, such as silicon, germanium, and other group III-V and group IV materials. The interposer 404 may include metal interconnects 408 and vias 410, including but not limited to through-silicon vias (TSVs) 406. The interposer 404 may further include embedded devices 414, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 404. The package-on-interposer structure 436 may take the form of any of the package-on-interposer structures known in the art.

The device assembly 400 may include a package 424 coupled to the first face 440 of the circuit board 402 by coupling components 422. The coupling components 422 may take the form of any of the embodiments discussed above with reference to the coupling components 416, and the package 424 may take the form of any of the embodiments discussed above with reference to the package 420. The package 424 may be a device package 300 (e.g., including the die 302) or may be a conventional IC package, for example. In some embodiments, the package 424 may take the form of any of the embodiments of the device package 300 disclosed herein, and may include a quantum dot device die 302 coupled to a package substrate 304 (e.g., by flip chip connections).

The device assembly 400 illustrated in FIG. 94 includes a package-on-package structure 434 coupled to the second face 442 of the circuit board 402 by coupling components 428. The package-on-package structure 434 may include a package 426 and a package 432 coupled together by coupling components 430 such that the package 426 is disposed between the circuit board 402 and the package 432. The coupling components 428 and 430 may take the form of any of the embodiments of the coupling components 416 discussed above, and the packages 426 and 432 may take the form of any of the embodiments of the package 420 discussed above. Each of the packages 426 and 432 may be a device package 300 or may be a conventional IC package, for example. In some embodiments, one or both of the packages 426 and 432 may take the form of any of the embodiments of the device package 300 disclosed herein, and may include a die 302 coupled to a package substrate 304 (e.g., by flip chip connections). In some embodiments, a device package 300 including the die 302 may be one of the packages in a package-on-package structure like the package-on-package structure 434.

Figures 95, 96:
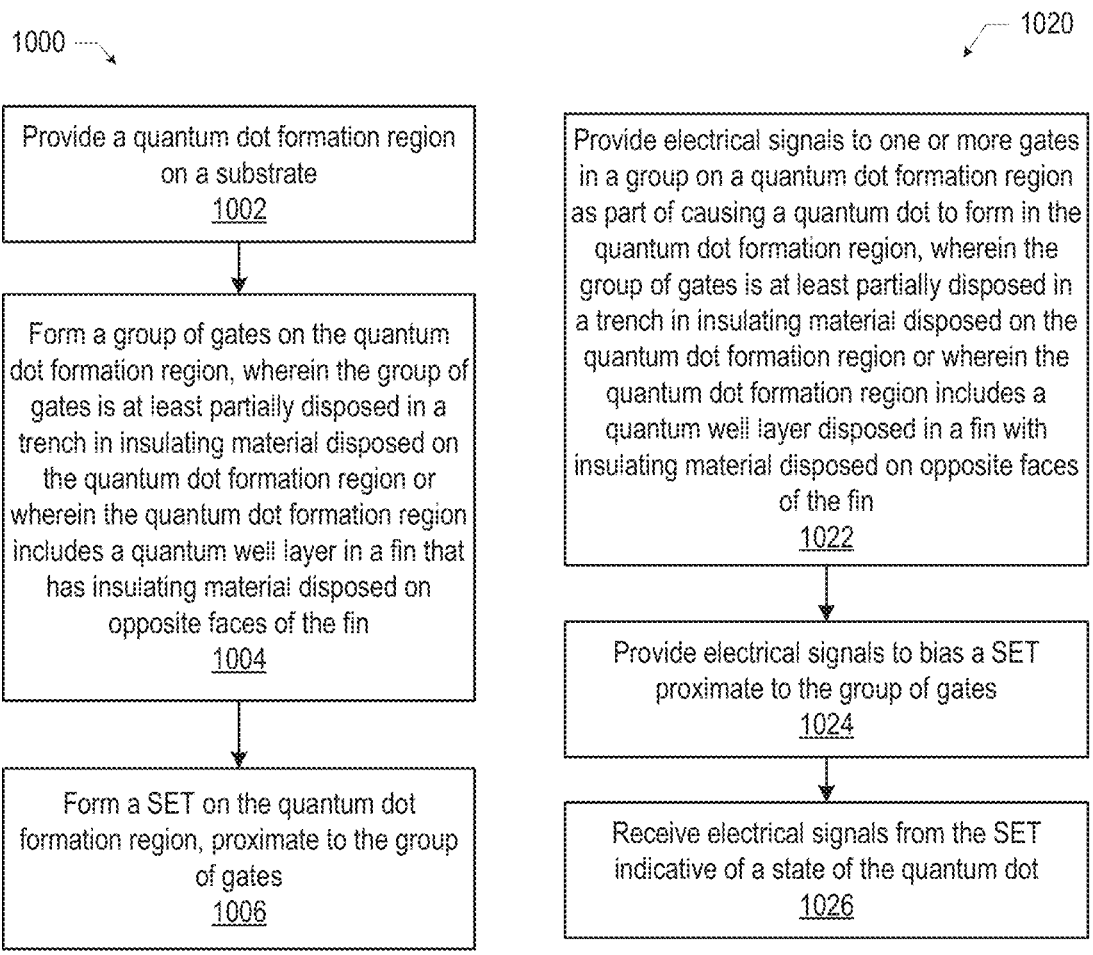
FIG. 95 is a flow diagram of an illustrative method of manufacturing a quantum dot device, in accordance with various embodiments.
FIG. 96 is a flow diagram of an illustrative method of operating a quantum dot device, in accordance with various embodiments.

As noted above, any suitable techniques may be used to manufacture the quantum dot devices 100 disclosed herein. FIG. 95 is a flow diagram of an illustrative method 1000 of manufacturing a quantum dot device, in accordance with various embodiments. Although the operations discussed below with reference to the method 1000 are illustrated in a particular order and depicted once each, these operations may be repeated or performed in a different order (e.g., in parallel), as suitable. Additionally, various operations may be omitted, as suitable. Various operations of the method 1000 may be illustrated with reference to one or more of the embodiments discussed above, but the method 1000 may be used to manufacture any suitable quantum dot device (including any suitable ones of the embodiments disclosed herein).

At 1002, a quantum dot formation region may be formed on a substrate. For example, a quantum dot formation region 710 may take the form of the fins 104/insulating material 128 illustrated in FIGS. 3-4 or the quantum well stack 146 illustrated in FIGS. 41-43.

At 1004, a group of gates may be formed on the quantum dot formation region. The group of gates may be at least partially disposed in a trench in insulating material disposed on the quantum dot formation region, or the quantum dot formation region may include a quantum well layer in a fin that has insulating material disposed on opposite faces of the fin. For example, a gate group 718 may take the form of the gates 106/108 illustrated in FIGS. 3-4 or the gates 106/108 illustrated in FIGS. 41-43.

At 1006, a SET may be formed on the quantum dot formation region, proximate to the group of gates. For example, a SET 704 may take the form of the SETs discussed herein with reference to FIGS. 67, 80, 85, and 89. The SET 704 and the gate group 718 may form a gate-detector cluster 706, as discussed above with reference to FIGS. 1 and 2.

A number of techniques are disclosed herein for operating a quantum dot device 100. FIG. 96 is a flow diagram of a particular illustrative method 1020 of operating a quantum dot device, in accordance with various embodiments. Although the operations discussed below with reference to the method 1020 are illustrated in a particular order and depicted once each, these operations may be repeated or performed in a different order (e.g., in parallel), as suitable. Additionally, various operations may be omitted, as suitable. Various operations of the method 1020 may be illustrated with reference to one or more of the embodiments discussed above, but the method 1020 may be used to operate any suitable quantum dot device (including any suitable ones of the embodiments disclosed herein).

At 1022, electrical signals may be provided to one or more gates in a group on a quantum dot formation region as part of causing a quantum dot to form in the quantum dot formation region. The group of gates may be at least partially disposed in a trench in insulating material disposed on the quantum dot formation region, or the quantum dot formation region may include a quantum well layer disposed in a fin with insulating material disposed on opposite faces of the fin. For example, electrical signals may be provided to various ones of the gates 708 in a gate group 718. The gates 708 may take the form of the gates 106/108 discussed herein with reference to FIGS. 3-4 or the gates 106/108 discussed herein with reference to FIGS. 41-43, for example.

At 1024, electrical signals may be provided to bias a SET proximate to the group of gates. For example, electrical signals may be provided to various ones of the SETs 704 in a gate-detector cluster 706 with the gates 708 in the gate group 718. The SETs 704 may take the form of any of the SETs discussed herein with reference to FIGS. 67, 80, 85, and 89, for example.

At 1026, electrical signals may be received from the SET, indicative of a state of the quantum dot. For example, a change in conductance of a SET 704 may reflect a quantum state of a quantum dot 142 formed at least in part by the gates 708 in a gate group 718.

Figure 97:
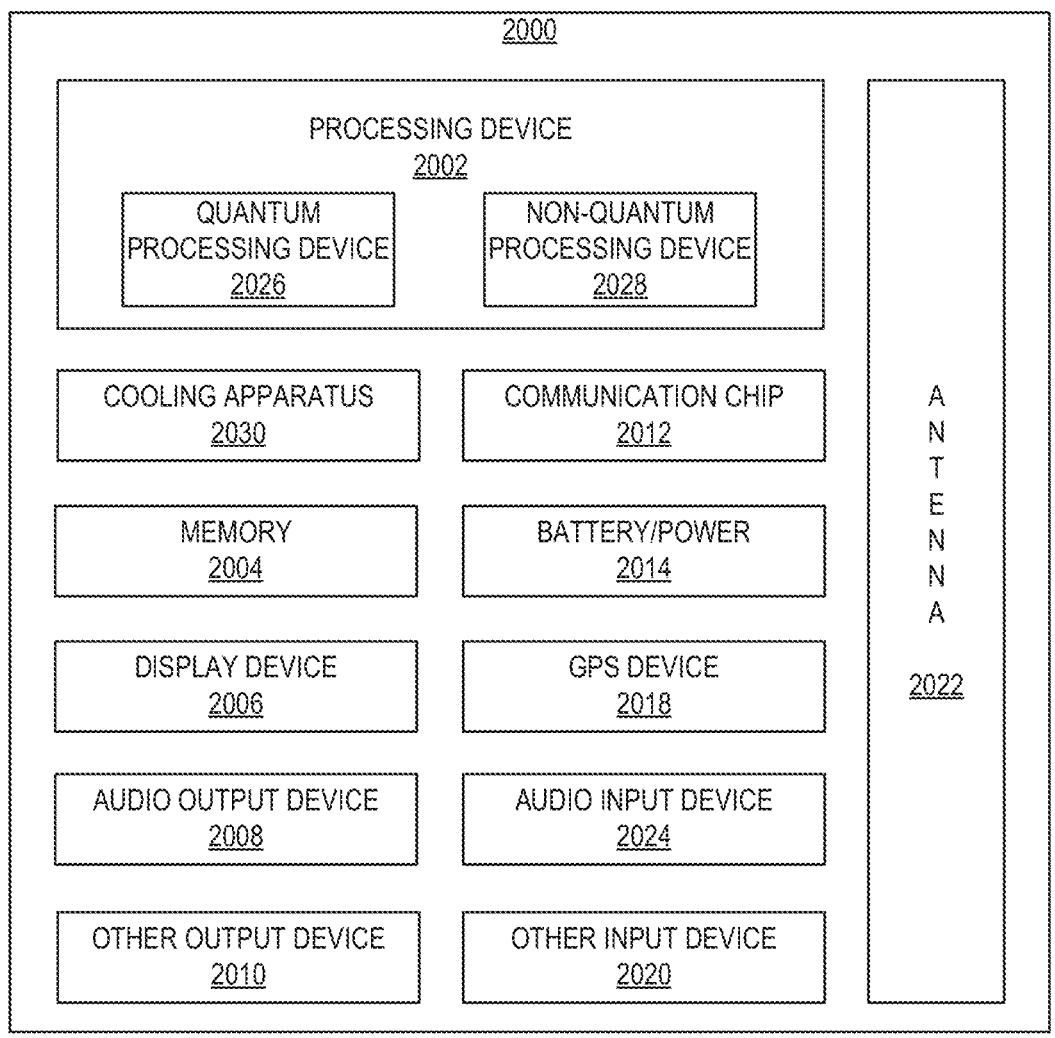
FIG. 97 is a block diagram of an example quantum computing device that may include any of the quantum dot devices disclosed herein, in accordance with various embodiments.

FIG. 97 is a block diagram of an example quantum computing device 2000 that may include any of the quantum dot devices 100 disclosed herein. A number of components are illustrated in FIG. 97 as included in the quantum computing device 2000, but any one or more of these components may be omitted or duplicated, as suitable for the application. In some embodiments, some or all of the components included in the quantum computing device 2000 may be attached to one or more printed circuit boards (e.g., a motherboard). In some embodiments, various ones of these components may be fabricated onto a single system-on-a-chip (SoC) die. Additionally, in various embodiments, the quantum computing device 2000 may not include one or more of the components illustrated in FIG. 97, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2024 or an audio output device 2008, but may include audio input or output device interface circuitry (e.g., connectors and supporting circuitry) to which an audio input device 2024 or audio output device 2008 may be coupled.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include one or more of the quantum dot devices 100 disclosed herein, and may perform data processing by performing operations on the quantum dots that may be generated in the quantum dot devices 100, and monitoring the result of those operations. For example, as discussed above, different quantum dots may be allowed to interact, the quantum states of different quantum dots may be set or transformed, and the quantum states of quantum dots may be read (e.g., by a SET or other detector). The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters. For example, the quantum processing device 2026 may include circuitry (e.g., a current source) to provide current pulses to one or more magnet lines 121 included in the quantum dot device 100.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random access memory (eDRAM) or spin transfer torque magnetic random-access memory (STT-MRAM).

The quantum computing device 2000 may include a cooling apparatus 2030. The cooling apparatus 2030 may maintain the quantum processing device 2026 at a predetermined low temperature during operation to reduce the effects of scattering in the quantum processing device 2026. This predetermined low temperature may vary depending on the setting; in some embodiments, the temperature may be 5 degrees Kelvin or less. In some embodiments, the non-quantum processing device 2028 (and various other components of the quantum computing device 2000) may not be cooled by the cooling apparatus 2030, and may instead operate at room temperature. The cooling apparatus 2030 may be, for example, a dilution refrigerator, a helium-3 refrigerator, or a liquid helium refrigerator.

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 1402.11 family), IEEE 1402.16 standards (e.g., IEEE 1402.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 1402.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 1402.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as GPS, EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2024 (or corresponding interface circuitry, as discussed above). The audio input device 2024 may include any device that generates a signal representative of a sound, such as microphones, microphone arrays, or digital instruments (e.g., instruments having a musical instrument digital interface (MIDI) output).

The quantum computing device 2000 may include a global positioning system (GPS) device 2018 (or corresponding interface circuitry, as discussed above). The GPS device 2018 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The following paragraphs provide various examples of the embodiments disclosed herein.

Example 1 is a device, including: a quantum dot formation region of a quantum dot device; a group of gates disposed on the quantum dot formation region, wherein: the group of gates includes at least first, second, and third gates, spacers are disposed on sides of the first and second gates, wherein a first spacer is disposed on a side of the first gate proximate to the second gate, and a second spacer, physically separate from the first spacer, is disposed on a side of the second gate proximate to the first gate, and the third gate is disposed between the first and second gates and extends between the first and second spacers; and a single electron transistor (SET) disposed on the quantum dot formation region, proximate to the group of gates.

Example 2 may include the subject matter of Example 1, and may further specify that the quantum dot formation region includes a quantum well stack, and the device further includes an insulating material disposed above the quantum dot formation region, wherein the insulating material includes a trench, wherein a gate metal of the first gate is disposed on the insulating material and extends into the trench.

Example 3 may include the subject matter of Example 2, and may further specify that the trench has a tapered profile that is narrowest proximate to the quantum well stack.

Example 4 may include the subject matter of any of Examples 2-3, and may further specify that the trench extends down to the quantum well stack.

Example 5 may include the subject matter of any of Examples 2-4, and may further specify that the trench has a width between 10 and 30 nanometers.

Example 6 may include the subject matter of any of Examples 2-5, and may further specify that the gate metal has a thickness above the insulating material between 25 and 75 nanometers.

Example 7 may include the subject matter of any of Examples 2-6, and may further specify that the gate metal has a length, along the trench, between 20 and 40 nanometers.

Example 8 may include the subject matter of any of Examples 2-7, and may further include spacers disposed between the gate metal in the trench and sidewalls of the trench.

Example 9 may include the subject matter of any of Examples 2-8, and may further specify that the trench has a depth between 200 and 300 nanometers.

Example 10 may include the subject matter of Example 1, and may further specify that the quantum dot formation region includes a quantum well stack included in a fin extending away from a base.

Example 11 may include the subject matter of Example 10, and may further specify that the quantum dot formation region further includes an insulating material disposed on opposite faces of the fin.

Example 12 may include the subject matter of any of Examples 10-11, and may further specify that the fin has a width between 10 and 30 nanometers.

Example 13 may include the subject matter of any of Examples 10-12, and may further specify that the fin has a tapered shape that is widest proximate to the base.

Example 14 may include the subject matter of any of Examples 10-13, and may further specify that the base includes a semiconductor substrate.

Example 15 may include the subject matter of any of Examples 10-14, and may further specify that the fin has a height between 250 and 350 nanometers.

Example 16 may include the subject matter of any of Examples 1-15, and may further specify that the SET includes: first and second insulating supports; first and second source/drain (S/D) electrodes, wherein the first S/D electrode is disposed on a side face of the first insulating support and the second S/D electrode is disposed on a side face of the second insulating support; an island, disposed between the first and second S/D electrodes and extending into an area between the first and second insulating supports; and first and second portions of a dielectric, wherein the first portion of the dielectric is disposed between the first S/D electrode and the island, and the second portion of the dielectric is disposed between the second S/D electrode and the island.

Example 17 may include the subject matter of Example 16, and may further specify that the first and second S/D electrodes are disposed on a substrate, and another portion of the dielectric is disposed between the substrate and the island.

Example 18 may include the subject matter of any of Examples 16-17, and may further specify that the SET further includes: a third insulating support; and a gate electrode of the SET disposed on a side face of the third insulating support.

Example 19 may include the subject matter of Example 18, and may further specify that a longitudinal axis of the first S/D electrode is parallel to a longitudinal axis of the gate electrode.

Example 20 may include the subject matter of any of Examples 18-19, and may further specify that the side face of the third insulating support faces the side faces of the first and second insulating supports.

Example 21 may include the subject matter of any of Examples 18-20, and may further specify that the SET further includes a third portion of the dielectric disposed between the island and the gate electrode.

Example 22 may include the subject matter of Example 16, and may further specify that the SET is a first SET, the island is a first island, the side face of the first insulating support is a first side face of the first insulating support, the side face of the second insulating support is a first side face of the second insulating support, and the device further includes: third and fourth S/D electrodes of a second SET, wherein the third S/D electrode is disposed on a second side face of the first insulating support and the fourth S/D electrode is disposed on a second side face of the second insulating support; a second island of the second SET, disposed between the third and fourth S/D electrodes and extending into the area between the first and second insulating supports; and third and fourth portions of the dielectric; wherein the third portion of the dielectric is disposed between the third S/D electrode and the second island, and the fourth portion of the dielectric is disposed between the fourth S/D electrode and the second island.

Example 23 may include the subject matter of Example 22, and may further specify that the SET further includes: a third insulating support; and a gate electrode of the first SET disposed on a side face of the third insulating support, wherein the side face of the third insulating support faces the first side faces of the first and second insulating supports.

Example 24 may include the subject matter of Example 23, and may further specify that the gate electrode is a first gate electrode, the side face of the third insulating support is a first side face of the third insulating support, and the device further includes a second gate electrode disposed on a second side face of the third insulating support.

Example 25 may include the subject matter of any of Examples 23-24, and may further specify that the SET further includes: a fourth insulating support; and a gate electrode of the second SET disposed on a side face of the fourth insulating support, wherein the side face of the fourth insulating support faces the second side faces of the first and second insulating supports.

Example 26 may include the subject matter of any of Examples 22-25, and may further specify that a third insulating support is disposed between the first and second insulating supports, and the third insulating support is disposed between the first and second islands.

Example 27 may include the subject matter of Example 26, and may further specify that a fifth portion of the dielectric is disposed between the third insulating support and the first island, and a sixth portion of the dielectric is disposed between the third insulating support and the second island.

Example 28 may include the subject matter of any of Examples 26-27, and may further specify that the third insulating support is materially continuous with the first and second insulating supports.

Example 29 may include the subject matter of any of Examples 16-28, and may further specify that the first and second insulating supports are materially continuous with a third insulating support disposed between the first and second insulating supports.

Example 30 may include the subject matter of any of Examples 16-29, and may further specify that the side face of the first insulating support is a first side face of the first insulating support, and the device further includes a gate electrode disposed on a second side face of the first insulating support.

Example 31 may include the subject matter of Example 30, and may further specify that the gate electrode continuously extends along the second insulating support.

Example 32 may include the subject matter of any of Examples 1-15, and may further specify that the SET includes: first and second source/drain (S/D) electrodes disposed on a substrate; an island disposed in an area between the first and second S/D electrodes; first and second portions of dielectric disposed between the first S/D electrode and the island and between the second S/D electrode and the island, respectively; and a third portion of dielectric disposed between the substrate and the island.

Example 33 may include the subject matter of Example 32, and may further specify that the island extends outside the area between the first and second S/D electrodes.

Example 34 may include the subject matter of any of Examples 32-33, and may further specify that the SET further includes an insulating material disposed in the area between the first and second S/D electrodes.

Example 35 may include the subject matter of any of Examples 32-34, and may further specify that the SET further includes a gate electrode spaced apart from the island.

Example 36 may include the subject matter of Example 35, and may further specify that a longitudinal axis of the gate electrode is parallel to an axis running between the first and second S/D electrodes.

Example 37 may include the subject matter of any of Examples 35-36, and may further specify that the SET further includes a fourth portion of TJ dielectric disposed between the island and the gate electrode.

Example 38 may include the subject matter of any of Examples 32-37, and may further specify that the first and second S/D electrodes are shaped as rectangular solids.

Example 39 may include the subject matter of any of Examples 1-38, and may further include: multiple groups of gates disposed on the quantum dot formation region; and multiple SETs disposed on the quantum dot formation region proximate to different ones of the multiple groups of gates.

Example 40 may include the subject matter of any of Examples 1-39, and may further include a magnet line.

Example 41 may include the subject matter of any of Examples 1-40, and may further specify that the quantum dot formation region includes a silicon/silicon oxide material stack.

Example 42 may include the subject matter of Example 41, and may further specify that the quantum dot formation region includes a silicon quantum well layer and a silicon oxide layer disposed between the silicon quantum well layer and the group of gates.

Example 43 may include the subject matter of any of Examples 1-42, and may further specify that the first spacer has a thickness between 1 and 10 nanometers.

Example 44 may include the subject matter of any of Examples 1-43, and may further specify that the spacers include a nitride material or a carbide material.

Example 45 may include the subject matter of any of Examples 1-43, and may further specify that the spacers include carbon-doped oxide.

Example 46 may include the subject matter of any of Examples 1-43, and may further specify that the spacers include silicon nitride.

Example 47 may include the subject matter of any of Examples 1-46, and may further specify that the first, second, and third gates each include a gate metal and a gate dielectric disposed between the gate metal and the quantum dot formation region.

Example 48 may include the subject matter of Example 47, and may further specify that the gate dielectric of the first, second, and third gates is provided by a common, continuous gate dielectric layer.

Example 49 may include the subject matter of any of Examples 47, and may further specify that the gate metal is titanium nitride.

Example 50 may include the subject matter of any of Examples 1-49, and may further specify that metal of the first gate has a height between 40 and 75 nanometers.

Example 51 may include the subject matter of any of Examples 1-50, and may further specify that the first gate has a length between 20 and 40 nanometers.

Example 52 may include the subject matter of any of Examples 1-51, and may further include first, second, and third conductive vias in conductive contact with the first, second, and third gates, respectively.

Example 53 is a method of operating a quantum dot device, including: providing electrical signals to one or more gates in a group on a quantum dot formation region as part of causing a quantum dot to form in the quantum dot formation region, wherein the group of gates is at least partially disposed in a trench in insulating material disposed on the quantum dot formation region or wherein the quantum dot formation region includes a quantum well layer disposed in a fin with insulating material disposed on opposite faces of the fin; providing electrical signals to bias a single electron transistor (SET) proximate to the group of gates; and receiving electrical signals from the SET indicative of a state of the quantum dot.

Example 54 may include the subject matter of Example 53, and may further specify that the state of the quantum dot is a spin state of the quantum dot.

Example 55 may include the subject matter of any of Examples 53-54, and may further specify that the quantum dot is a first quantum dot, and the method further includes: providing electrical signals to the one or more gates as part of causing a second quantum dot to form in the quantum dot formation region; and prior to sensing the quantum state of the first quantum dot, allowing the first and second quantum dots to interact.

Example 56 may include the subject matter of Example 55, and may further specify that allowing the first and second quantum dots to interact comprises providing electrical signals to the one or more gates to control interaction between the first and third quantum dots.

Example 57 may include the subject matter of any of Examples 53-56, and may further specify that the SET includes: first and second source/drain (S/D) electrodes, wherein the first S/D electrode is disposed on a side face of a first insulating support and the second S/D electrode is disposed on a side face of a second insulating support; an island, disposed between the first and second S/D electrodes and extending into an area between the first and second insulating supports; and first and second portions of a dielectric, wherein the first portion of the dielectric is disposed between the first S/D electrode and the island, and the second portion of the dielectric is disposed between the second S/D electrode and the island.

Example 58 may include the subject matter of any of Examples 53-56, and may further specify that the SET includes: first and second source/drain (S/D) electrodes; an island of the SET disposed in an area between the first and second S/D electrodes, wherein the island extends outside the area between the first and second S/D electrodes; and first and second portions of dielectric disposed between first S/D electrode and the island and between the second S/D electrode and the island, respectively.

Example 59 may include the subject matter of any of Examples 53-58, and may further specify that receiving electrical signals from the SET indicative of the state of the quantum dot includes monitoring a conductance of the SET.

Example 60 is a method of manufacturing a quantum dot device, including: providing a quantum dot formation region on a substrate; forming a group of gates on the quantum dot formation region; forming a single electron transistor (SET) on the quantum dot formation region, proximate to the group of gates; wherein the group of gates is at least partially disposed in a trench in insulating material disposed on the quantum dot formation region or wherein the quantum dot formation region includes a quantum well layer in a fin that has insulating material disposed on opposite faces of the fin.

Example 61 may include the subject matter of Example 60, and may further specify that providing the quantum dot formation region on the substrate includes growing material of a quantum well stack by epitaxy.

Example 62 may include the subject matter of Example 61, and may further specify that the material of the quantum well stack is silicon.

Example 63 may include the subject matter of any of Examples 60-62, and may further include: providing an interlayer dielectric on the gates; and forming conductive vias through the interlayer dielectric to make conductive contact with the gates.

Example 64 may include the subject matter of any of Examples 60-63, and may further specify that forming the SET includes: forming an insulating support on the quantum dot formation region; providing a conductive material on at least one side face of the insulating support; after providing the conductive material, providing an insulating material on the conductive material and the insulating support to form a first assembly; forming a recess in the first assembly, wherein the recess extends into the insulating support and separates the conductive material into at least first and second separate conductive portions; providing a dielectric on sidewalls and bottom of the recess; and providing an island material in the recess on the dielectric.

Example 65 may include the subject matter of any of Examples 60-63, and may further specify that forming the SET includes: forming a fin of conductive material on the quantum dot formation region; after forming the fin, providing an insulating material on the fin to form a first assembly; forming a recess in the first assembly, wherein the recess extends into the fin and separates the fin into at least first and second separate conductive portions; providing a dielectric on sidewalls and bottom of the recess; and providing an island material in the recess on the dielectric.

Example 66 is a quantum computing device, including: a quantum processing device including a plurality of groups of gates to generate quantum dots in a quantum well stack, wherein individual groups of gates are at least partially disposed in a trench in insulating material disposed on the quantum well stack or wherein the quantum well stack is included in a fin having insulating material disposed on opposite faces, and wherein the quantum processing device further includes a plurality of single electron transistors (SETs) proximate to the plurality of groups of gates to detect quantum states of the quantum dots; a non-quantum processing device, coupled to the quantum processing device, to control voltages applied to the plurality of groups of gates and to the plurality of SETs; and a memory device to store data generated by the plurality of SETs during operation of the quantum processing device.

Example 67 may include the subject matter of Example 66, and may further include a cooling apparatus to maintain a temperature of the quantum processing device below 5 degrees Kelvin.

Example 68 may include the subject matter of any of Examples 66-67, and may further specify that the memory device is to store instructions for a quantum computing algorithm to be executed by the quantum processing device.

Example 69 may include the subject matter of any of Examples 66-68, and may further specify that individual ones of the SETs include: first and second source/drain (S/D) electrodes; an island disposed in an area between the first and second S/D electrodes, wherein the island extends outside the area between the first and second S/D electrodes; and first and second portions of dielectric disposed between the first S/D electrode and the island and between the second S/D electrode and the island.

Example 70 may include the subject matter of any of Examples 66-68, and may further specify that individual ones of the SETs include: first and second source/drain (S/D) electrodes, wherein the first S/D electrode is disposed on a side face of a first insulating support and the second S/D electrode is disposed on a side face of a second insulating support; an island, disposed between the first and second S/D electrodes and extending into an area between the first and second insulating supports; and first and second portions of a dielectric, wherein the first portion of the dielectric is disposed between the first S/D electrode and the island, and the second portion of the dielectric is disposed between the second S/D electrode and the island.

The invention claimed is:

1. A device, comprising:
   a quantum dot formation region of a quantum dot device, wherein the quantum dot formation region includes a quantum well stack;
   a group of gates on the quantum dot formation region, wherein:
     the group of gates includes at least first, second, and third gates,
     spacers are at sides of the first and second gates, wherein a first spacer is at a side of the first gate proximate to the second gate, and a second spacer, physically separate from the first spacer, is at a side of the second gate proximate to the first gate, and
     the third gate is between the first and second gates and extends between the first and second spacers;
   an insulating material, wherein the insulating material includes a trench, the trench is between a first portion of the insulating material and a second portion of the insulating material, a gate metal of the first gate is partially above the first portion of the insulating material and partially extends into the trench, and a gate metal of the third gate is partially above the first portion of the insulating material and partially extends into the trench; and
   a single electron transistor (SET) on the quantum dot formation region, proximate to the group of gates.

2. The device of claim 1, wherein the trench has a tapered profile that is narrowest proximate to the quantum well stack.

3. The device of claim 1, wherein the trench extends down to the quantum well stack.

4. The device of claim 1, wherein the SET includes:
   first and second insulating supports;
   first and second source/drain (S/D) electrodes, wherein the first S/D electrode is at a side face of the first insulating support and the second S/D electrode is at a side face of the second insulating support;
   an island, between the first and second S/D electrodes and extending into an area between the first and second insulating supports; and
   first and second portions of a dielectric, wherein the first portion of the dielectric is between the first S/D electrode and the island, and the second portion of the dielectric is between the second S/D electrode and the island.

5. The device of claim 4, wherein the first and second S/D electrodes are on a substrate, and another portion of the dielectric is between the substrate and the island.

6. The device of claim 4, wherein the SET further includes:
   a third insulating support; and
   a gate electrode of the SET at a side face of the third insulating support.

7. The device of claim 4, wherein the SET is a first SET, the island is a first island, the side face of the first insulating support is a first side face of the first insulating support, the side face of the second insulating support is a first side face of the second insulating support, and the device further includes:
   third and fourth S/D electrodes of a second SET, wherein the third S/D electrode is at a second side face of the first insulating support and the fourth S/D electrode is at a second side face of the second insulating support;
   a second island of the second SET, between the third and fourth S/D electrodes and extending into the area between the first and second insulating supports; and
   third and fourth portions of the dielectric; wherein the third portion of the dielectric is between the third S/D electrode and the second island, and the fourth portion of the dielectric is between the fourth S/D electrode and the second island.

8. The device of claim 7, wherein a third insulating support is between the first and second insulating supports, and the third insulating support is between the first and second islands.

9. The device of claim 1, wherein the SET includes:
   first and second source/drain (S/D) electrodes on a substrate;
   an island in an area between the first and second S/D electrodes;
   first and second portions of dielectric between the first S/D electrode and the island and between the second S/D electrode and the island, respectively; and
   a third portion of dielectric between the substrate and the island.

10. The device of claim 1, further comprising:
    multiple groups of gates on the quantum dot formation region; and
    multiple SETs on the quantum dot formation region proximate to different ones of the multiple groups of gates.

11. The device of claim 1, wherein a gate metal of the second gate is at least partially above the first portion of the insulating material and extends into the trench.

12. The device of claim 1, wherein the quantum dot formation region includes silicon germanium.

13. The device of claim 1, wherein:
    a portion of the gate metal of the first gate that extends into the trench has a first dimension,
    a portion of the gate metal of the first gate that is above the first portion of the insulating material has a second dimension,
    each of the first dimension and the second dimension is measured in a direction along a shortest line between the first portion of the insulating material and the second portion of the insulating material, and
    the first dimension is smaller than the second dimension.

14. A method of manufacturing a quantum dot device, comprising:
    providing a quantum well stack over a support structure;
    providing an insulating material over the quantum well stack, the insulating material including a trench;
    forming a group of gates on the quantum dot formation region, the group of gates including first, second, and third gates, wherein:
       a first spacer is at a side of the first gate proximate to the second gate,
       a second spacer, physically separate from the first spacer, is at a side of the second gate proximate to the first gate,
       the third gate is between the first and second gates and extends between the first and second spacers, and
       a gate metal of the first gate and a gate metal of the third gate extend into the trench; and
    forming a single electron transistor (SET), proximate to the group of gates.

15. The method of claim 14, wherein providing the quantum well stack includes growing materials of the quantum well stack by epitaxy.

16. A quantum computing device, comprising:
    a quantum processing device, including;
       a plurality of gates on a quantum well stack, the gates including first, second, and third gates,
       a single electron transistor (SET), proximate to the plurality of gates, and
       an insulating material,
       wherein:
          a first spacer is at a side of the first gate proximate to the second gate,
          a second spacer, physically separate from the first spacer, is at a side of the second gate proximate to the first gate,
          the third gate is between the first and second gates and extends between the first and second spacers,
          the insulating material includes a trench, and
          a gate metal of the first gate and a gate metal of the third gate extend into the trench;
    a non-quantum processing device, coupled to the quantum processing device, to control voltages applied to the plurality of gates and to the SET; and
    a memory device to store data generated by the quantum processing device during operation of the quantum processing device.

17. The quantum computing device of claim 16, wherein the memory device is to store instructions for a quantum computing algorithm to be executed by the quantum processing device.

18. The quantum computing device of claim 16, wherein multiple gates in an individual group of gates of the plurality of groups of gates extend over the first portion of the insulating material.

19. The quantum computing device of claim 16, wherein:
    the trench is between a first portion of the insulating material and a second portion of the insulating material,
    the gate metal of the first gate is partially above the first portion of the insulating material and partially extends into the trench, and
    the gate metal of the third gate is partially above the first portion of the insulating material and partially extends into the trench.

20. The quantum computing device of claim 16, wherein a gate metal of the second gate extends into the trench.

* * * * *